United States Patent
Gould et al.

(10) Patent No.: US 12,211,120 B2
(45) Date of Patent: *Jan. 28, 2025

(54) SPATIALLY-AWARE TOOL SYSTEM

(71) Applicant: Milwaukee Electric Tool Corporation, Brookfield, WI (US)

(72) Inventors: Samuel A. Gould, West Allis, WI (US); Kellen Carey, Hillsboro, OR (US); Michael John Caelwaerts, Milwaukee, WI (US); Gareth J. Mueckl, Milwaukee, WI (US); Christopher S. Hoppe, Midvale, UT (US); Benjamin T. Jones, St. Francis, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/458,776

(22) Filed: Aug. 30, 2023

(65) Prior Publication Data
US 2023/0410385 A1 Dec. 21, 2023

Related U.S. Application Data

(63) Continuation of application No. 17/499,469, filed on Oct. 12, 2021, now Pat. No. 11,790,570, which is a
(Continued)

(51) Int. Cl.
*G06T 11/00* (2006.01)
*G06F 30/13* (2020.01)
(Continued)

(52) U.S. Cl.
CPC .............. *G06T 11/00* (2013.01); *G06F 30/13* (2020.01); *G06T 7/70* (2017.01); *H04N 9/3179* (2013.01); *G06T 2210/04* (2013.01)

(58) Field of Classification Search
None
See application file for complete search history.

(56) References Cited

U.S. PATENT DOCUMENTS

| | | |
|---|---|---|
| 7,123,149 B2 | 10/2006 | Nowak et al. |
| 7,319,395 B2 | 1/2008 | Puzio et al. |
| (Continued) | | |

FOREIGN PATENT DOCUMENTS

| | | |
|---|---|---|
| CN | 102763422 | 10/2012 |
| CN | 105320271 | 2/2016 |
| (Continued) | | |

OTHER PUBLICATIONS

International Search Report and Written Opinion for International Application No. PCT/US2019/058757, dated Apr. 7, 2020, 12 pages.
(Continued)

*Primary Examiner* — Kee M Tung
*Assistant Examiner* — Jed-Justin Imperial
(74) *Attorney, Agent, or Firm* — Reinhart Boerner Van Deuren s.c.

(57) ABSTRACT

The systems described in this disclosure can be used in construction settings to facilitate the tasks being performed. The location of projectors and augmented reality headsets can be calculated and used to determine what images to display to a worker, based on a map of work to be performed, such as a construction plan. Workers can use spatially-aware tools to make different locations be plumb, level, or equidistant with other locations. Power to tools can be disabled if they are near protected objects.

10 Claims, 55 Drawing Sheets

Related U.S. Application Data continuation of application No. 16/682,955, filed on Nov. 13, 2019, now Pat. No. 11,170,538, which is a continuation of application No. PCT/US2019/058757, filed on Oct. 30, 2019.

(60) Provisional application No. 62/753,389, filed on Oct. 31, 2018.

(51) Int. Cl.
*G06T 7/70* (2017.01)
*H04N 9/31* (2006.01)

(56) References Cited

U.S. PATENT DOCUMENTS

| | | |
|---|---|---|
| 7,336,181 B2 | 2/2008 | Nowak et al. |
| 7,339,477 B2 | 3/2008 | Puzio et al. |
| 7,391,326 B2 | 6/2008 | Puzio et al. |
| 7,649,464 B2 | 1/2010 | Puzio et al. |
| 7,750,811 B2 | 7/2010 | Puzio et al. |
| 7,969,295 B2 | 6/2011 | Colvero et al. |
| 8,031,332 B2 | 10/2011 | Miller et al. |
| 8,060,344 B2 | 11/2011 | Stathis |
| 8,700,202 B2 | 4/2014 | Kahle |
| 9,031,585 B2 | 5/2015 | Kahle et al. |
| 9,121,692 B2 | 9/2015 | Kahle et al. |
| 9,159,166 B2 | 10/2015 | Finn et al. |
| 9,194,950 B2 | 11/2015 | Watts et al. |
| 9,305,196 B2 | 4/2016 | Schoner et al. |
| 9,336,629 B2 | 5/2016 | Finn et al. |
| 9,367,963 B2 | 6/2016 | Finn et al. |
| 9,400,902 B2 | 7/2016 | Schoner et al. |
| 9,467,862 B2 | 10/2016 | Zeiler et al. |
| 9,510,150 B2 | 11/2016 | Kahle et al. |
| 9,602,301 B2 | 3/2017 | Averitt |
| 9,619,942 B2 | 4/2017 | Finn et al. |
| 9,619,944 B2 | 4/2017 | Finn et al. |
| 9,654,908 B2 | 5/2017 | Schoner et al. |
| 9,658,326 B2 | 5/2017 | Watts et al. |
| 9,666,090 B2 | 5/2017 | Kahle et al. |
| 9,760,078 B2 | 9/2017 | Kahle |
| 9,817,839 B2 | 11/2017 | Kahle et al. |
| 9,898,705 B2 | 2/2018 | Kahle et al. |
| 9,936,181 B2 | 4/2018 | Kahle et al. |
| 9,992,624 B2 | 6/2018 | Sainfort et al. |
| 10,028,105 B1 | 7/2018 | Swart |
| 10,231,078 B1 | 3/2019 | Swart |
| 2003/0227385 A1 | 12/2003 | Lancaster |
| 2005/0246248 A1 | 11/2005 | Vesuna |
| 2006/0193262 A1 | 8/2006 | McSheffrey et al. |
| 2007/0027732 A1 | 2/2007 | Hudgens |
| 2012/0029870 A1 | 2/2012 | Stathis |
| 2012/0195460 A1 | 8/2012 | Lawrence Ashok Inigo |
| 2013/0138464 A1 | 5/2013 | Kahle et al. |
| 2013/0138465 A1 | 5/2013 | Kahle et al. |
| 2014/0022283 A1 | 1/2014 | Chan et al. |
| 2014/0118339 A1 | 5/2014 | Davies et al. |
| 2014/0205175 A1 | 7/2014 | Tanaka et al. |
| 2014/0365259 A1 | 12/2014 | Delplace et al. |
| 2015/0123966 A1 | 5/2015 | Newman |
| 2016/0027218 A1* | 1/2016 | Salter ............... G02B 27/0093 345/633 |
| 2016/0088482 A1 | 3/2016 | Zeiler et al. |
| 2016/0224927 A1 | 8/2016 | Pettersson |
| 2016/0378887 A1 | 12/2016 | Maldonado |
| 2017/0079481 A1 | 3/2017 | Tsibulevskiy et al. |
| 2018/0012125 A1* | 1/2018 | Ladha ................. G01S 17/89 |
| 2018/0039930 A1 | 2/2018 | Thomas et al. |
| 2018/0082414 A1 | 3/2018 | Rozenberg et al. |
| 2018/0132956 A1* | 5/2018 | Cameron .............. A61B 34/37 |
| 2018/0324229 A1 | 11/2018 | Ross et al. |
| 2018/0336732 A1 | 11/2018 | Schuster |
| 2018/0339386 A1 | 11/2018 | Lee et al. |
| 2018/0339387 A1 | 11/2018 | Kahle et al. |
| 2018/0343421 A1 | 11/2018 | Kahle et al. |
| 2018/0357583 A1 | 12/2018 | Guillemette |
| 2019/0012801 A1 | 1/2019 | Mason et al. |
| 2019/0051014 A1 | 2/2019 | Kahle et al. |
| 2019/0066331 A1 | 2/2019 | Kahle et al. |
| 2019/0094021 A1* | 3/2019 | Singer ................. G01C 15/008 |
| 2019/0232451 A1 | 8/2019 | Kahle et al. |
| 2019/0311538 A1 | 10/2019 | Vadakkeveedu et al. |
| 2019/0392608 A1 | 12/2019 | Mason et al. |

FOREIGN PATENT DOCUMENTS

| | | |
|---|---|---|
| CN | 107921618 | 4/2018 |
| DE | 102017203127 | 8/2018 |
| JP | 2015125761 | 7/2015 |
| KR | 101171264 | 8/2012 |
| KR | 101201129 | 11/2012 |
| KR | 20150058617 | 5/2015 |
| WO | WO17144292 | 8/2017 |
| WO | WO19025221 | 2/2019 |

OTHER PUBLICATIONS

ROBBOX INC., "xDrill | Taking Measurements with your Power Drill!," YouTube, Aug. 31, 2020, https://www.youtube.com/watch?v=hLaBn9qG5u0, 3 pages.
ROBBOX INC., "xDrill | Tapping Cycle on a Power Drill?! ," YouTube, Aug. 31, 2020, https://www.youtube.com/watch?v=AJ92UVzBIWY, 3 pages.
ROBBOX INC., "xDrill | Custom Angle Selection," YouTube, Aug. 28, 2020, https://www.youtube.com/watch?v=Z81-4MFrkQM, 3 pages.
ROBBOX INC., "xDrill™ vs. Conventional Drill—DepthSense™ Allows You to Drill at an Exact Depth With Ease," YouTube, Aug. 13, 2020, https://www.youtube.com/watch?v=sV9ZeZEgYSo, 3 pages.
ROBBOX INC., "Robbox Smart Drill Vs. Conventional Drill," YouTube, Jun. 12, 2019, https://www.youtube.com/watch?v=2or8myJUfnQ, 3 pages.

* cited by examiner

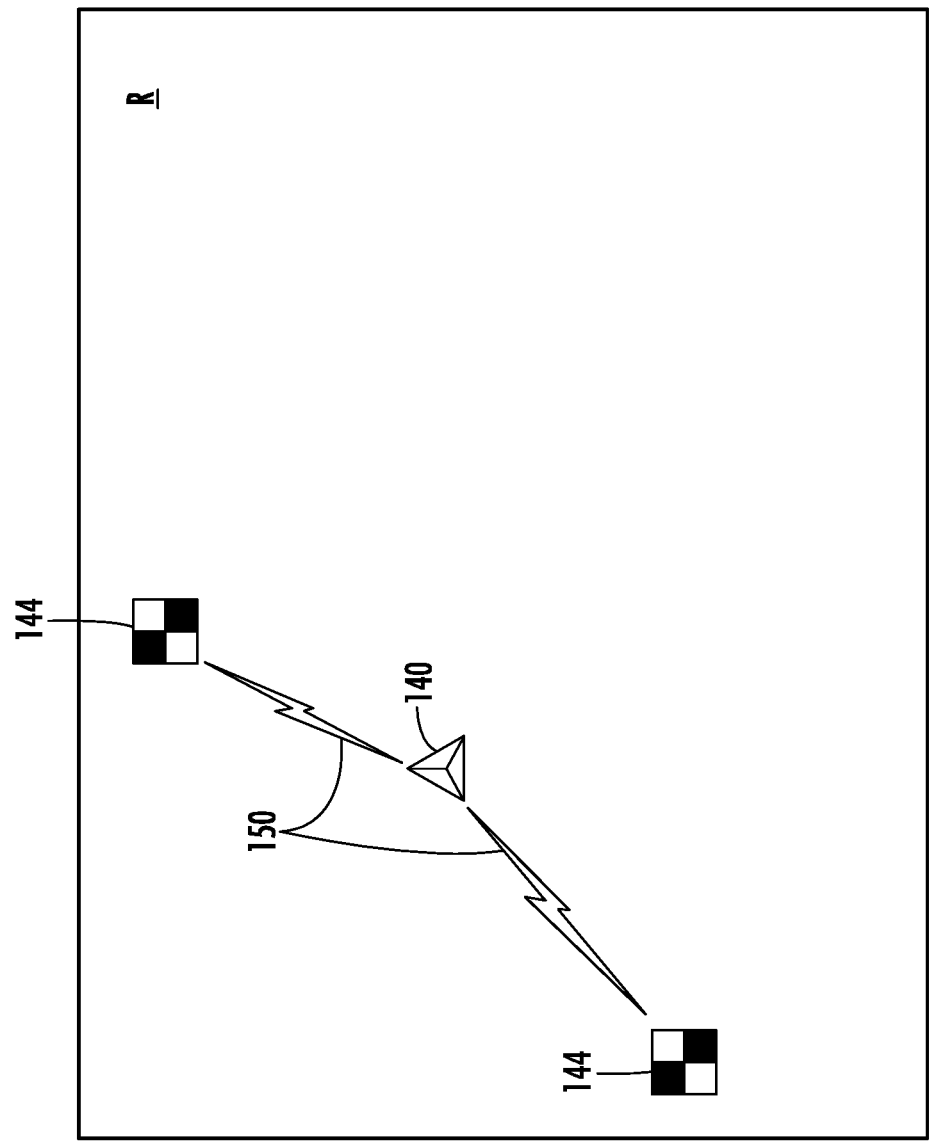

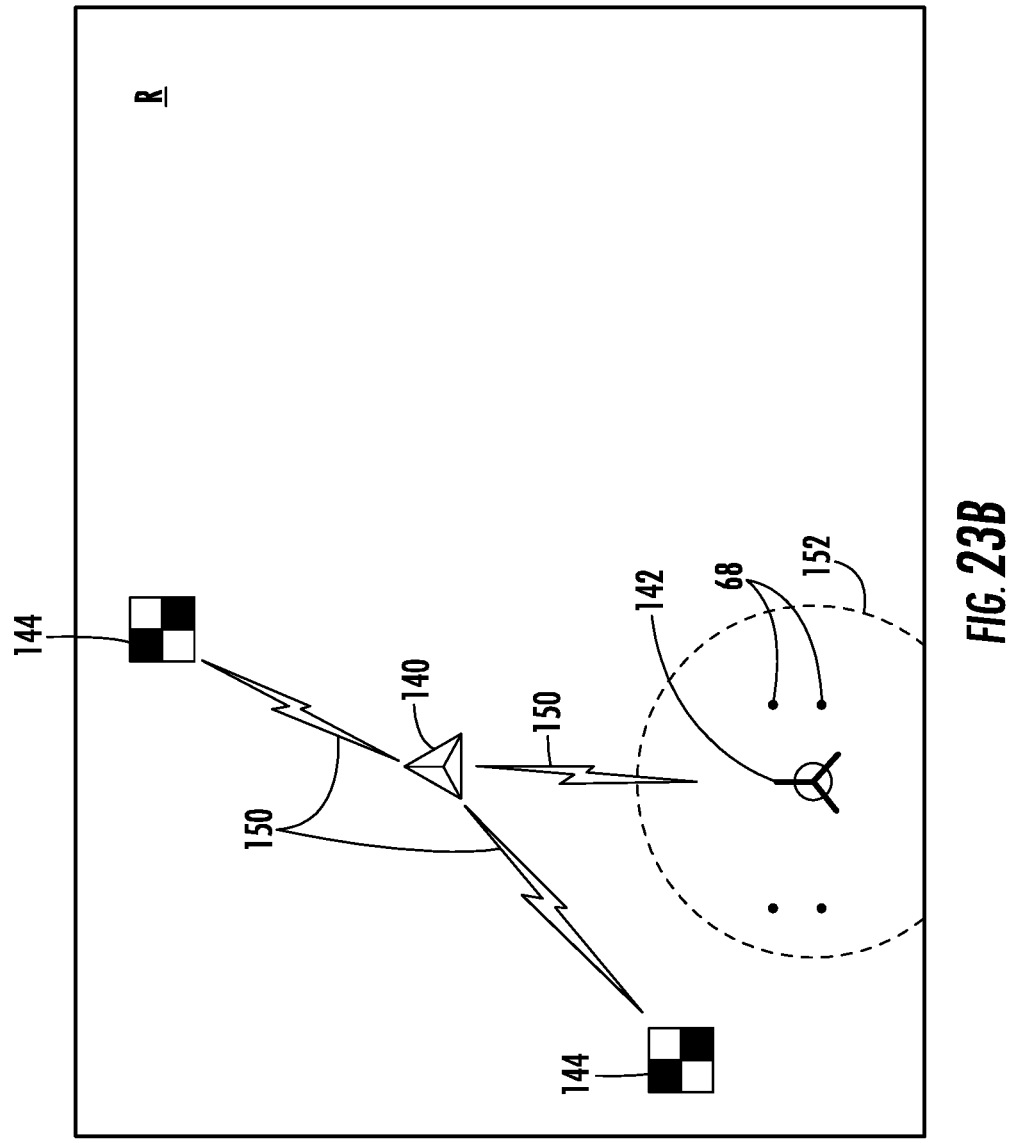

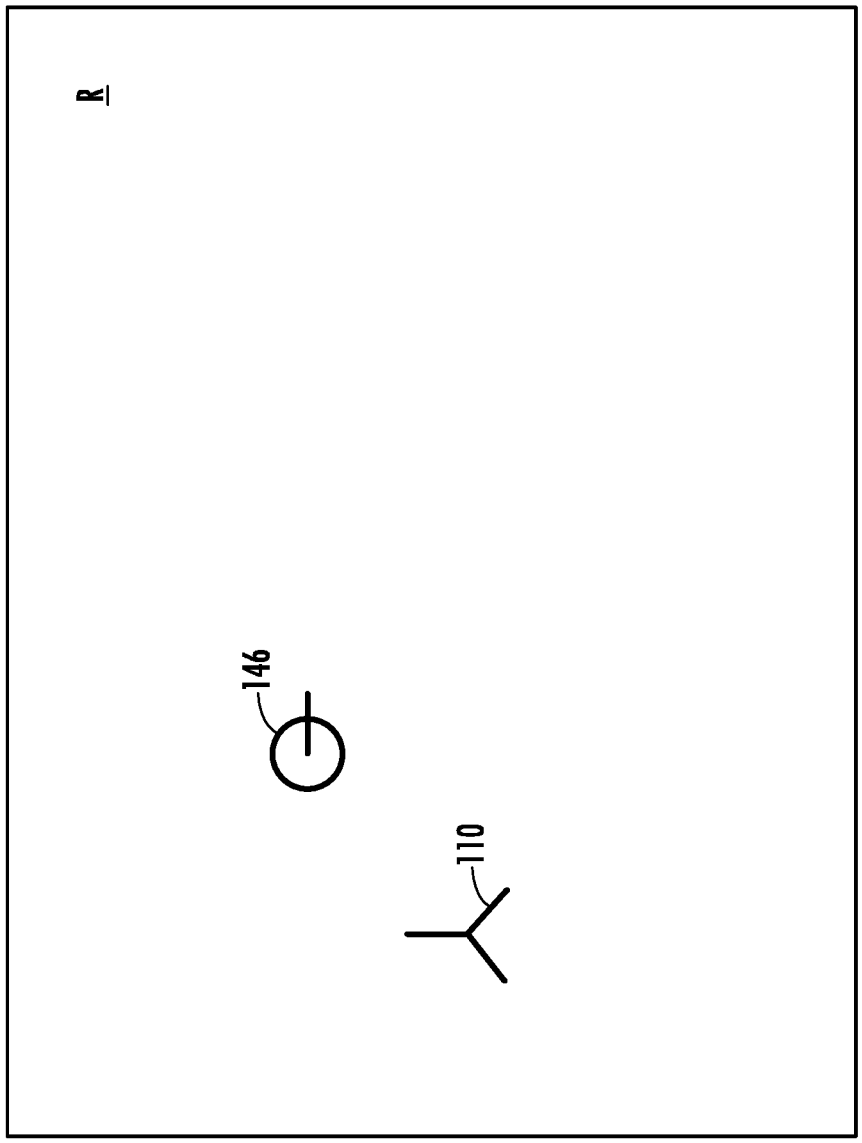

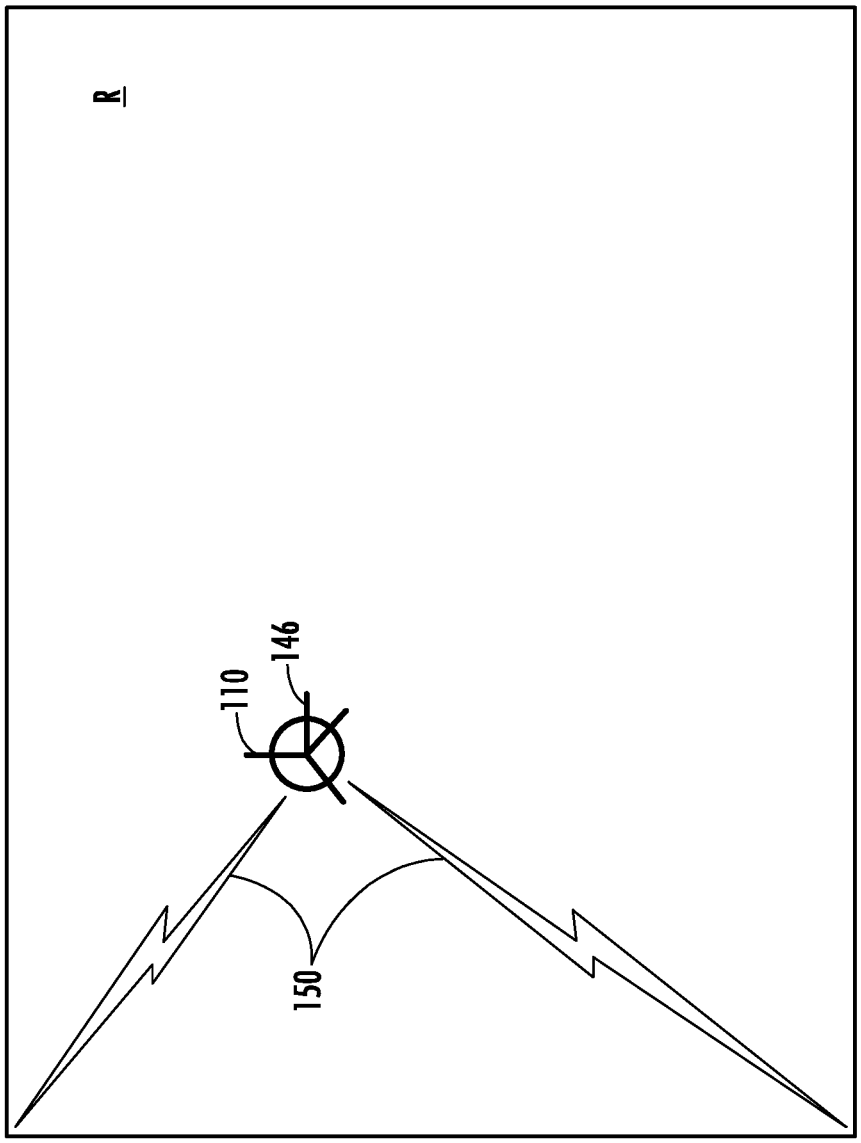

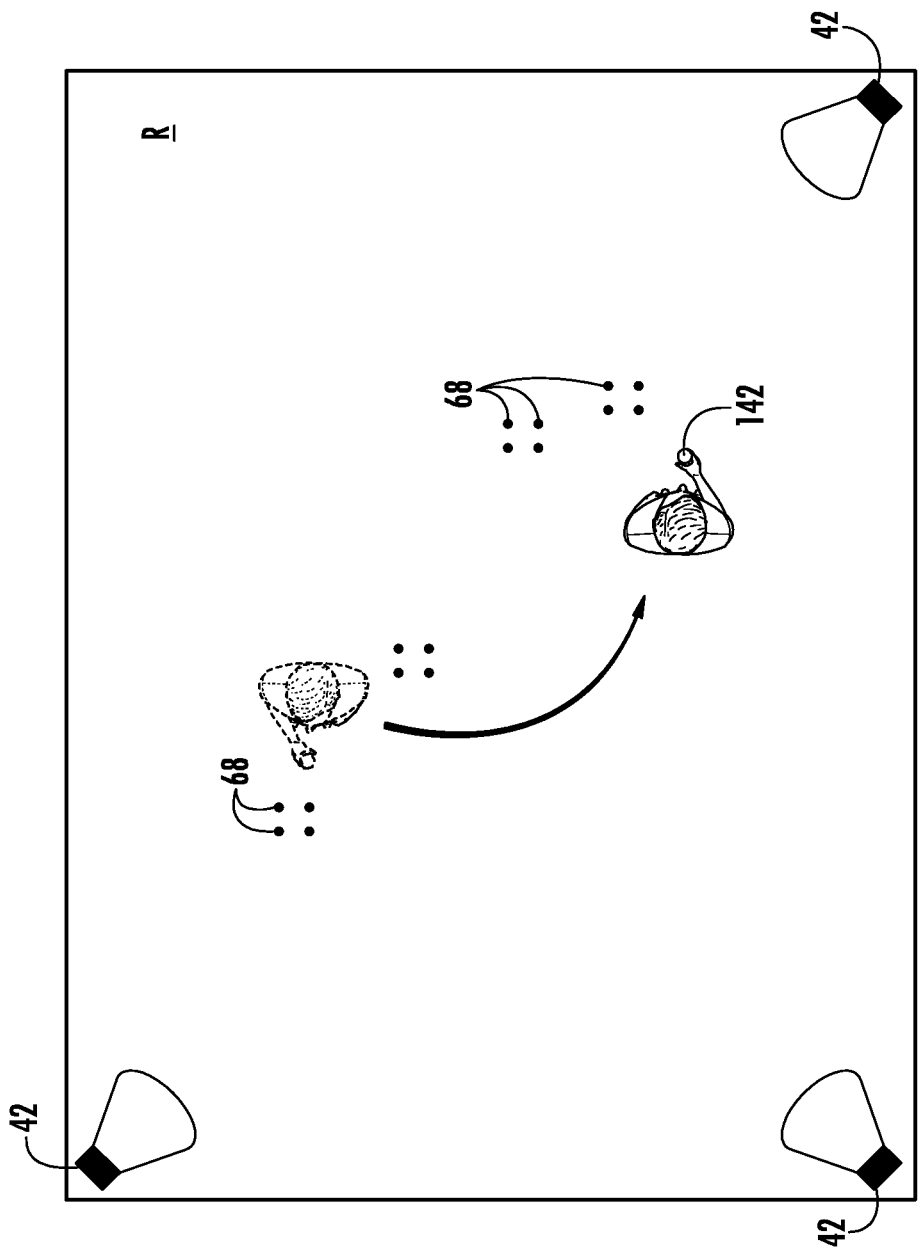

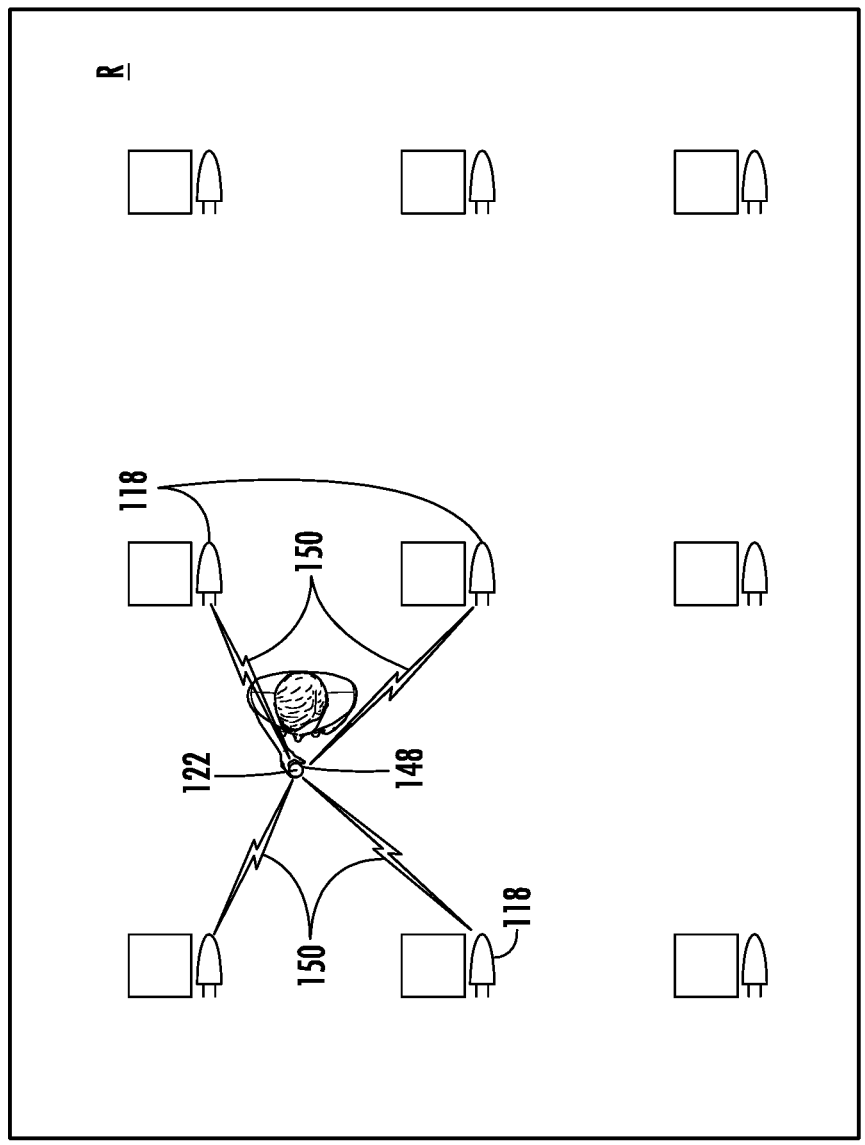

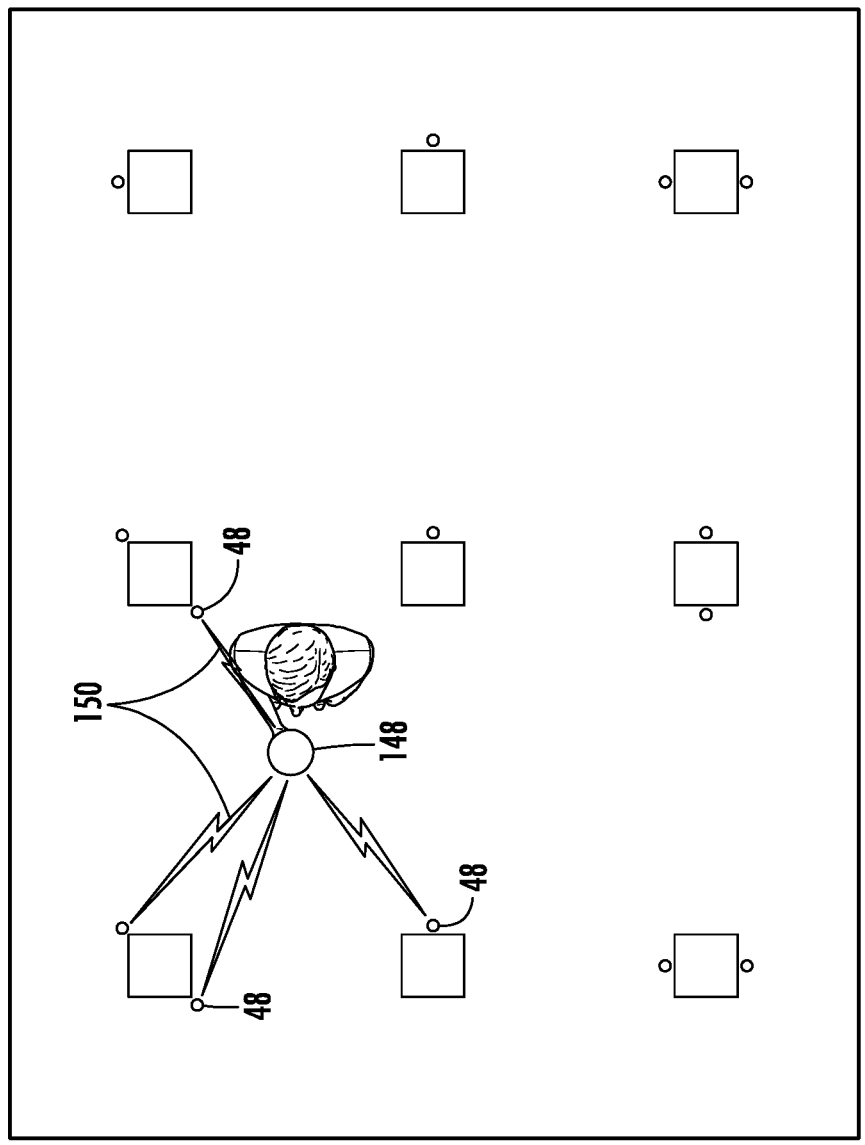

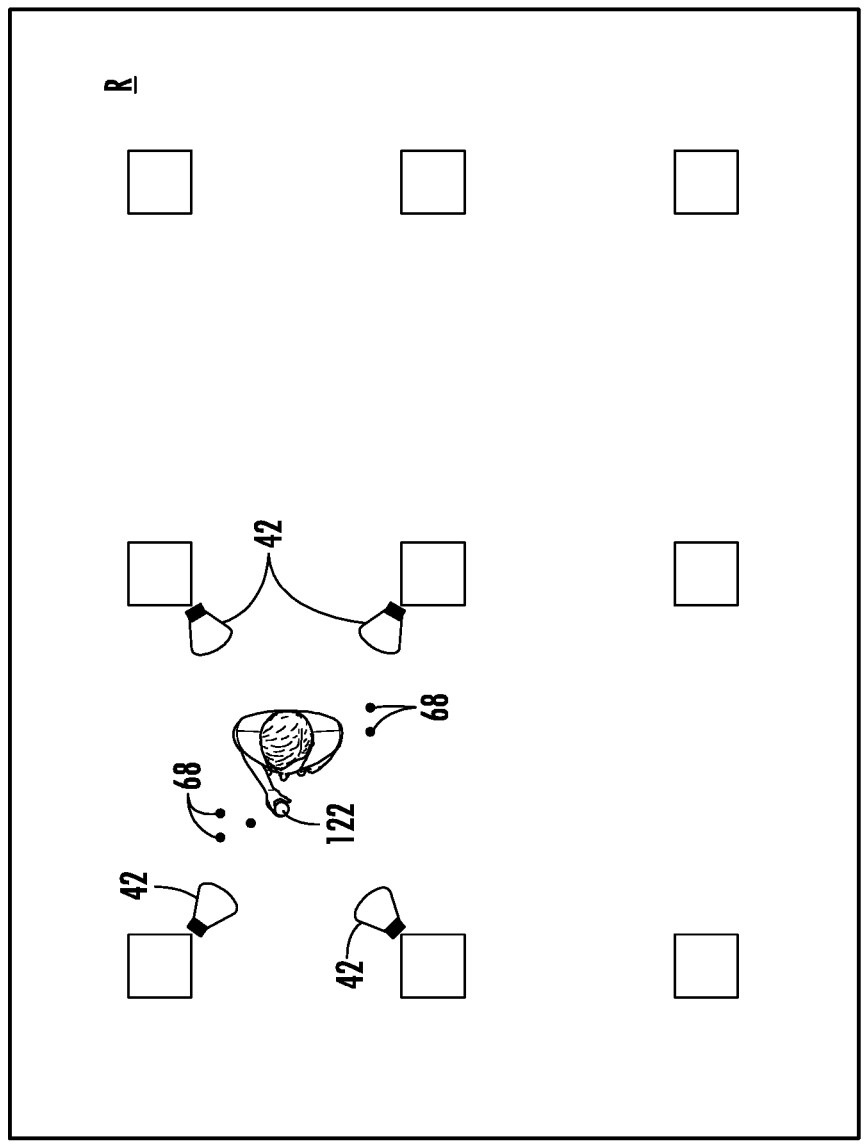

SPATIALLY-AWARE TOOL SYSTEM

CROSS-REFERENCE TO RELATED APPLICATIONS

The present application is a continuation of U.S. application Ser. No. 17/499,469, filed Oct. 12, 2021, which is a continuation of U.S. application Ser. No. 16/682,955, now U.S. Pat. No. 11,170,538, filed Nov. 13, 2019, which is a continuation of International Application No. PCT/US2019/058757, filed Oct. 30, 2019, which claims the benefit of and priority to U.S. Provisional Application No. 62/753,389, filed Oct. 31, 2018, which are incorporated herein by reference in their entireties.

BACKGROUND OF THE INVENTION

The present disclosure relates generally to the field of construction tools. Construction work generally requires non-digital hand tools such as tape measures, levels, and power tools that do not calculate their location. A worker refers to a construction plan, such as a blueprint, to identify work that needs to be performed.

SUMMARY OF THE INVENTION

In general, an embodiment of the disclosure relates to tracking the physical position of a spatially-aware tool, associating the physical position with a construction plan, generating augmentation data based on the association, and providing the augmentation data to the user. A projector displays an image based on the augmentation data representing the construction plan on the floors and walls in the room where work is to be performed. The projector positions the virtual objects in the image onto the physical locations where the physical objects will be located according to the construction plan.

The projector includes a toggle to allow a worker to switch the displayed image to a schematic of the construction plan. Workers familiar with reading construction plans can look at the projected image in a room and immediately understand what work has to be performed in which parts of the room.

When generating the image based on the augmentation data, the projector identifies the physical landscape of walls, ceiling(s) and floor(s) that the image will be projected on. The projector then generates the image based on the relationship between the physical landscape available to the projector and what objects in the construction plan will be installed in/on the physical landscape.

An augmented reality (AR) headset receives the augmented data and generates an augmented image to display to the worker wearing the AR headset. The augmented image includes a combination of the physical image in front of the AR headset and the worker, and a virtual image of objects from a construction plan. Images of the virtual objects are placed at locations in the augmented image that correspond to where the corresponding physical objects should be placed according to the construction plan.

In one embodiment, the location of a spatially-aware drill is compared against a map of delicate or dangerous objects, such as an electrical wire or water pipe that should be protected. The location of the protected object is based on a construction plan, or it may be based on an as-built model that reflects where object was actually installed. A distance between the drill bit tip and the protected object is monitored and compared to a threshold. When the distance is less than the threshold, power to the drill is disabled and the drill generates a signal to display to the worker why the drill's power was disabled.

In one embodiment, a spatially-aware tool, such as a drill, is used to define an artificial frame of reference. First, a component of the drill is calibrated to the room, such as by calibrating the location of the drill bit tip by placing it against a spatially-tracked sensor. The tracked location of the drill bit tip is placed at an origin of the artificial frame of reference, such as a corner between two walls and a floor, and a signal is generated to identify the origin. The drill bit tip is then placed at another corner between one of the walls and the floor and a second signal is generated to identify the first axis. The first axis is defined by connecting to the identified points.

The worker identifies special points, such as where to drill a hole, in the spatially-aware room with respect to the artificial frame of reference. The artificial frame of reference and the special points are communicated to another worker with an AR headset. The AR headset of the second worker displays an augmented image that shows the special points indicated against the wall. Thus, the second worker can visualize the special points and where to drill the hole(s).

The physical location of a spatially-aware tool with a first worker is tracked by the system and sent to a remote worker. The remote worker views a virtual image of the construction plan at the physical location. The spatially-aware tool may include a camera that captures a physical image that is streamed to the remote worker. The physical image can be combined with the virtual image to create an augmented image. The augmented image is displayed for the second worker, such as via an AR headset or a projector.

In one embodiment, a worker wearing an AR headset is shown a menu of virtual items that can be installed. The worker selects from among different categories of items to install, such as HVAC (heating, ventilation, and air conditioning) or plumbing. The worker selects components to install in the room from the menu. The worker virtually installs the selected component by indicating the location of the selected component. The worker continues selecting components and installing them in and near the room. After the virtual construction is complete, the worker can indicate that the selected components need to be ordered and delivered to that room. In some instances, actual components can be fabricated remotely based on the virtual installation and delivered to the room for installation.

In various embodiments, the system may incorporate a projector on a tripod, an AR flashlight, a lighthouse, a sensor block, or a staff, all of which are spatially-aware and thus system-enabled. These devices may work in coordination with each other to identify points where work should be performed. These devices can rely on each other to determine their location. The location determination of a device may be a respective location with respect to an artificial frame of reference, or it may be an absolute location with respect to a construction plan. As the devices determine their location based on other devices, the devices can leapfrog across an area to provide spatially-aware guidance for the area.

Additional features and advantages will be set forth in the detailed description which follows, and, in part, will be readily apparent to those skilled in the art from the description or recognized by practicing the embodiments as described in the written description and claims hereof, as well as the appended drawings. It is to be understood that both the foregoing general description and the following detailed description are exemplary.

The accompanying drawings are included to provide further understanding and are incorporated in and constitute a part of this specification. The drawings illustrate one or more embodiments and, together with the description, serve to explain principles and operation of the various embodiments.

BRIEF DESCRIPTION OF THE DRAWINGS

FIGS. 23A-23C are a series of top views of a room with a tripod with an articulating laser synchronizing by interacting with a robotic station, according to an embodiment.

FIGS. 24A-24D are a series of top views of a room with a tripod with an articulating laser and a beacon, according to an embodiment.

FIGS. 26A-26C are a series of top views of a room with multiple lighthouses and a personal sensor, according to an embodiment.

FIGS. 27A-27C are a series of top views of a room with multiple infrared emitters and a personal sensor, according to an embodiment.

FIGS. 28A-28E are a series of top views of a room with multiple infrared receivers and a digital lighthouse, according to an embodiment.

FIGS. 32A-32F are a series of top views of a room with sensors leapfrogging across a room, according to an embodiment.

DETAILED DESCRIPTION

Referring generally to the figures, various embodiments of using spatially-aware tools are shown. The systems described in this disclosure can be used in construction settings to vastly facilitate the tasks being performed.

In a system-enabled room, in which the location of tools and displays can be calculated, the system provides images based on a construction plan to help workers identify where different components or objects are being installed. The system displays these images by using a projector that displays the images on walls, floors and ceilings in the room, or the system can provide these images by augmented reality (AR) headsets. The images provided can be actual images of objects to be built and installed, or the images can be representative symbols, such as may be found in a blueprint, that allow workers to quickly understand the construction plans in the image being projected.

The system provides more accurate measurements that are easier to acquire than by using non spatially-aware tools, such as hand tools. Workers can use spatially-aware tools in place of levels and tape measures. The spatially-aware tools, such as a drill or an AR headset, provide feedback to the user about different points being identified. Based on that information, the worker can make the points plumb, level, equidistant with other points, or any other arrangement that would have otherwise required a level or tape measure.

A supervisor can identify a wall as a local artificial frame of reference, and identify points on that wall where work is to be performed. This identification of points can be performed by the supervisor without reference to a construction plan. The points can be saved to the system, and another worker can walk through the rooms and perform the work identified by the supervisor by relying on the local artificial frame(s) of reference.

The system can disable tools before they cause damage. For example, if a drill bit is about to puncture a hole in a delicate or dangerous object (e.g., electrical wire, water pipe), the system can deactivate power to the drill's motor that rotates the bit and prevent damaging the protected object but retain power for the remaining systems and the drill, allowing the user to receive a message or indication communicating why the drill bit was stopped.

Figure 1:
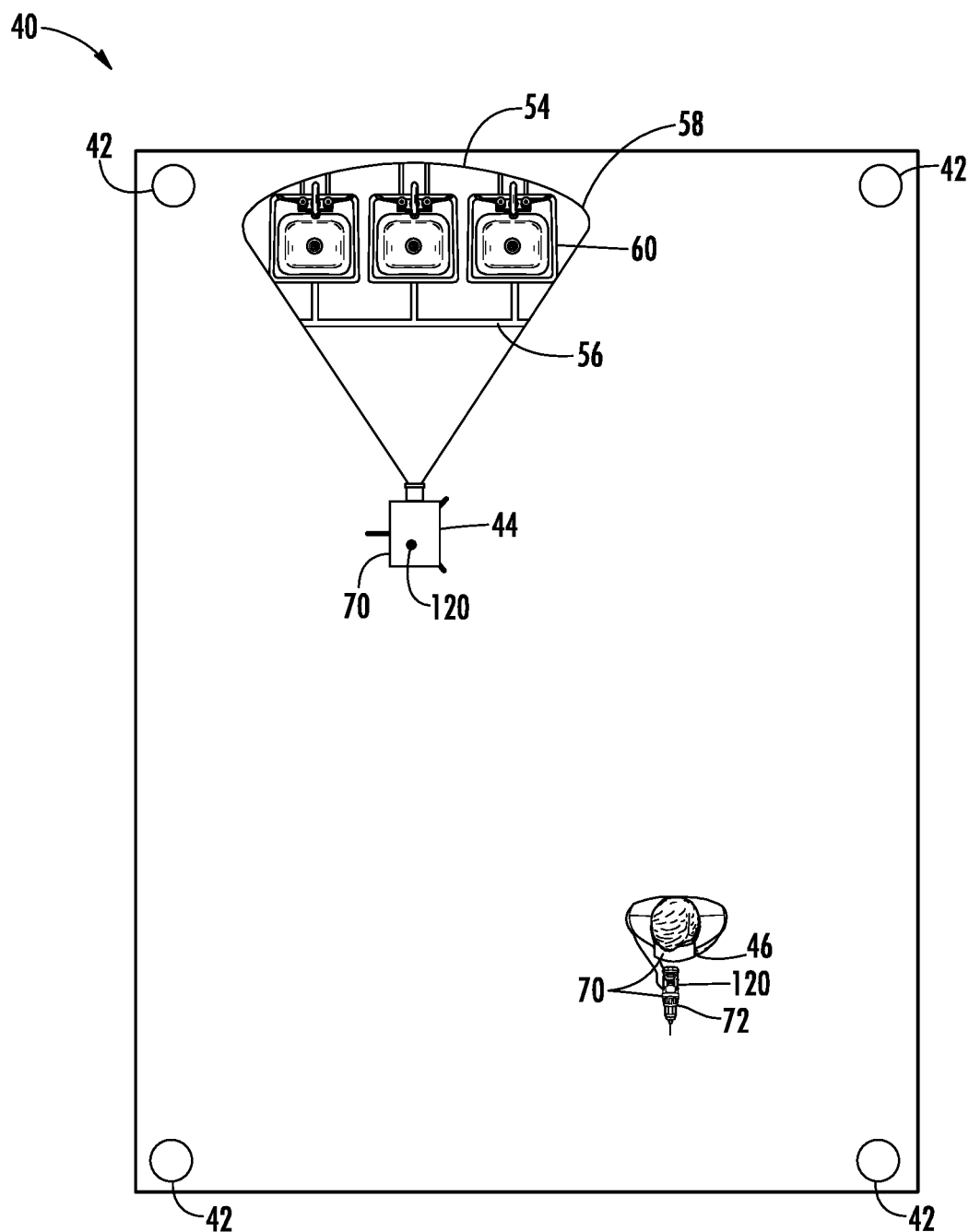
FIG. 1 is a top view of a system-enabled room with lighthouses, a projector, and an AR headset, according to an embodiment.
Figure 2:
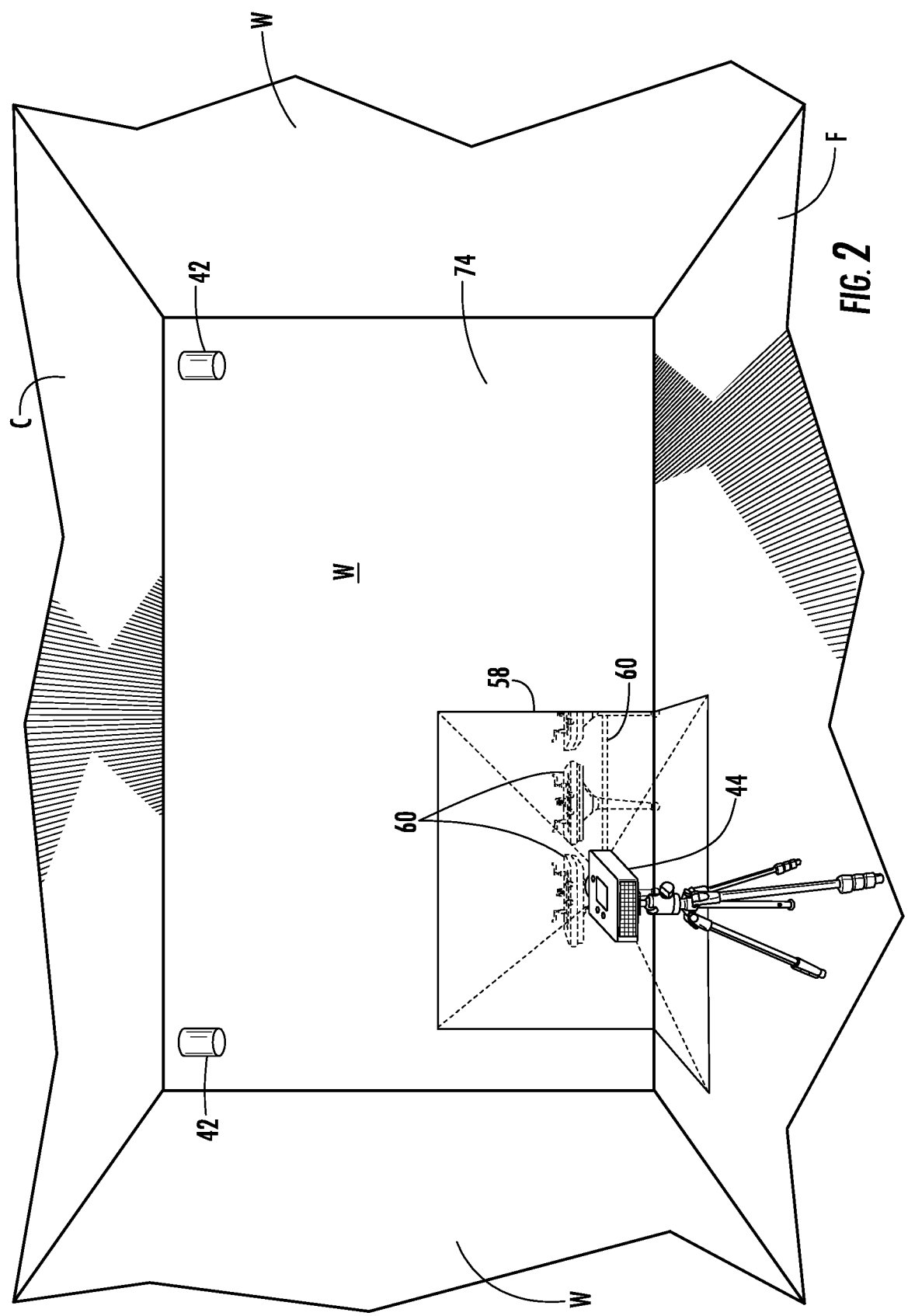
FIG. 2 is a perspective view of the system-enabled room of FIG. 1, the projector showing a perspective-based augmented reality, according to an embodiment.
Figure 3:
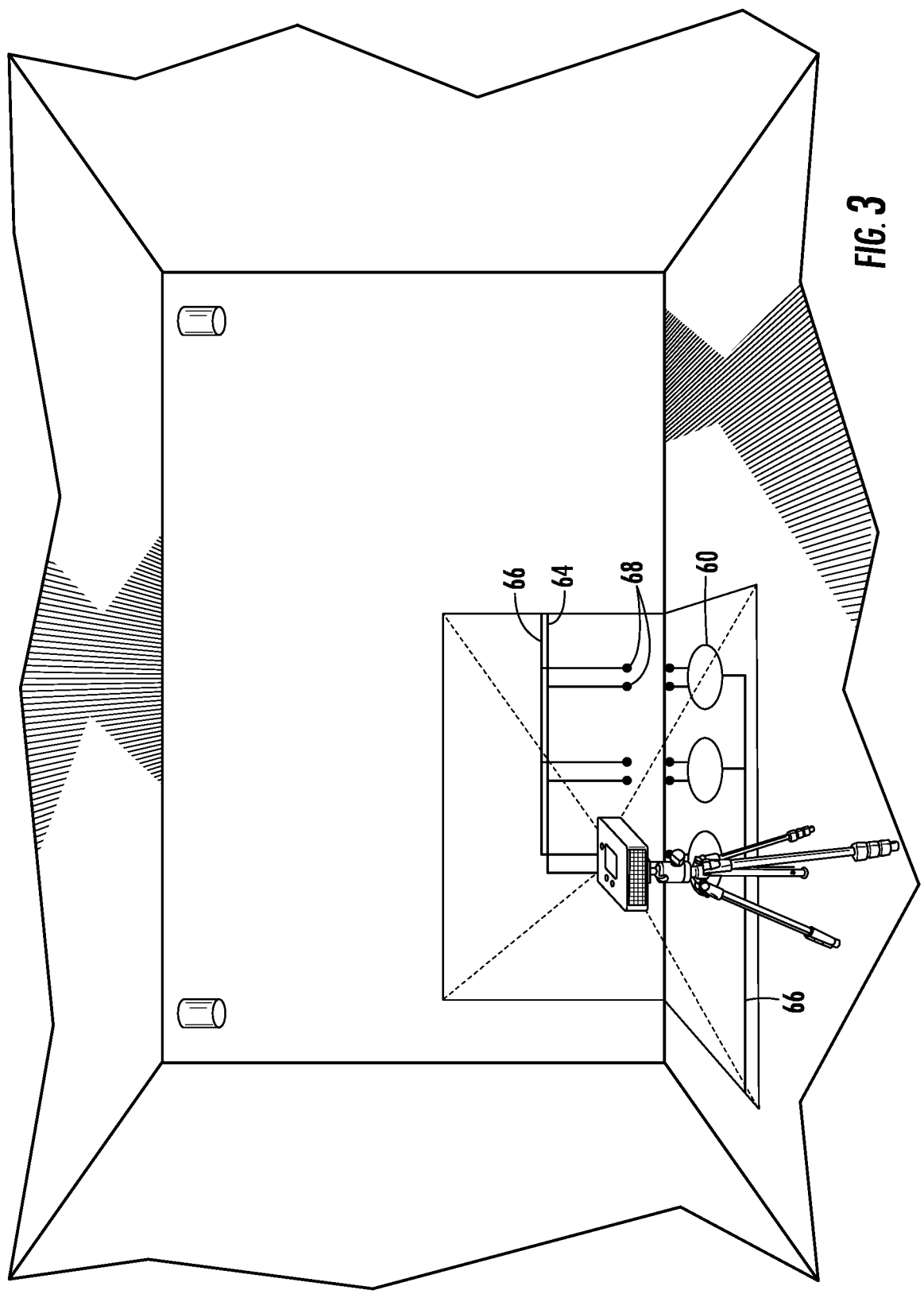
FIG. 3 is a perspective view of the system-enabled room of FIG. 1, the projector showing a schematic-based augmented reality, according to an embodiment.

Referring FIGS. 1-3, a tracking system, such as a light-based system, is shown according to an exemplary embodiment. System 40 includes lighthouses 42, projector 44, and augmented reality (AR) headset 46. Lighthouses 42 emit a pattern of light across a room that receivers 120 on device 70 can use to determine their position. Device 70 includes spatially-aware devices in a system-enabled room, such as lighthouse 42, projector 44, AR headset 46, sensor 48, tool 72, tripod 110, flashlight projector 116, staff 122, total robotic station 140, articulating laser 142, laser receiver with vertical line laser 146, and multi-direction camera system 148.

Projector 44 and AR headset 46 include one or more receivers 120 to determine their location and orientation, collectively position 52. Projector 44 and AR headset 46 use their location and orientation information to determine images 54 to display for a user.

In various embodiments, device 70 determines its location based on detecting light from lighthouses 42. In alternative embodiments, one or more of the computer processors of the system 40 may determine the location of the device 70. This position determination analysis may be supplemented by internal measuring units (IMUs), such as kinetic sensors including accelerometers. Lighthouse 42 initially emits a pulse of light and then emits a series of light bands, such as calibration signals 150, in a pattern across the room. Device 70 detects a band and measures the time period between the initial pulse of light and the detected band. Based on the length of the time period measured and known position 52 of lighthouse 22, device 70 determines first relative position 50 of device 70 with respect to first lighthouse 42. Device 70 similarly determines second relative position 50 of device 70 with respect to second lighthouse 42. Based on the combination of the relative positions 50, device 70 calculates its position 52 based on first relative position 50 and second relative position 50. In various embodiments, device 70 calculates orientation contemporaneously with calculating the position of device 70. In various embodiments, relative position 50 and triangulated position 50 include both the position and the orientation of device 70.

In another embodiment, lighthouse 42 emits light that is encoded with timing data (e.g., the wavelength of the light corresponds to a time the light is emitted), and device 70 decodes the received light to determine its position 50. In another embodiment, lighthouse 42 emits a first beam of light that rotates around lighthouse 42 in a first rotational direction, and lighthouse 42 also emits a second beam of light that rotates around lighthouse 42 in a second rotational direction that is opposite the first rotational direction. In another embodiment, lighthouse 42 emits a first beam of light that rotates around lighthouse 42 in a first rotational direction at a first speed, and lighthouse 42 also emits a second beam of light that rotates around lighthouse 42 in the same rotational direction but at a second speed different than the first speed. By timing the differences between when the different beams of light are received by device 70, device 70 can calculate its position 52. In another embodiment, device 70 can determine its position 52 based on simultaneous localization and mapping (SLAM), in which device 70 calculates its position while simultaneously mapping the area (e.g., via stereovision, triangulation, LiDAR and/or structured light projection) where device 70 is located. In alternative embodiments, other suitable method of determining the three-dimensional location of the device 70 are used.

Projector 44 uses receiver 120 to calculate its position 52 and stores construction plan 56 to compare against position 52 to determine image 54 to display. Projector 44 determines image 54 by identifying the location of projector 44 in construction plan 56. Projector 44 uses position 52 to identify landscape 58 upon which projector 44 will display image 54. Landscape 58 is the portions of the room's surfaces, such as walls, ceilings, or floors, where projector 44 will display image 54. Based on the identification of landscape 58, projector 44 generates image 54 from construction plan 56 to display on landscape 58. Projector 44 creates object 60 in image 54 so that the location of object 60 corresponds to where physical object 62 will be placed or built. As a result, users can look at image 54 displayed by projector 44 and quickly understand and even see where physical object 62 that corresponds to object 60 will be built. Projector 44 may be trained to receive indications of position 52 of corner C within room R, which may be particularly useful in situations in which the room does not have a standard rectangular format.

Image 54 may include object 60 that is representative of physical object 62 (FIG. 2), or image 54 may include schematic 64 of construction plan 56 (FIG. 3). Image 54 may also include digital models of objects known to be in the view, or scanned representations of detected objects.

Schematic 64 includes hidden object 66 that indicates where physical object 62 will be located behind a surface of the wall W or floor F. Schematic 64 also includes points 68 where work needs to be performed, such as where a hole needs to be drilled in the wall W or floor F.

Projector 44 may include a toggle (e.g., a button) to switch between different types of image 54 being displayed. Projector 44 displays image 54 that includes object 60 representative of physical object 62 to be installed according to construction plan 56 (FIG. 2), projector 44 displays image 54 that includes schematic 64 according to construction plan 56 (FIG. 3), or projector 44 displays image 54 that includes outlines of hidden objects 66 already installed or to be installed in the floor or walls (FIG. 4).

Figure 4:
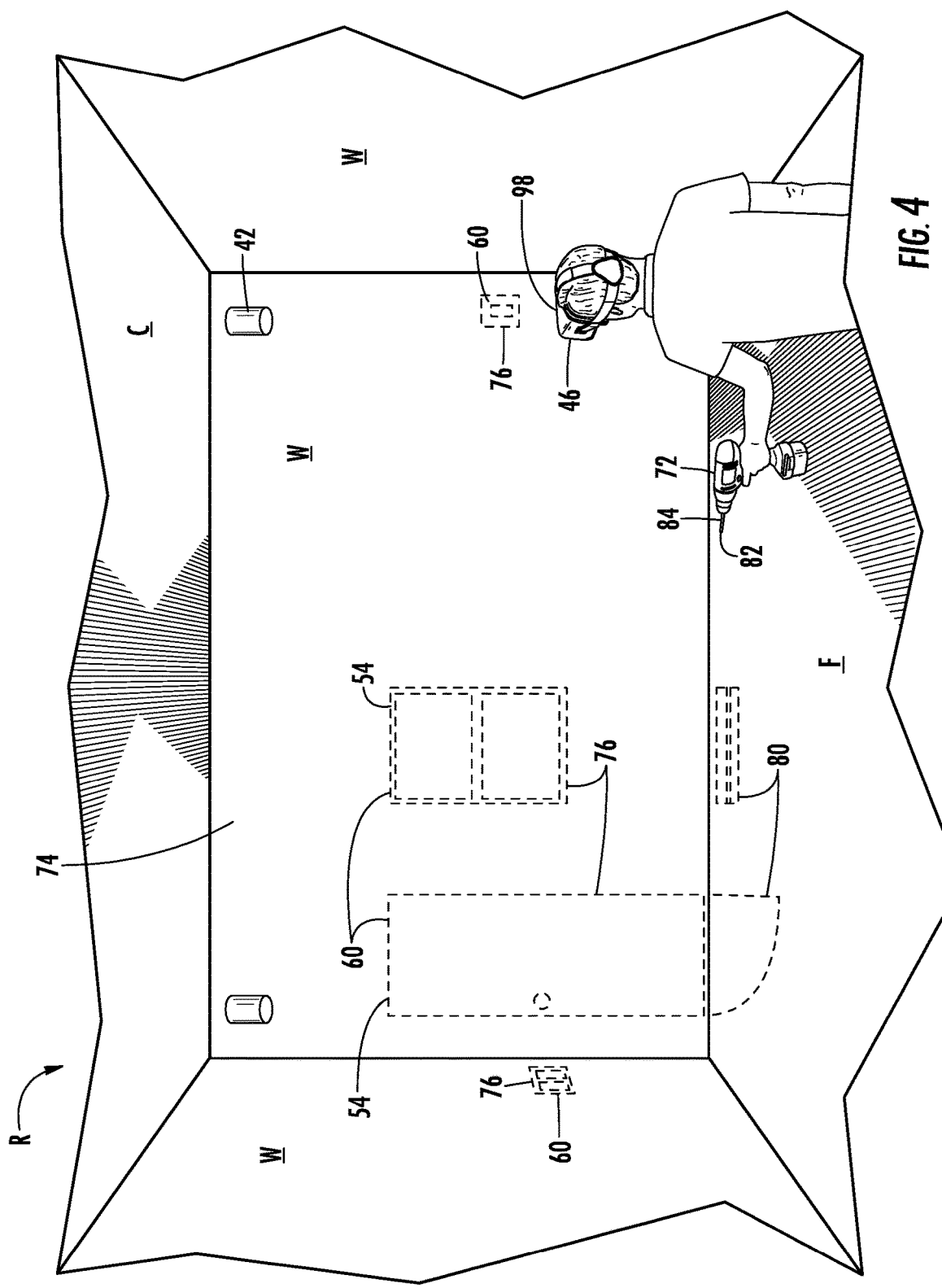
FIG. 4 is an augmented reality perspective view of a system-enabled room with two lighthouses and an AR headset, according to an embodiment.

Turning to FIG. 4, system 40 may display an augmented reality (AR) by use of AR headset 46. AR headset 46 may display augmented image 78. Augmented image 78 includes physical image 74, which is the actual view of the room or environment, and virtual objects 60. In one embodiment AR headset 46 displays to the user everything the user sees (e.g., a screen with an image of the actual world overlaid with an augmented image). In another embodiment AR headset 46 includes a see-through portion in which the user directly views the actual world, and the see-through portion is a transparent display (e.g., an OLED display) with an augmented image 78.

Virtual objects 60 include sinks, doors, windows, and light switches and other items that are to be installed in room R. Similar to projector 44, AR headset 46 determines its 3-D position 52, including its orientation, with respect to construction plan 56. System 10 then calculates landscape 58 over which augmented image 78 will be displayed. In one embodiment AR headset 46 performs some or all of the calculations, and in another embodiment a remote computing device performs some or all of the calculations and streams the results and/or images to AR headset 46. Based on the location and area of landscape 58, AR headset 46 identifies which objects 60 in construction plan 56 are within landscape 58, and thus which objects 60 should be shown in image 54. After identifying object 60 that will be in image 54, AR headset 46 renders a representation 76 of object 60 to add to physical image 74 to create augmented image 78. AR headset 46 also optionally renders a floor representation 80 of object 60 to add to physical image 74. Floor representation 80 may indicate how object 60 will interact with room R, such as by indicating the area over which door object 60 will open, or by where window object 60 will be placed in wall W.

Figure 5:
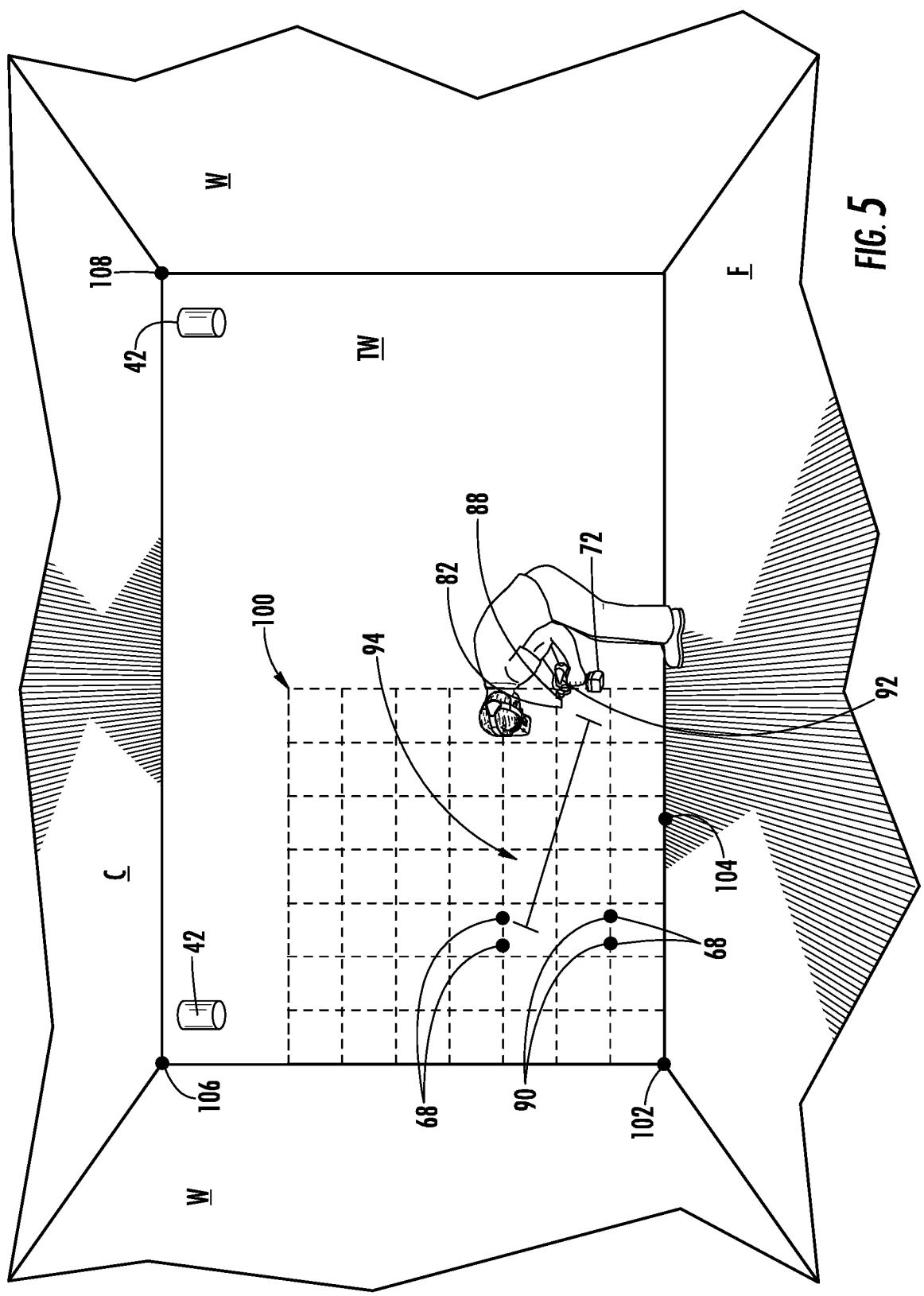
FIG. 5 is an augmented reality perspective view of a system-enabled room with two lighthouses and an artificial frame of reference against one wall, according to an embodiment.
Figure 6:
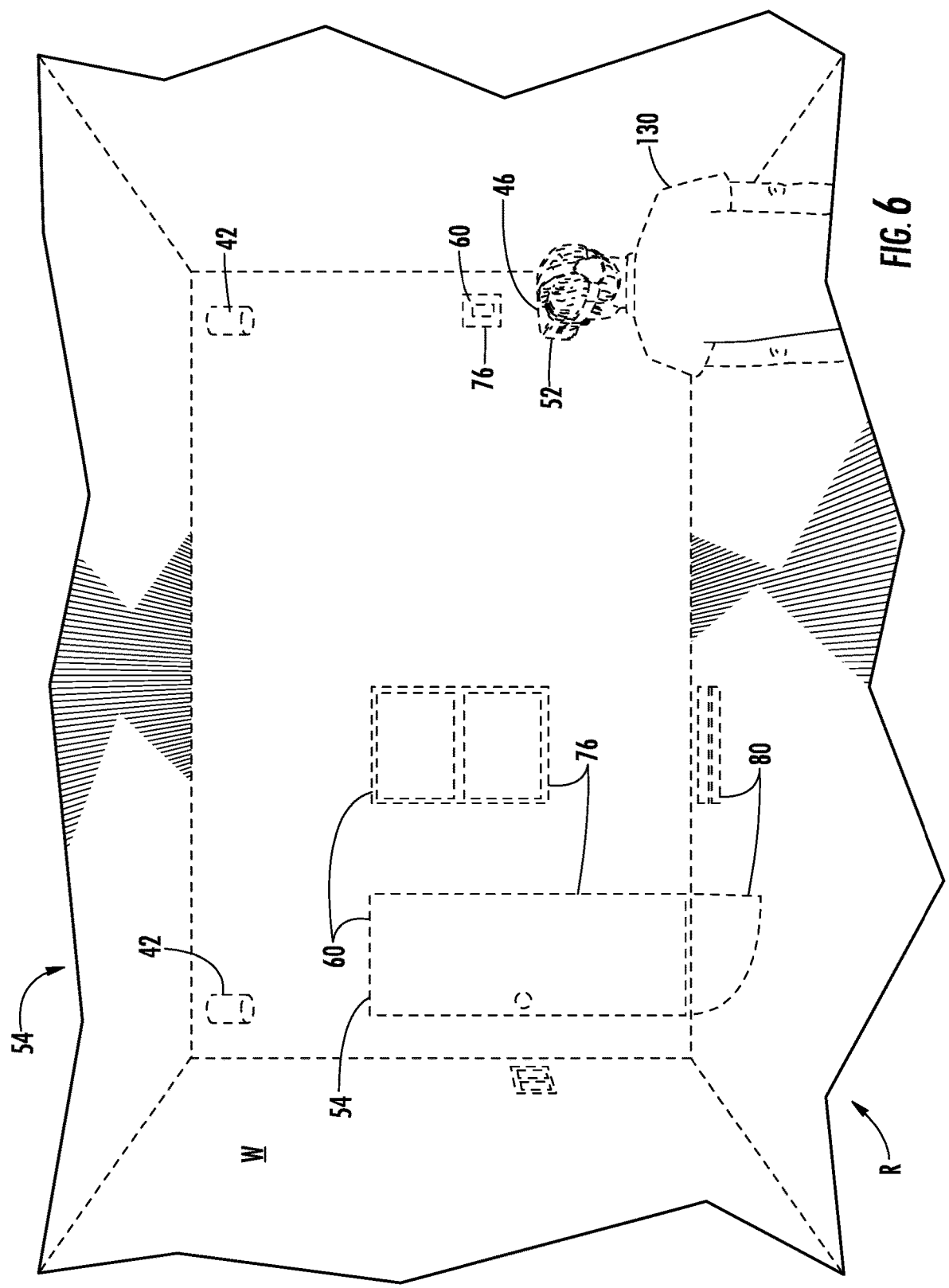
FIG. 6 is a virtual perspective view of a system-enabled room, according to an embodiment.

Turning to FIGS. 5-6, system 40 may display augmented image 78 without reference to construction plan 56. For example, a worker creates artificial frame of reference 100, such as a Cartesian-style two-dimensional grid, and relies on that frame of reference 100 without reference to a construction plan 56. Worker calibrates a system-enabled tool 72, such as a drill, by first calibrating drill bit tip 82 that will be used to define artificial frame of reference 100.

In one embodiment, drill bit tip 82 is calibrated by performing several steps. First, tool 72 is calibrated to an environment, such as room R. As a result of the calibration, 3-D position 52, including orientation, of tool 72 within room R is known by system 40. However, position 52 of drill bit tip 82 (or parts and/or ends of staff 122) may not be known to a sufficient level of precision because the length and positioning of drill bit 84 within tool 72 may not be known (e.g., drill bit 84 may be only partially inserted into the key of tool 72, drill bit 84 may have a non-standard length, different sized or brands of drill bits 84 may have different lengths). To account for this variability in position 52 of drill bit tip 82 relative to tool 72, sensor 48 is placed against drill bit tip 82. System 40 calculates differential position 88 of drill bit tip 82 relative to position 52 of tool 72. Subsequently, system 40 can combine position 52 of tool 72 with differential position 88 of drill bit tip 82 to calculate position 52 of drill bit tip 82.

Once position 52 of drill bit tip 82 is calibrated, system 40 can disable tool 72 remotely to prevent damage. For example, if position 52 drill bit tip 82 is approaching a delicate or dangerous object (e.g., electrical wire, water pipe), system 40 may disable the power for tool 72 before drill bit tip 82 gets closer than a threshold distance to physical object 62.

Once drill bit tip 82 is calibrated, then a worker creates artificial frame of reference 100. First, the worker moves the drill bit tip 82 to a floor corner at the intersection between target wall TW upon which artificial frame of reference 100 is arranged, sidewall W and floor F. The worker signals to system 40 that drill bit tip 82 is at first calibration point 102. The worker can signal to system by, for example, toggling a button on tool 72. First calibration point 102 is the origin of the Cartesian-style grid. The worker then moves along target wall TW, places the drill bit tip 82 at a corner between target wall TW and floor F, and signals to system 40 that drill bit tip 82 is at second calibration point 104. System 40 combines calibration points 102 and 104 to identify an axis (e.g., the X-coordinate axis) of a Cartesian-style grid.

In one embodiment, system 40 assumes by default that target wall TW is plumb or nearly plumb. Alternatively, the worker may identify third calibration point 106 in the upper corner between target wall TW, side wall W and ceiling C and/or fourth calibration point 108 in the opposite corner between target wall TW, side wall W and ceiling C. Given three calculation points 102, 104 and 106, system 10 can calculate the orientation of target wall TW, such as whether it is plumb.

After artificial frame of reference 100 is created, the worker can use system 40 for performing or identifying work. The worker can identify points 68 in wall W where holes need to be drilled. Points 68 may be identified by positioning drill bit tip 82 at point 68 and toggling a switch on tool 72. The worker can store drill point information 90 about points 68, such as the angle, diameter and/or depth of the hole to be drilled at point 68. Drill point information 90 may be provided to system 40 by using interface 92. Optionally, system 40 may store default drill point information 90 for points 68 unless the worker identifies otherwise. After points 68 are identified, and optionally also drill point information 90, system 10 may include an autonomous device, such as a drone, to perform the work identified by the worker at points 68.

As the worker navigates along wall target TW upon which artificial frame of reference 100 is situated, system 40 calculates position 52 of drill bit tip 82 as compared to artificial frame of reference 100 created by the worker. Artificial frame of reference 100 can be a two-dimensional grid, as depicted in FIG. 5, or it may be a three-dimensional grid.

The worker can use artificial frame of reference 100 instead of using a level or tape measure. The worker reads position 52 of drill bit tip 82 on interface 92 of tool 72. Once drill bit tip 82 is at the location where the worker wants to mark point 68, the worker marks a first point 68. The worker moves along target wall TW to place another point 68. While the worker is moving along target wall TW, interface 92 on tool 72 optionally displays one or both of position 52 of drill bit tip 82 and differential distance 94 between drill bit tip 82 and point 68.

Based on the information provided via interface 92 of tool 72, the worker can identify points 68 on target wall TW that are plumb with each other, level with each other, and/or equidistant with each other, and without need of a tape measure or level. Among other advantages, system 40 combines and even improves on standard tape measures and levels to provide workers quick and accurate measurements for points 68.

Once artificial frame of reference 100 is established, augmented image 78, such as displayed in AR headset 46, may show an artificial line that is the same distance from the ground. For example, a worker can establish a plane by identifying at least three calibration points 102, 104 and 106. Those three points define a plane, and the intersection between that plane and walls or objects may be shown to users in augmented reality, such as via AR headset 46. In another example, a worker can establish a height above the floor F with just one calibration point 102, and a line indicating that height may be shown to users in augmented reality, such as via AR headset 46.

Another use of artificial frame of reference 100 is to display offsets. For example, a worker identifies point 68 along a wall W, selects a distance, and the headset can display the location(s) that distance from point 68 (e.g., a user locates a point and 3' and the headset shows point(s) 68 that are 3' from the point). This can also be used to provide offsets, such as the worker identifying point 68 along wall W, selecting an offset distance, such as 3', and the worker also indicates how many additional points 68 to generate based on the offset. So if the worker requests two additional points, system 10 adds a second point 68 that is offset 3' from the first point 68, and system also adds a third point 68 another 3' from the second point 68 along wall W, and is therefore 6' from the first point 68. These steps may be performed to create virtual grids, virtual runs, and can also be mirrored or extended onto the ceiling and/or floor.

Turning to FIG. 6, virtual image 54 of the room and the worker can be streamed for remote viewing. For example, position 52 of AR headset 46 can be identified and then communicated to a remote computer with a display, such as a second AR headset 46. Second AR headset 46 receives position 52 and construction plan 56, and generates image 54 for a second worker to view. As depicted in FIG. 6, virtual image 54 is from a perspective that shows objects 60 and a virtual representation 130 of the first worker. This director's perspective allows second worker to see not only what the first worker is seeing, but also what is near the first worker that the he/she may not see (e.g., if the first worker is close to an object). Alternatively, virtual image 54 shown to the second worker may be the same as seen from the first worker's perspective in room R. Virtual image 54 may be generated based on position 52 of any spatially-aware tool 72. For example, virtual image 54 may be based on position 52 of tool 72, staff 122, or any other device 70.

Figure 7:
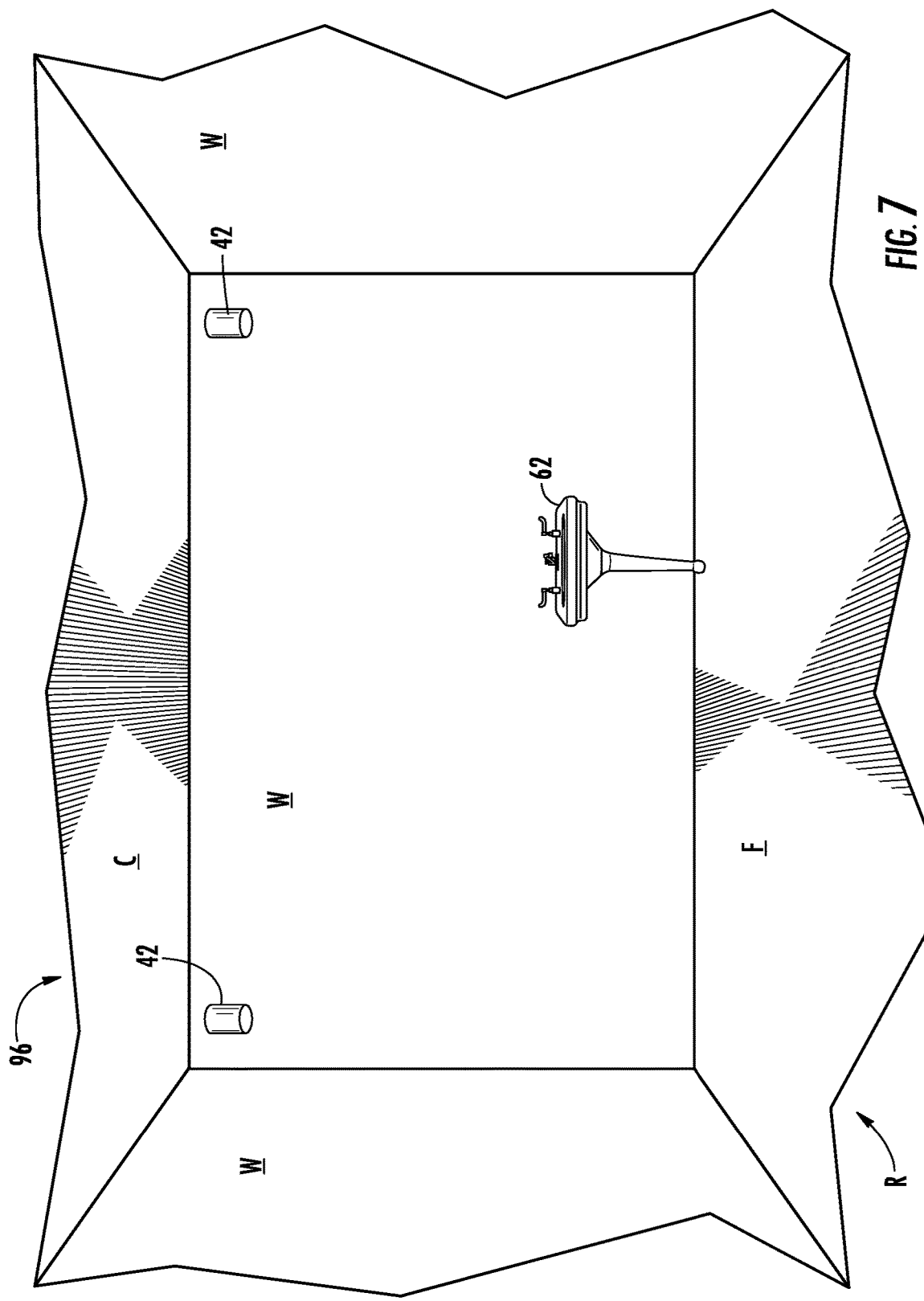
FIG. 7 is a perspective view of the system-enabled room of FIG. 6, according to an embodiment.

Turning to FIG. 7, tool 72 carried by first worker, such as AR headset 46 worn by first worker, may have camera 98 that captures actual image 96 that first worker is seeing. Actual image 96 includes walls W, ceiling C, floor F, and object 62. Actual image 96, such as FIG. 7, is streamed and displayed for a remote worker, such as via AR headset 46 or projector 44.

Figure 8:
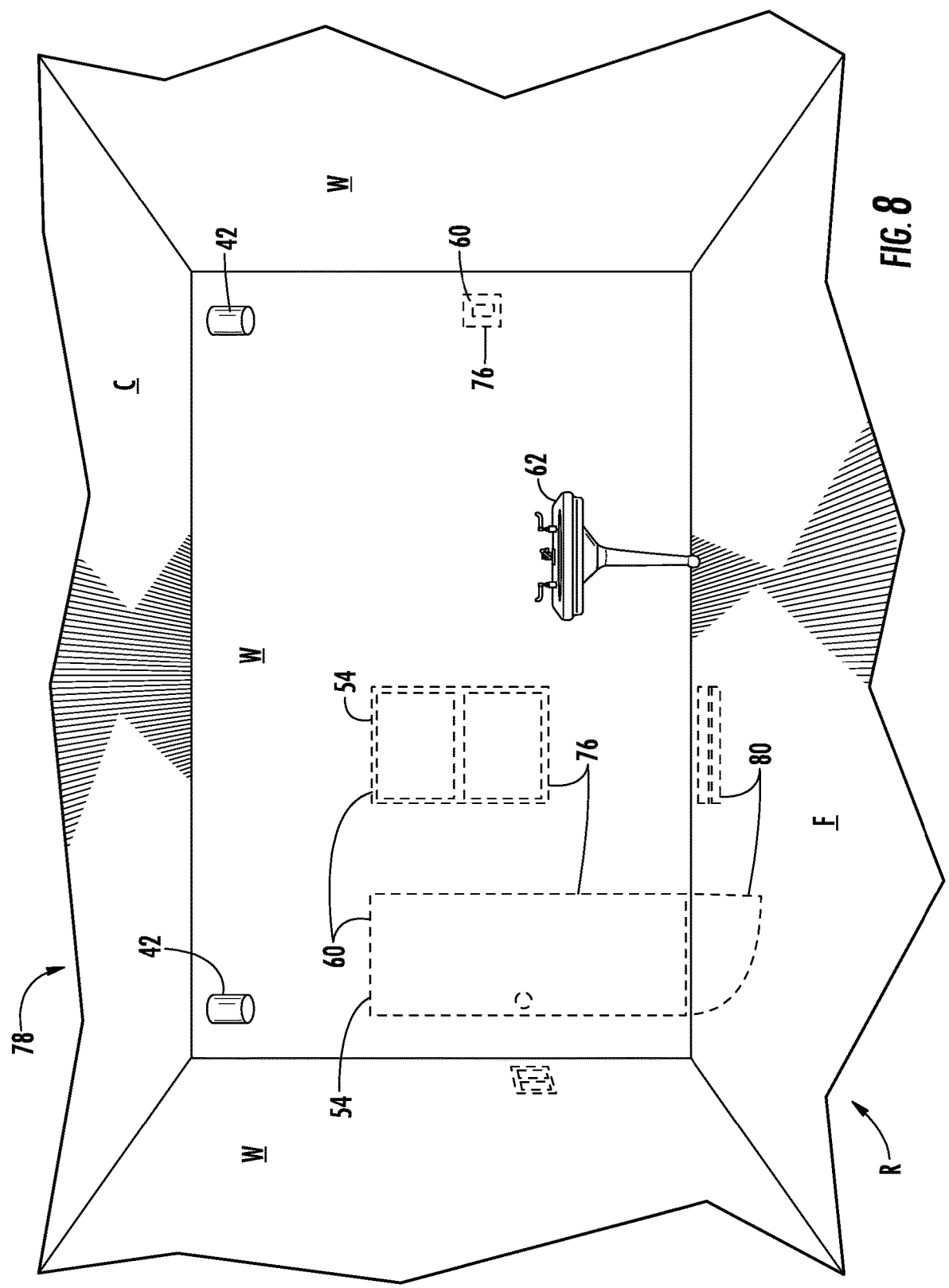
FIG. 8 is an augmented reality perspective view of the system-enabled room of FIG. 6, according to an embodiment.

Turning to FIG. 8, augmented image 78, which is a combination of virtual image 54 and actual image 96 may be streamed to a remote worker. Streaming augmented image 78 allows a remote worker to see actual image 96 augmented by objects 60 from construction plan 56.

Figure 9:
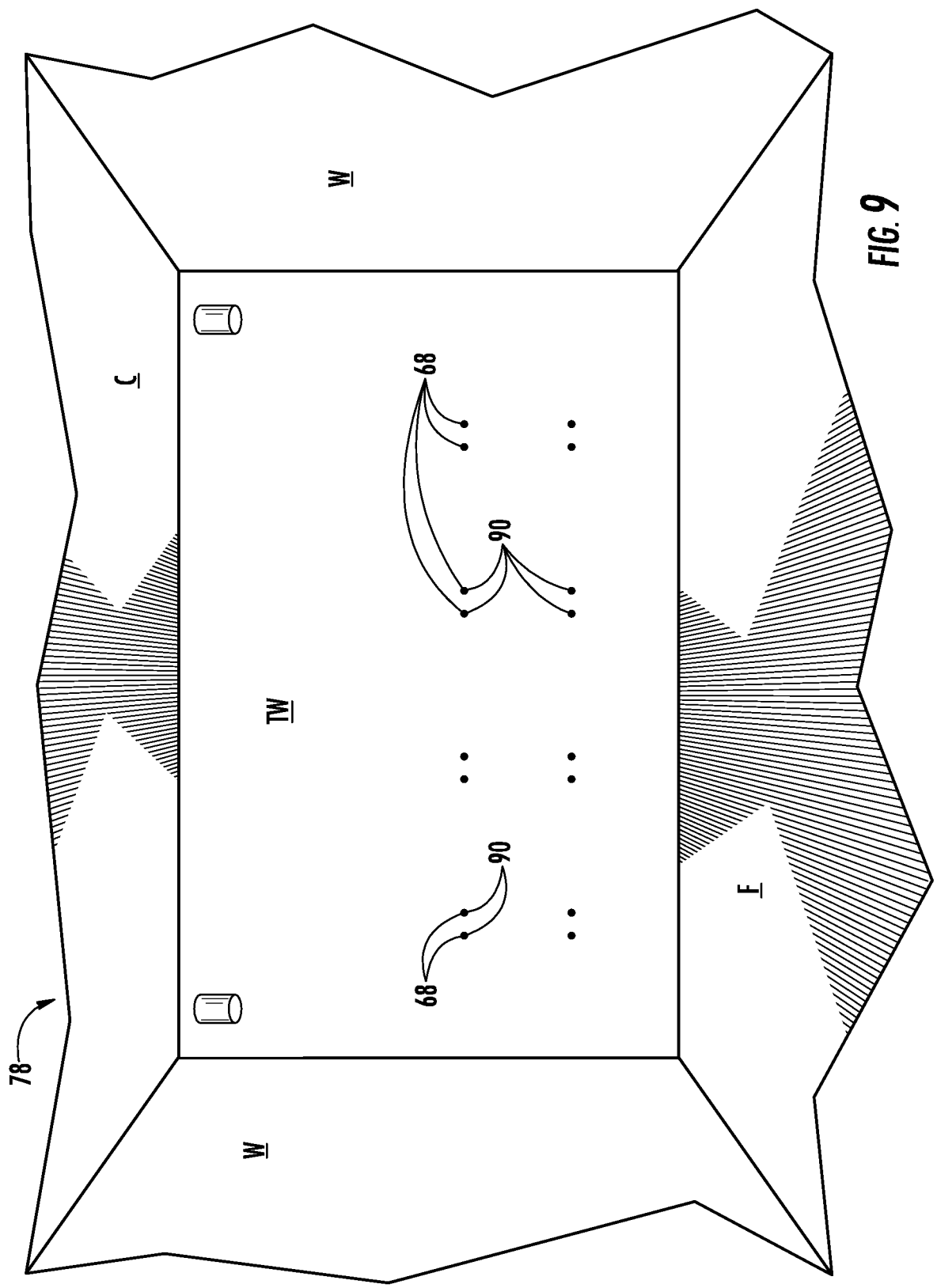
FIG. 9 is an augmented reality perspective view of a system-enabled room with multiple locations identified and displayed, according to an embodiment.
Figure 10:
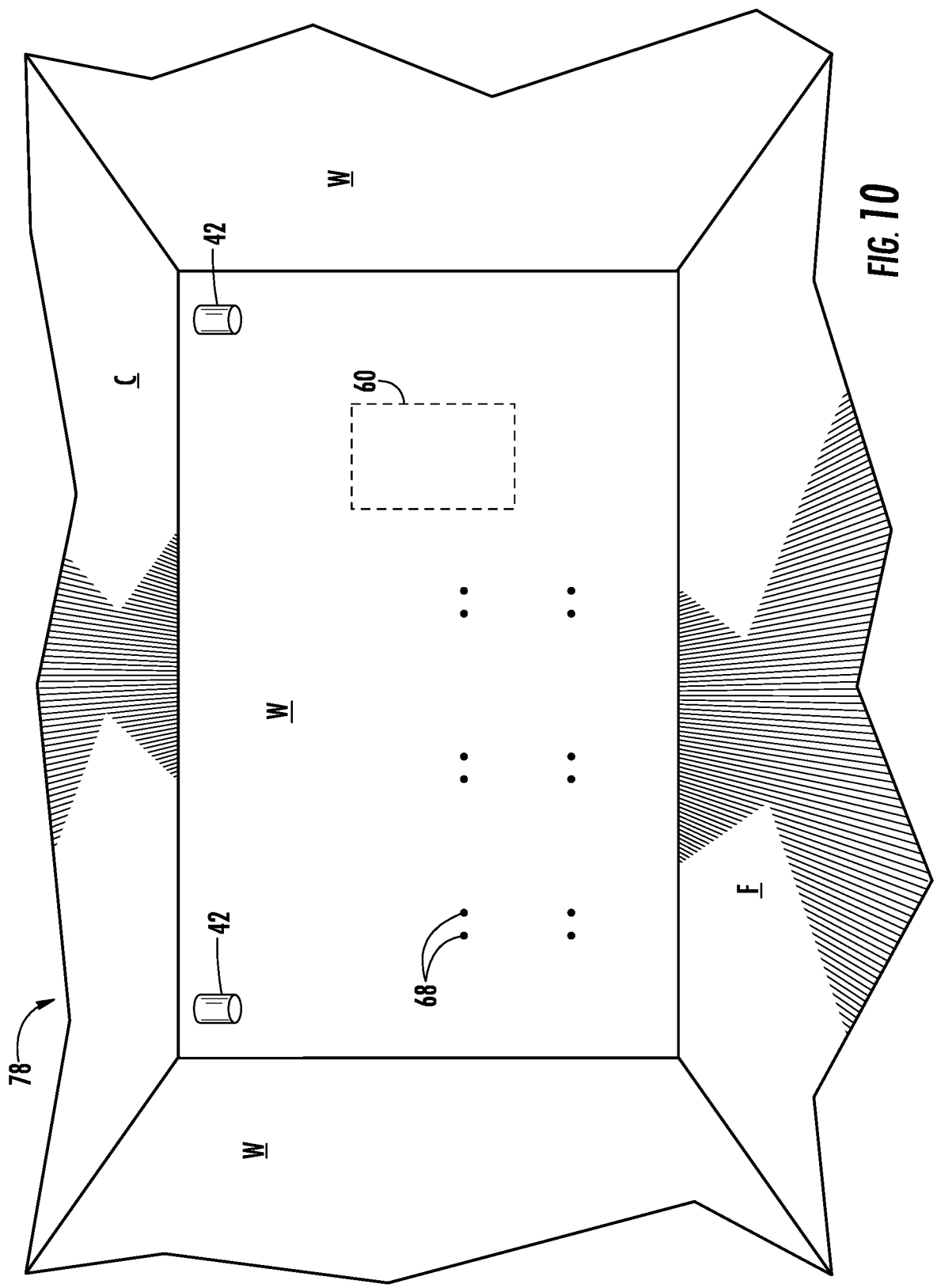
FIG. 10 is an augmented reality perspective view of a system-enabled room with a window and multiple locations identified and displayed, according to an embodiment.
Figure 11:
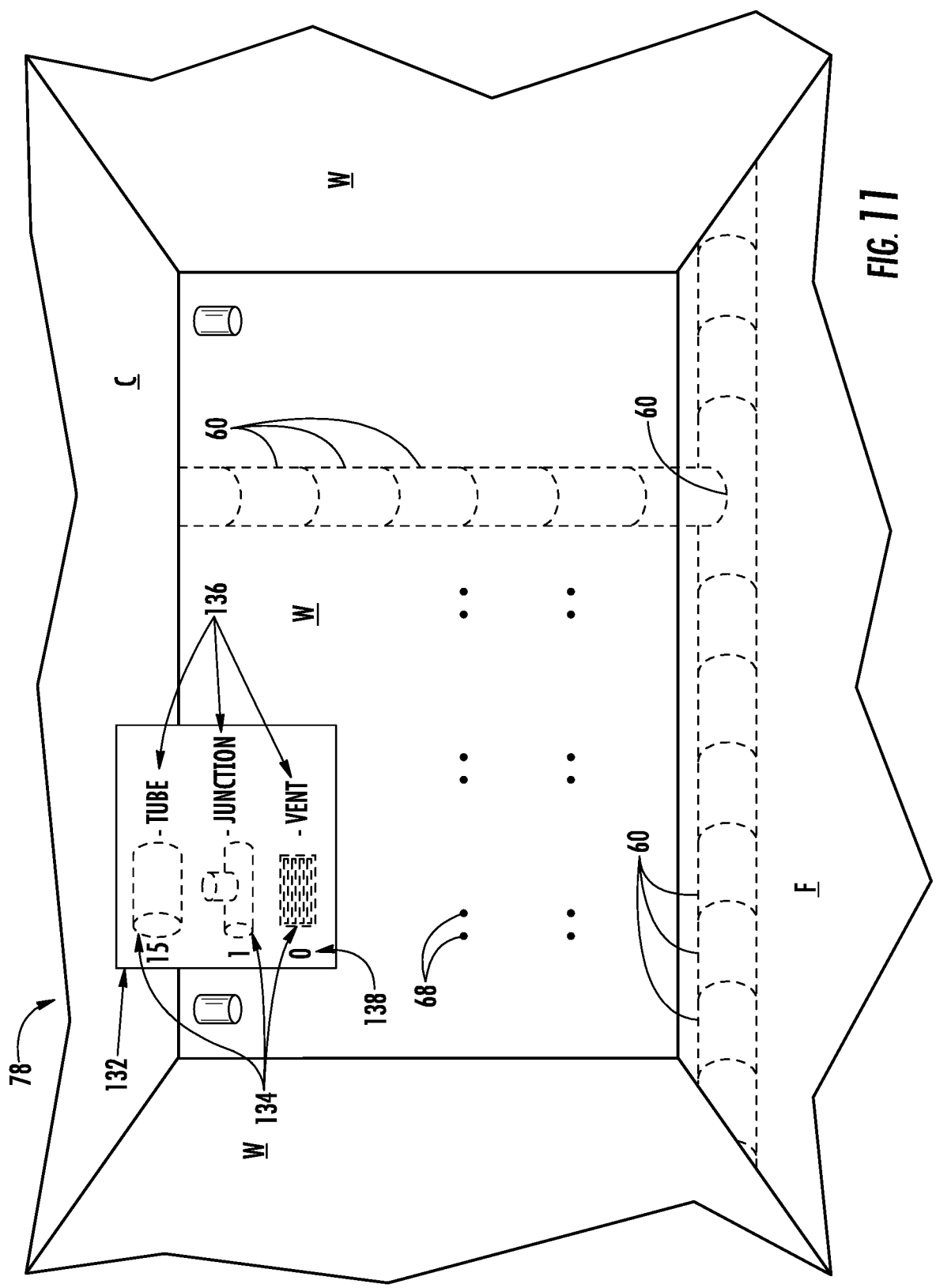
FIG. 11 is an augmented reality perspective view of a system-enabled room with multiple artificial objects identified and displayed, according to an embodiment.

Turning to FIGS. 9-11, a worker can use system 40 to identify points 68. After points 68 are identified, the same worker can go back and perform the work identified (e.g., drill the points 68), or another worker can have their tool 72 or AR headset 46 synced to the artificial frame of reference 100, including points 68, and subsequently perform the work identified. Point 68 includes information 90, which describes characteristics of point 68, such as the depth of the desired hole and/or the width of the desired hole.

The worker can also identify object 60, such as window object 60 (best shown in FIG. 10). The worker can trace the outline of window object 60 via tool 72, staff 122, and/or any tool 72. After window object 60 is identified and traced by the worker, window object 60 can subsequently be seen by the same worker or other workers.

Alternatively, the dimensions of object 60 can be traced and the dimensions subsequently used to construct a physical representation of object 60. For example, if the worker traces the location and dimension of a marble countertop, the dimensions of traced object 60 can be saved and provided to a party that cuts the marble countertop to the measured dimensions. The dimensions measured and communicated could be of the 2D-form and the third dimension is assumed or otherwise selected, or the dimensions measured and communicated could be of the 3D-form.

Turning to FIG. 11, the worker can also use devices 70, such as AR headset 46 or staff 122, to identify objects 60 to be installed in and around room R. Worker wearing AR headset 46 views augmented image 78 that includes selection menu 132, which is overlays physical image 74 and the rest of augmented image 78. Selection menu 132 includes components 134 and component titles 136. In this example, components 134 are HVAC components. The worker can select component 134 from selection menu 132 and identify position 52 where components 134 will be placed in room R. After the worker identifies a component 134 to be placed in room R, component 134 becomes virtual object 60. Worker can continue to identify components 134 to add to augmented image 78 in room. As components 134 are added, order list 138 is updated to reflect the number and identity of components 134 that worker has identified are needed. After the worker has finished completing the virtual construction activity, order list 138 may be submitted for order, such as directly to a supplier or to a manager (e.g., a general contractor) for combining with other order lists 138. While constructing object 60, the worker may select different types of components other than HVAC components, such as plumbing components, lighting, conduit (e.g., conduit bends), stick frame rafters, iron work, walls, sprinkler systems, datacom components, and tile work.

In one embodiment, device 70 continuously updates its position 52. In another embodiment, device 70 intermittently update its position 52.

Figure 12:
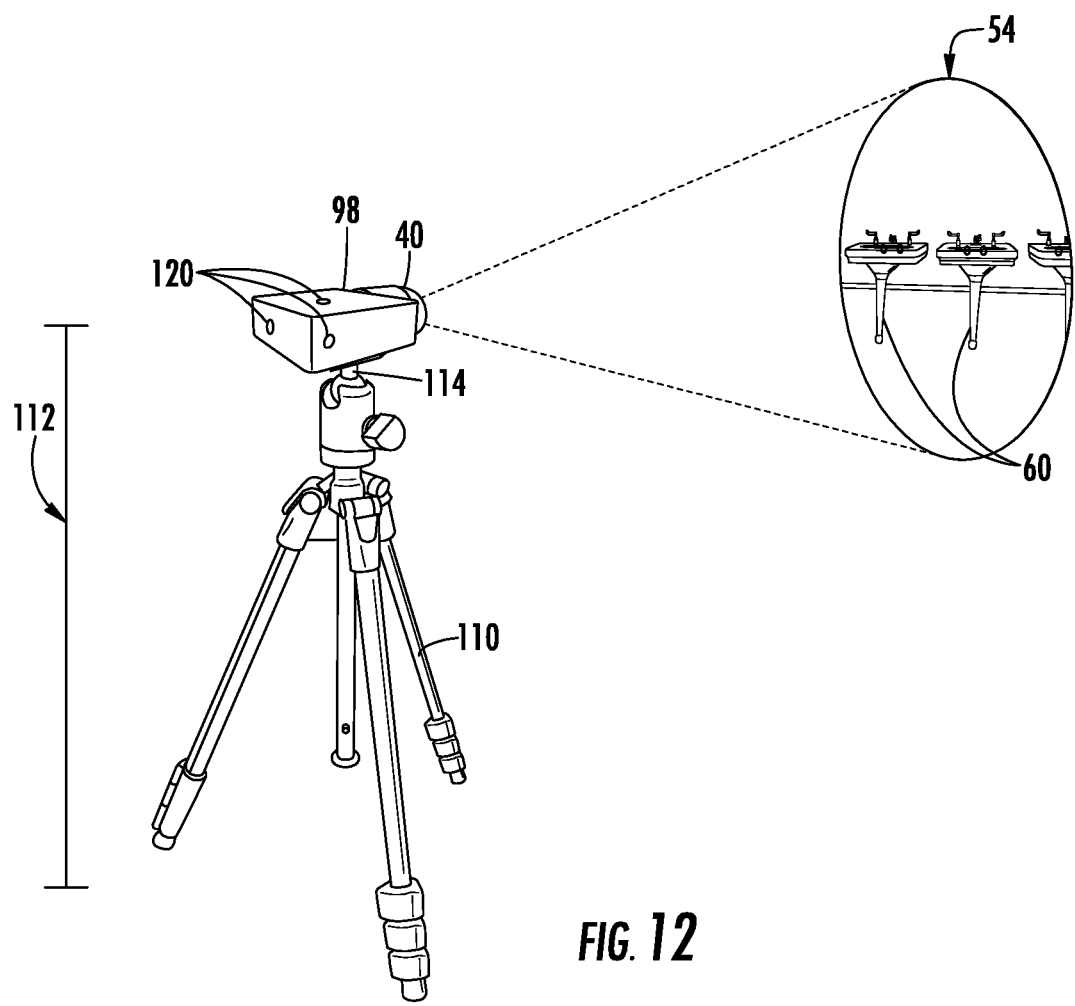
FIG. 12 is a perspective view of a system-enabled tripod with a projector, according to an embodiment.

Referring to FIGS. 12-22, various tools for use with system 40 are identified. In FIG. 12, projector 44 on tripod 110 displays image 54 with objects 60, in this case, sink objects 60. Projector 44 has height 112 that can be adjusted by adjusting tripod 110. Where projector 44 displays image 54 can also be adjusted by rotating projector 44 on axis 114. Projector 44 includes several receivers 120 that are used to calculate position 52 of projector 44. As projector 44 is moved around room R, projector 44 updates image 54 based on construction plan 56 or artificial frame of reference 100 and points 68.

Figure 13:
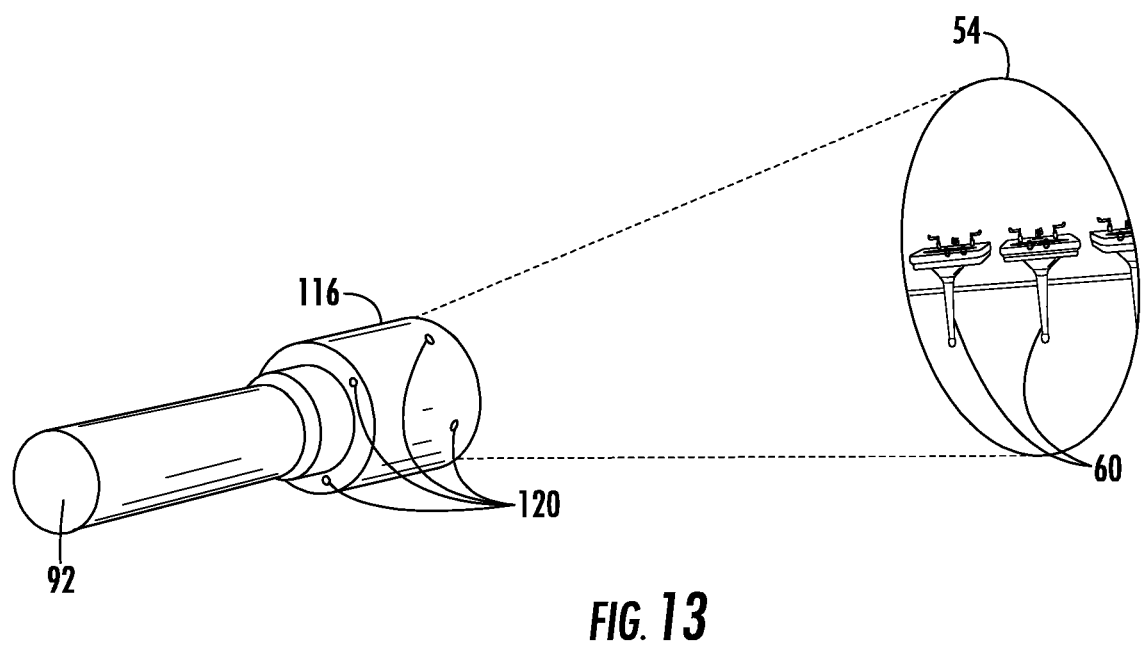
FIG. 13 is a perspective view of a system-enabled flashlight, according to an embodiment.

In FIG. 13, flashlight projector 116 displays image 54. Flashlight projector 116 calculates its position 52 based on calibration signal 150 detected by receivers 120. Based on its position 52, flashlight projector 116 generates image 54 to display. Based on construction plan 56, flashlight projector 116 augments image 54 to include objects 60. Flashlight projector 116 includes several receivers 120 that are used to calculate position 52 of projector 44. As flashlight projector 116 is moved around room R, flashlight projector 116 updates image 54. Flashlight projector 116 includes interface 92. Interface 92 receives input (e.g., via an input device, such as a keyboard) and provides output (e.g., via an output device, such as a display) to the worker.

Figure 14:
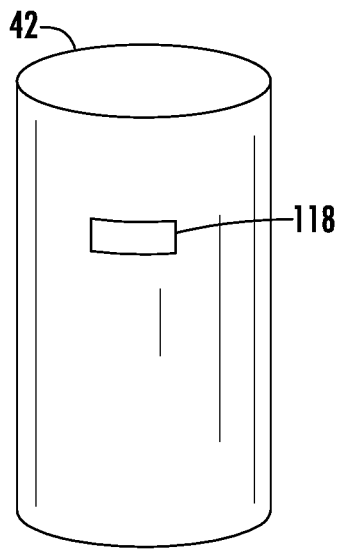
FIG. 14 is a perspective view of a system-enabled lighthouse, according to an embodiment.

In FIG. 14, lighthouse 42 includes emitter 118. Emitter 118 transmits light, such as infrared light, to enable tools 72 to calculate their position 52. Various embodiments of lighthouse 42 include multiple emitters 118. For example, the position 52, timing, and direction of light emissions from lighthouse 22 may be known by receivers 120, and relied upon to calculate relative position 50 of receiver 120, when receiving from a single lighthouse 42, or position 52 of receiver 120, when receiving light from multiple lighthouses 42.

Figure 15:
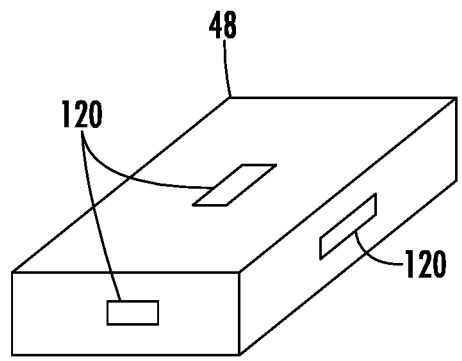
FIG. 15 is a perspective view of a system-enabled sensor block, according to an embodiment.

In FIG. 15, sensor 48 includes several receivers 120. Receiver 120 detects light, such as infrared light emitted by lighthouse 42, to calculate position 52 of sensor 48. Sensor 48 may be used to calibrate location of tool 72, such as position 52 of drill bit tip 82.

Figure 16:
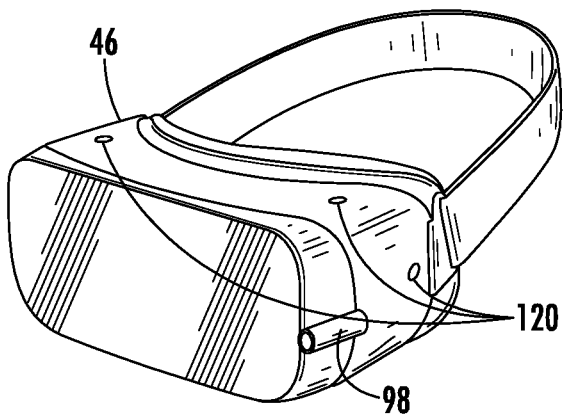
FIG. 16 is a perspective view of a system-enabled augmented reality (AR) headset, according to an embodiment.

In FIG. 16, AR headset 46 includes receivers 120 and camera 98. Receivers 120 interact with light emitters, such as lighthouses 42, to determine position 52 of AR headset 46. Camera 98 is used to capture what the worker is actually viewing.

Figure 17:
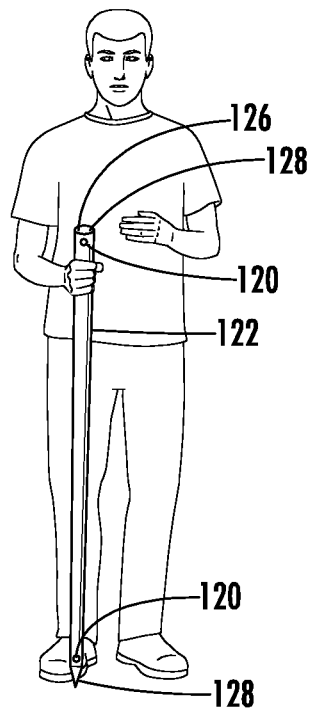
FIG. 17 is a perspective view of a system-enabled staff, according to an embodiment.

In FIG. 17, staff 122 is used by worker to work within room R. Staff 122 includes receivers 120 that are used to calculate position 52 of staff 122. For example, staff 122 includes a receiver 120 at handle end 124 and a receiver 120 at lower end 126. Staff 122 includes interface 92 that provides output and receives input from the worker. Output to a worker may include telling the worker where to go, such as via indications on a display screen, patterns of vibrations, sounds, and/or a top view image of the worker's position with respect to their desired location. Staff 122 can also be used as the marking tool to indicate points 68. Staff 122 may include an interface button 92 that, when depressed, digitally marks points 68 or creates digital lines. Staff 122 may provide feedback to the worker by indicating where the tip of staff 122 is located. Staff 122 could also display to a worker arrows that indicate the direction the worker should walk in. The interface 92 on staff 122, which in some embodiments includes a display, may also display augmented image 78 in which point locations 68 are imaged within the physical environment as seen through the device's 70 camera.

Another way staff 122 may communicate directions to a worker is showing a hollow circle on a display, with the display representing the target destination. As the worker carries staff 122 around, a representation of the worker moves in the display. The worker's goal is to align himself/herself on the hollow circle.

Figure 18:
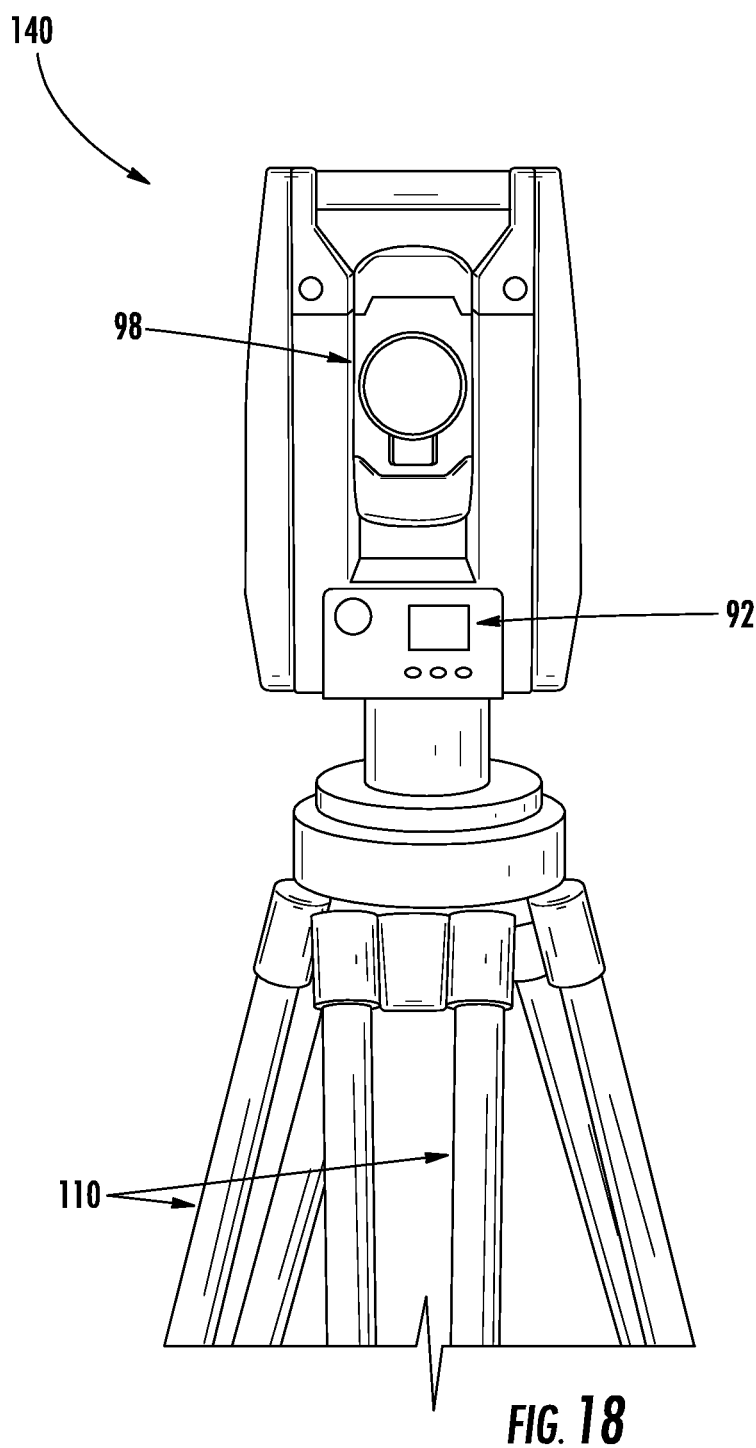
FIG. 18 is a perspective view of a total robotic system, according to an embodiment.
Figure 19:
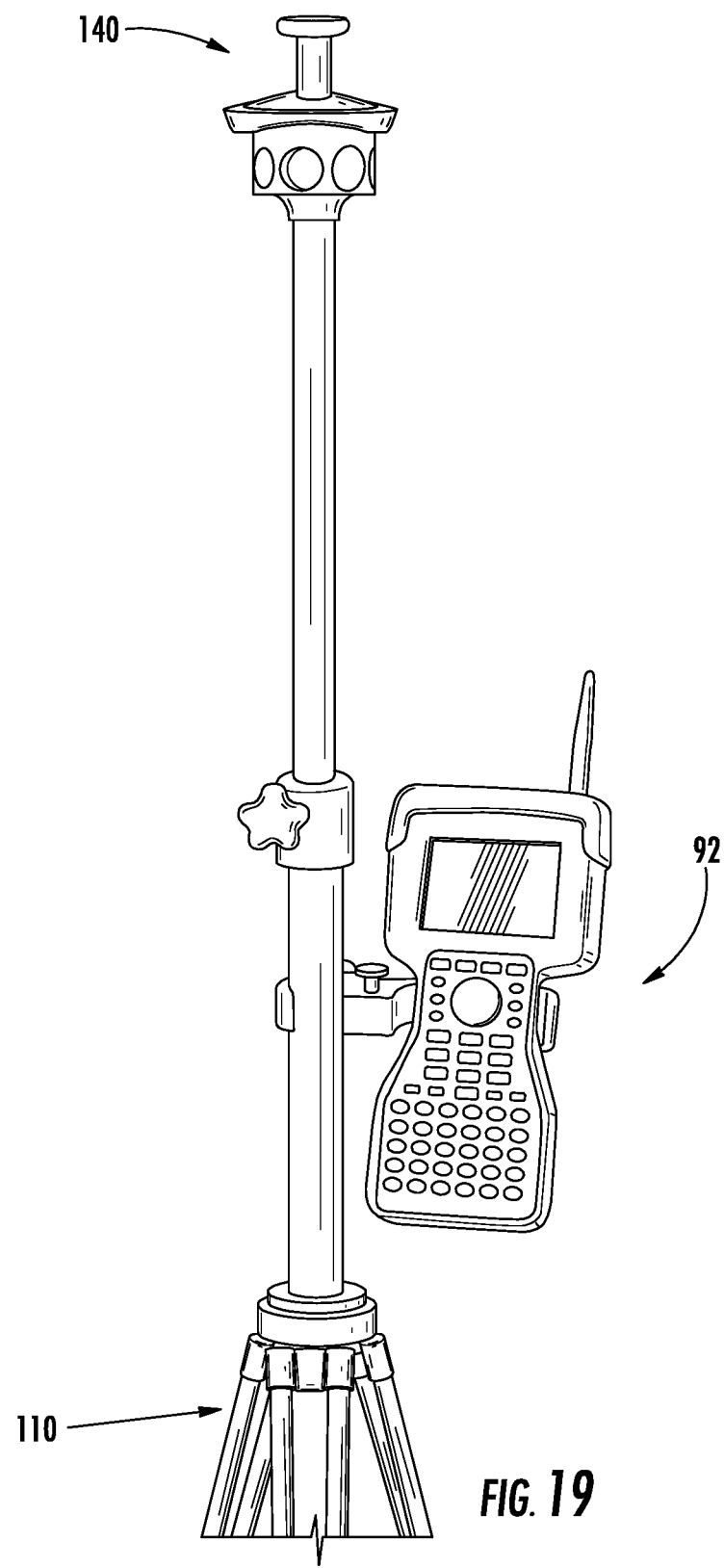
FIG. 19 is a perspective view of a total robotic system, according to an embodiment.

In FIGS. 18-19, total robotic station 140 interacts with lighthouses 42 to identify position 52 of total robotic station 140. Total robotic station 140 includes interface 92, camera 98, and tripod 110. Total robotic station 140 can be used to identify points 68, such as by a worker using device 70 to select point 68, or by total robotic station 140 projecting a light to indicate where a previously-selected point 68 is located. Total robotic station 140 can also calculate a distance between two locations (e.g., between point 68 and total robotic station 140, between first point 68 and second point 68). Total robotic station 140 can also perform 3D scanning of room R where total robotic station 140 is located, and based on the scanning perform volume calculations of room R. Total robotic station 140 can also track devices 70, including receivers 120, that include prisms to reflect and/or refract light. Total robotic station 140 can also determine whether an object, such as wall W, is plumb/square, such as by scanning it.

Figure 20:
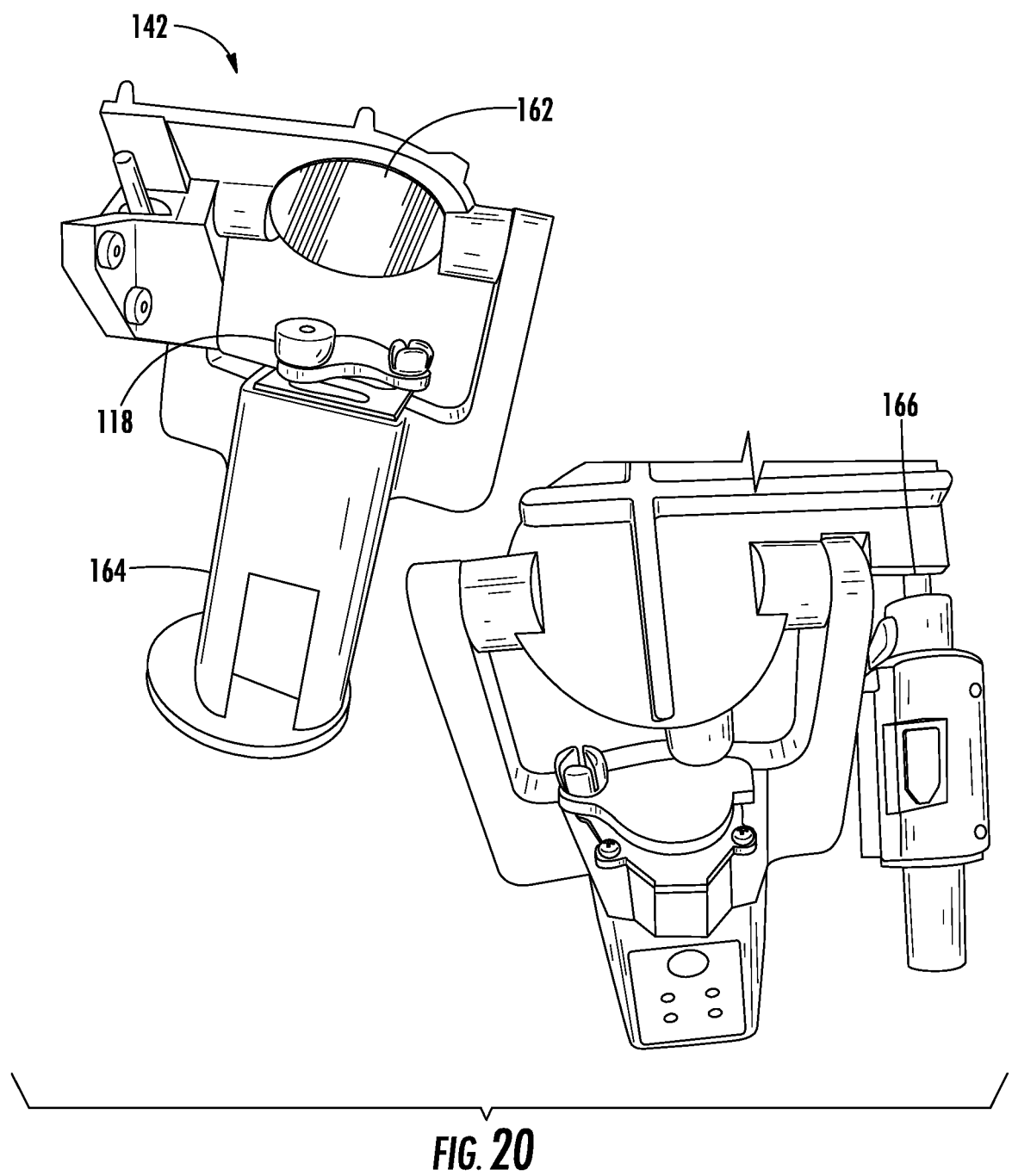
FIG. 20 is a perspective view of a tripod with an articulating laser, according to an embodiment.

In FIG. 20, tripod 110 with articulating laser 142 is depicted. Light emitted by articulating laser 142 is used to identify points 68 anchors, risers, wall locations, etc. Light emitted by articulating laser 142 can interact with remote receivers 120 to determine position 52 of other devices 70. Emitter 118 emits light at mirror 162, and mirror 162 adjusts its orientation to redirect where light from emitter 118 is reflected to. Articulating laser 142 includes rotary base, with a worm and spur gear, and lead screw 166, which is adjustable. Articulating laser 142 can determine its 3-D position 52 by emitting light in the form of a vertical line laser and scanning room R to find active laser receivers 120 placed around the jobsite at known points 144. Once located, articulating laser 142 can determine its distance to at least two of these beacons by triangulating its position 52. Articulating laser 142 could also determine its position 52 based on learning the position 52 of tool 72 that is mounted to articulating laser 142.

Figure 21:
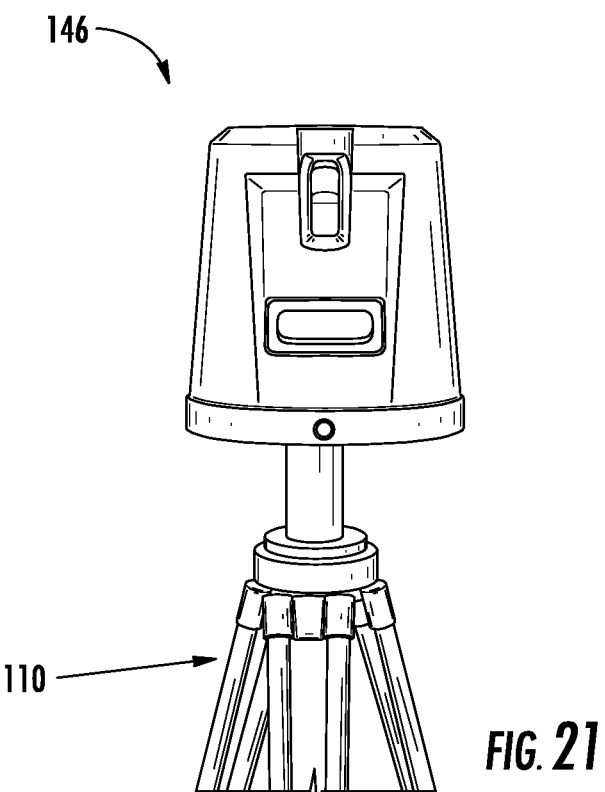
FIG. 21 is a perspective view of a laser receiver with vertical line laser, according to an embodiment.

In FIG. 21, laser receiver with vertical line laser 146 is depicted. In one embodiment, laser receiver with vertical line laser 146 may be the QML800 available from Spectra, or a similar laser-receiving and/or emitting device.

Figure 22:
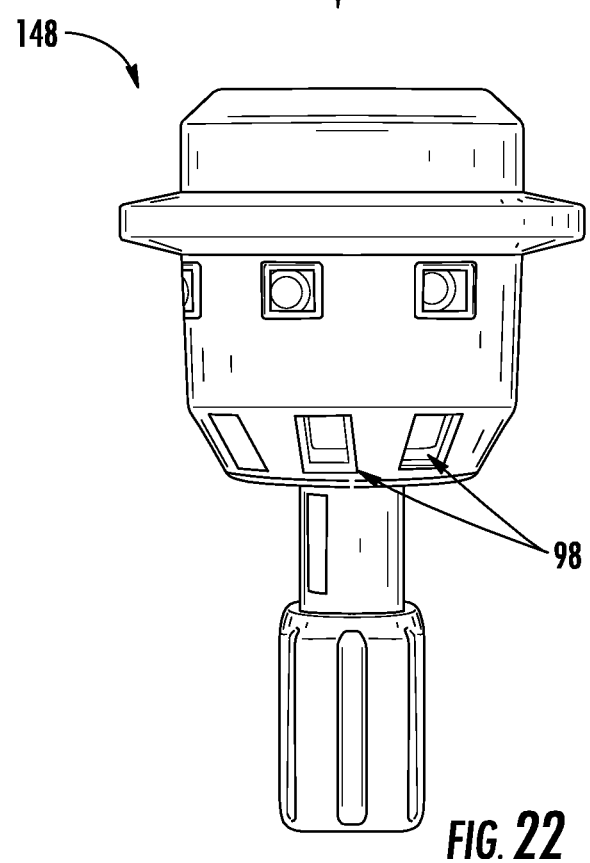
FIG. 22 is a perspective view of a multi-direction camera system, according to an embodiment.

In FIG. 22 multi-direction camera system 148 is depicted. Multi-direction camera system 148 includes a several cameras 98.

Figure 23C:
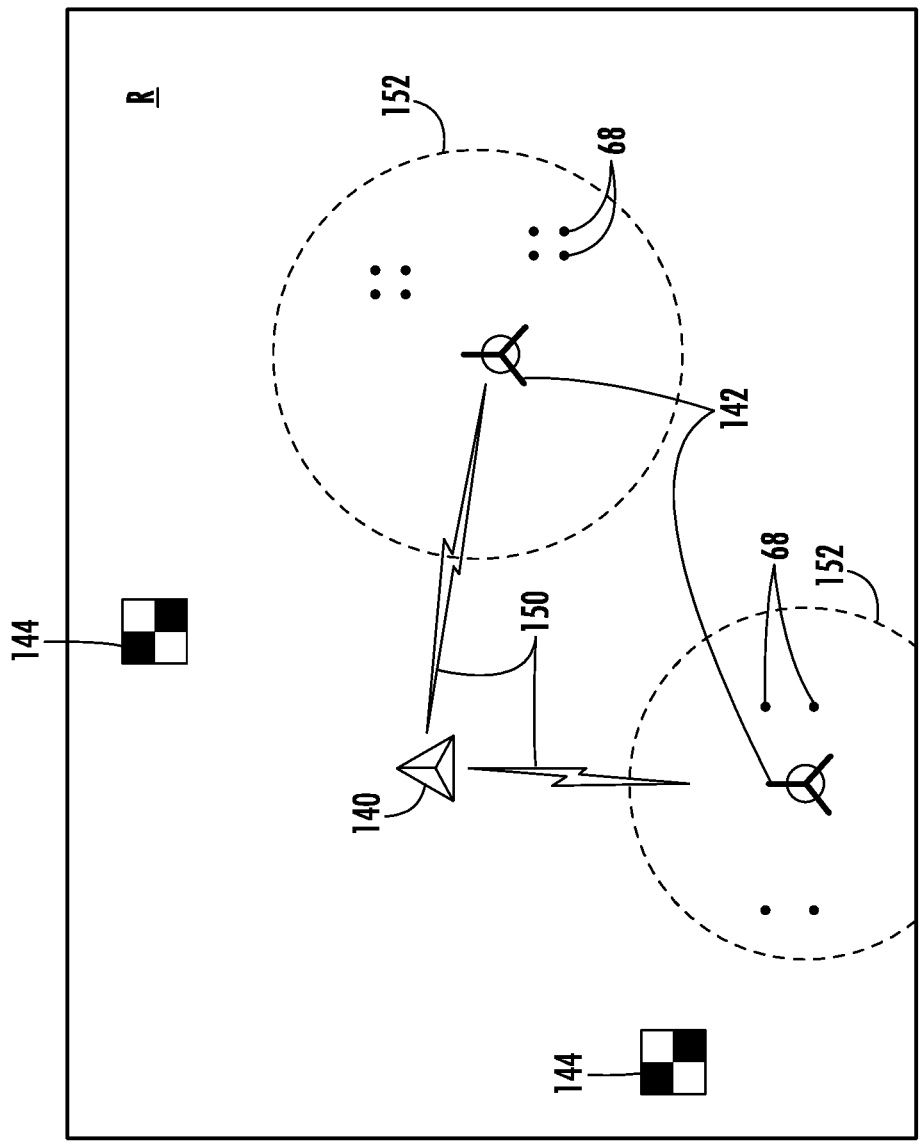

Turning to FIGS. 23A-23C, total robotic station 140 receives position 52 of known points 144. Total robotic station 140 calculates its position 52 based on identifying known points 144 in room R. Articulating laser 142 is placed in room R. Articulating laser 142 calibrates its position 52 by interacting with total robotic station 140, and then displays points 68 for a worker to perform actions. Articulating laser 142 displays points 68 by projecting laser light on the associated position 52 of ceiling C, wall W or floor F. Articulating laser 142 identifies points 68 within projection range 152 by referring to construction plan 56 and/or artificial frame of reference 100. Projection range 152 of articulating laser 142 is the area over which articulating laser 142 can project points 68. Second articulating laser 142 can be added to room R (FIG. 23C) and display points 68 after calibrating position 52 without referring to total robotic station 140.

Figure 24C:
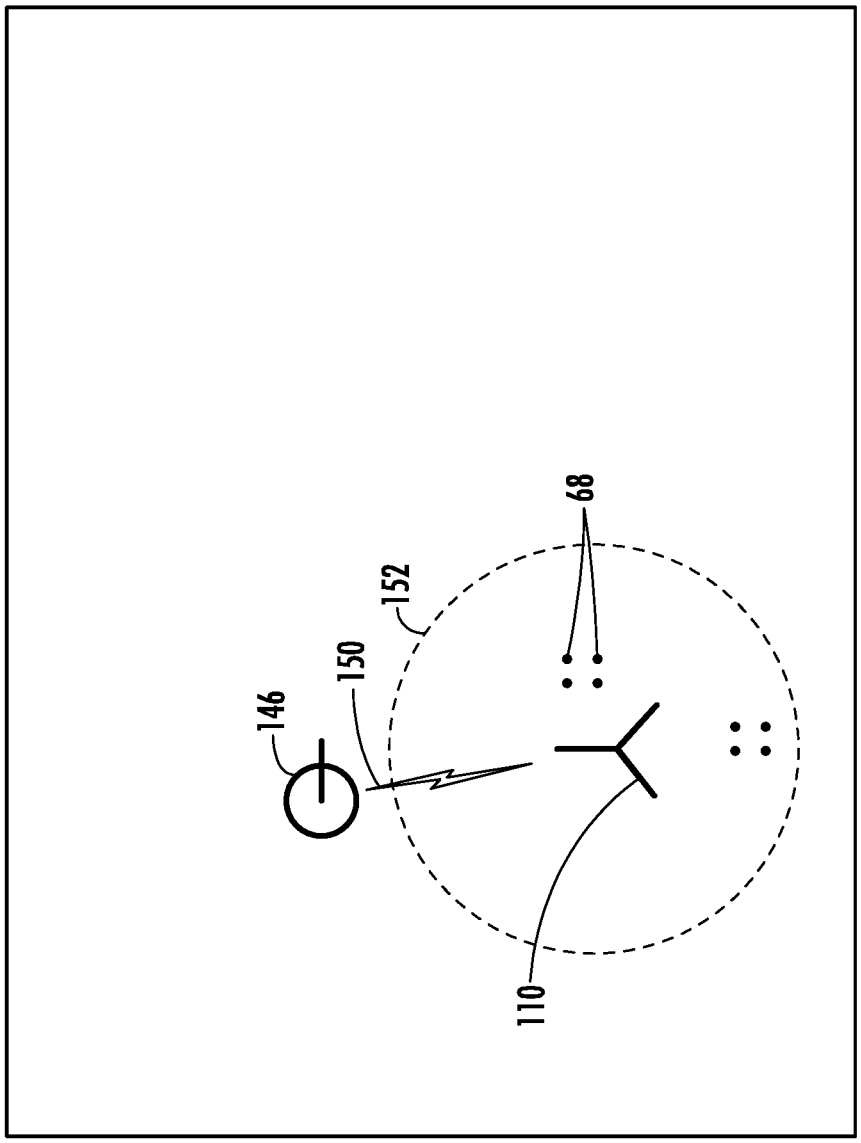
Figure 24D:
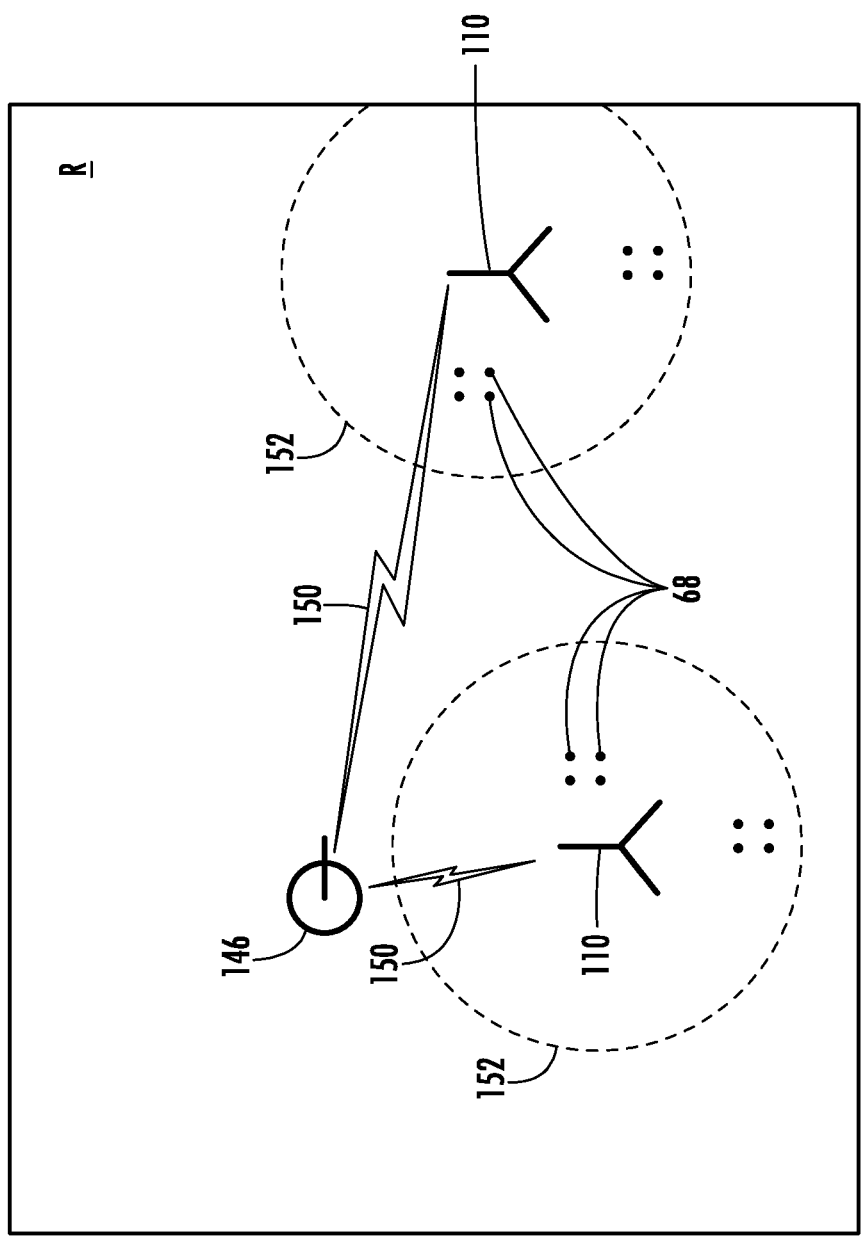

Turning to FIGS. 24A-24D, laser receiver with vertical line laser 146 and tripod 110 are placed in room R. Tripod 110 may be coupled to articulating laser 142, projector 44, or other devices 70 that project light in room R for workers. Tripod 110 is placed over laser receiver with vertical line laser 146, and tripod 110 calibrates its position 52 in room R, such as by identifying corners of room R and calculating position 52 of tripod 110 based on the relative positions of corners of room R (FIG. 24B). Tripod 110 has the same horizontal position 52 as laser receiver with vertical line laser 146, so tripod 110 communicates its horizontal position 52 to laser receiver with vertical line laser 146. Tripod 110 is then moved and recalibrates its position 52 in room R with respect to laser receiver with vertical line laser 146 (FIG. 24C). Tripod 110 identifies points 68 within projection range 152 by referring to construction plan 56 and/or artificial frame of reference 100. Projection range 152 of tripod 110 is the area over which tripod 110 can project points 68. Second tripod 110 can be added to room R (best shown FIG. 24D) and display points 68.

Figure 25A:
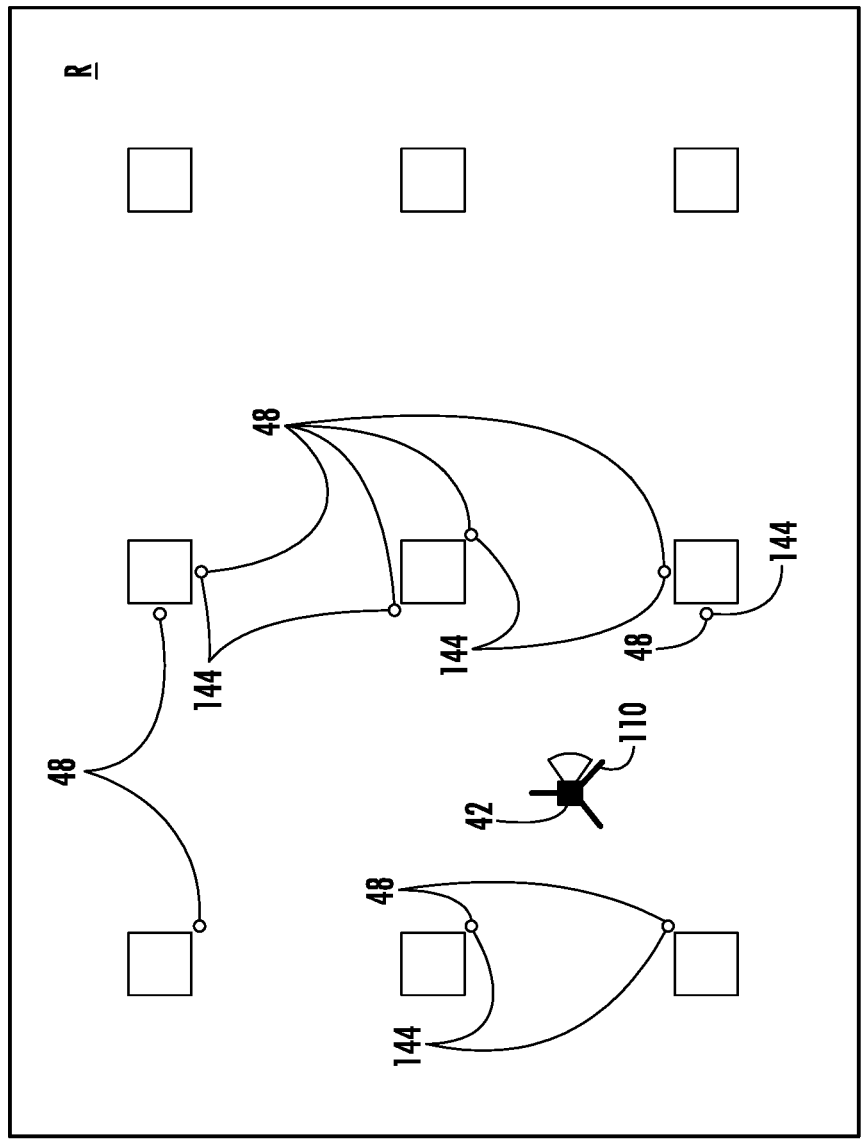
FIGS. 25A-25C are a series of top views of a room with multiple sensors and a lighthouse, according to an embodiment.
Figure 25B:
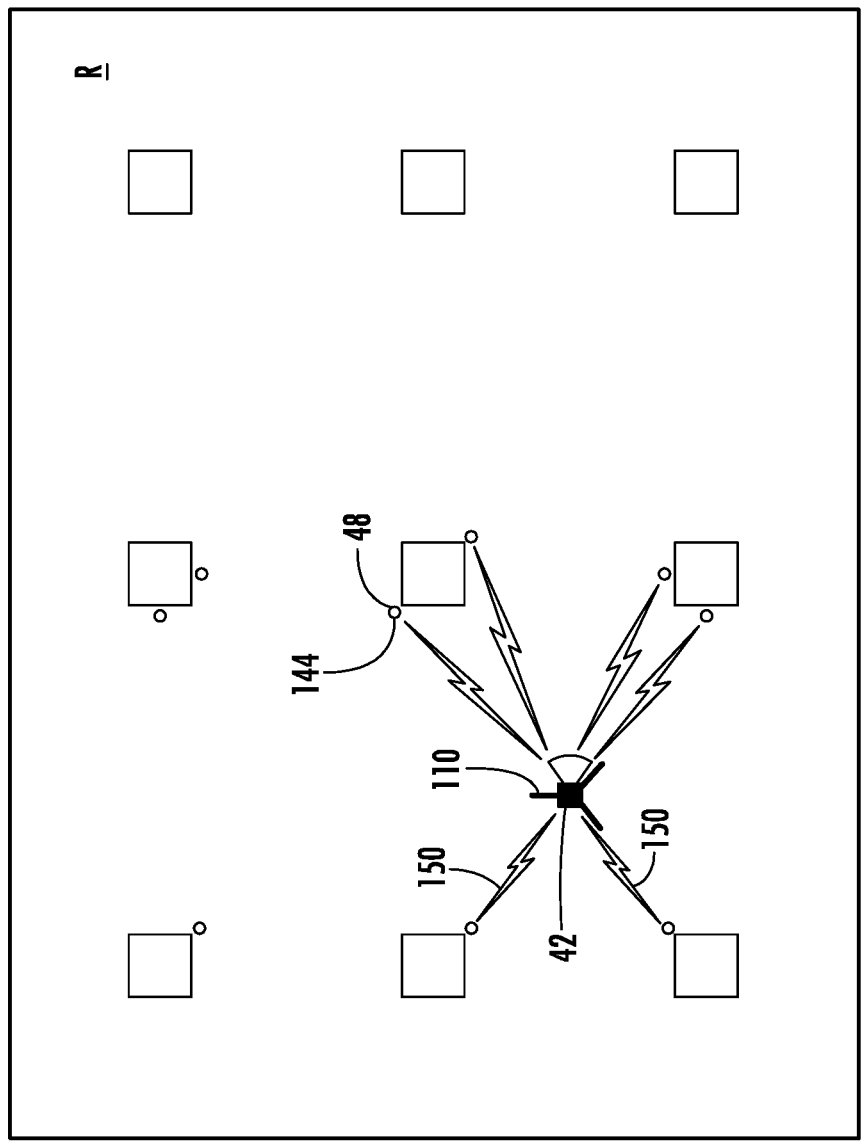
Figure 25C:
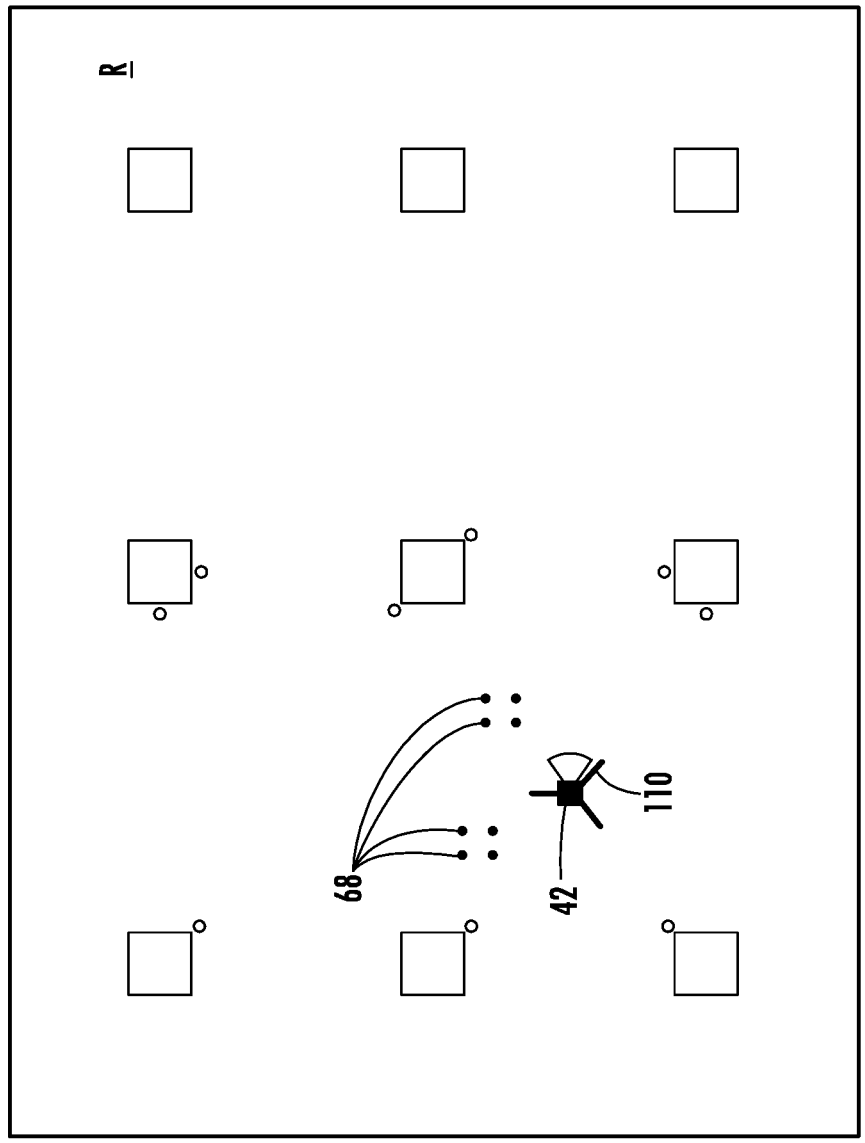

Turning to FIGS. 25A-25C, multiple sensors 48 are arranged around room R. Tripod 110 with lighthouse 42 is placed in room R. Known points 144 where sensors 48 are located are loaded into lighthouse 42. Lighthouse 42 calibrates its position 52 as compared to sensors 48 at known points 144 (FIG. 25B), such as by transmitting light in room R that sensor 48 can sense and calculate relative position 50. Position 52 of lighthouse 42 is calculated based on relative positions 50 of sensors 48. Lighthouse 42 then projects points 68 in room R (FIG. 25C).

Figure 26A:
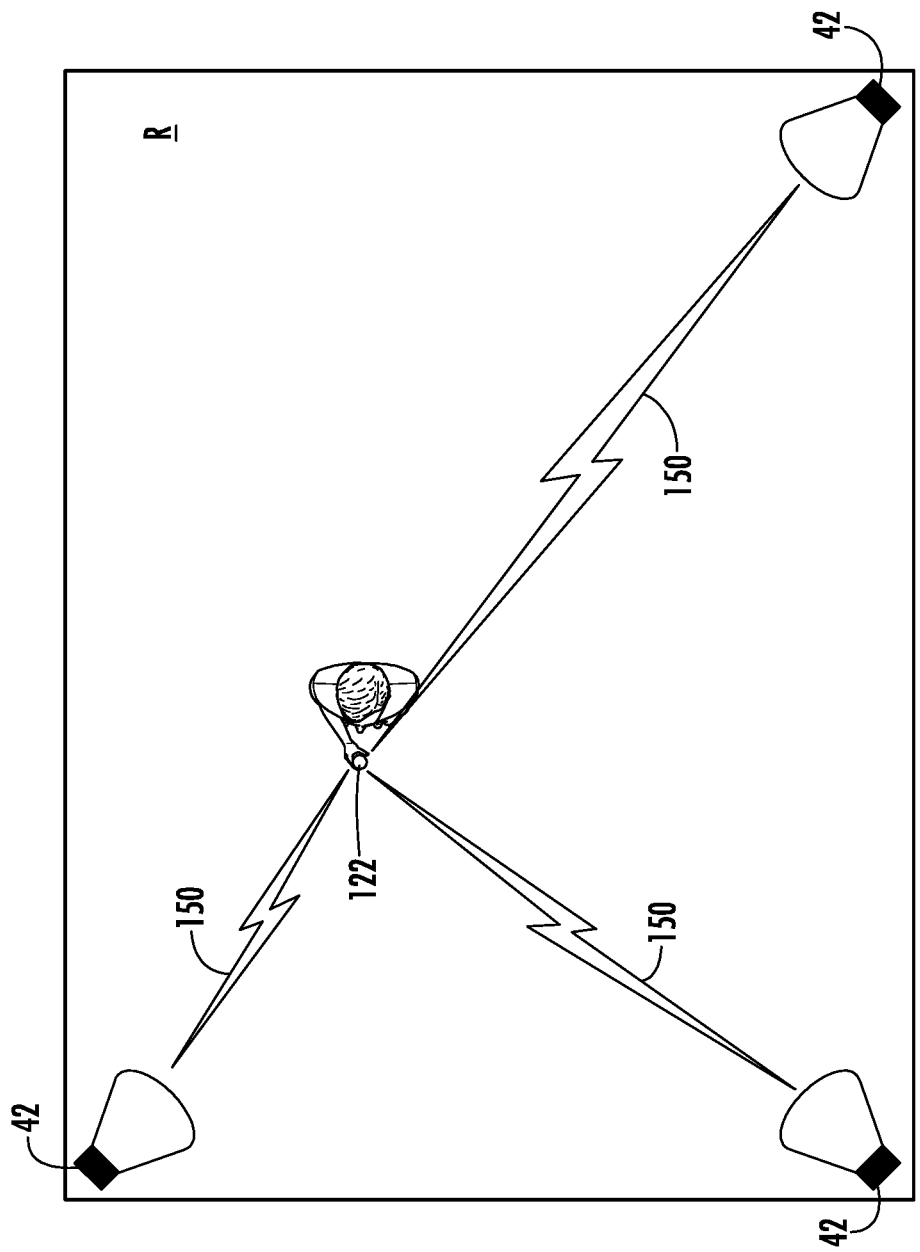
Figure 26B:
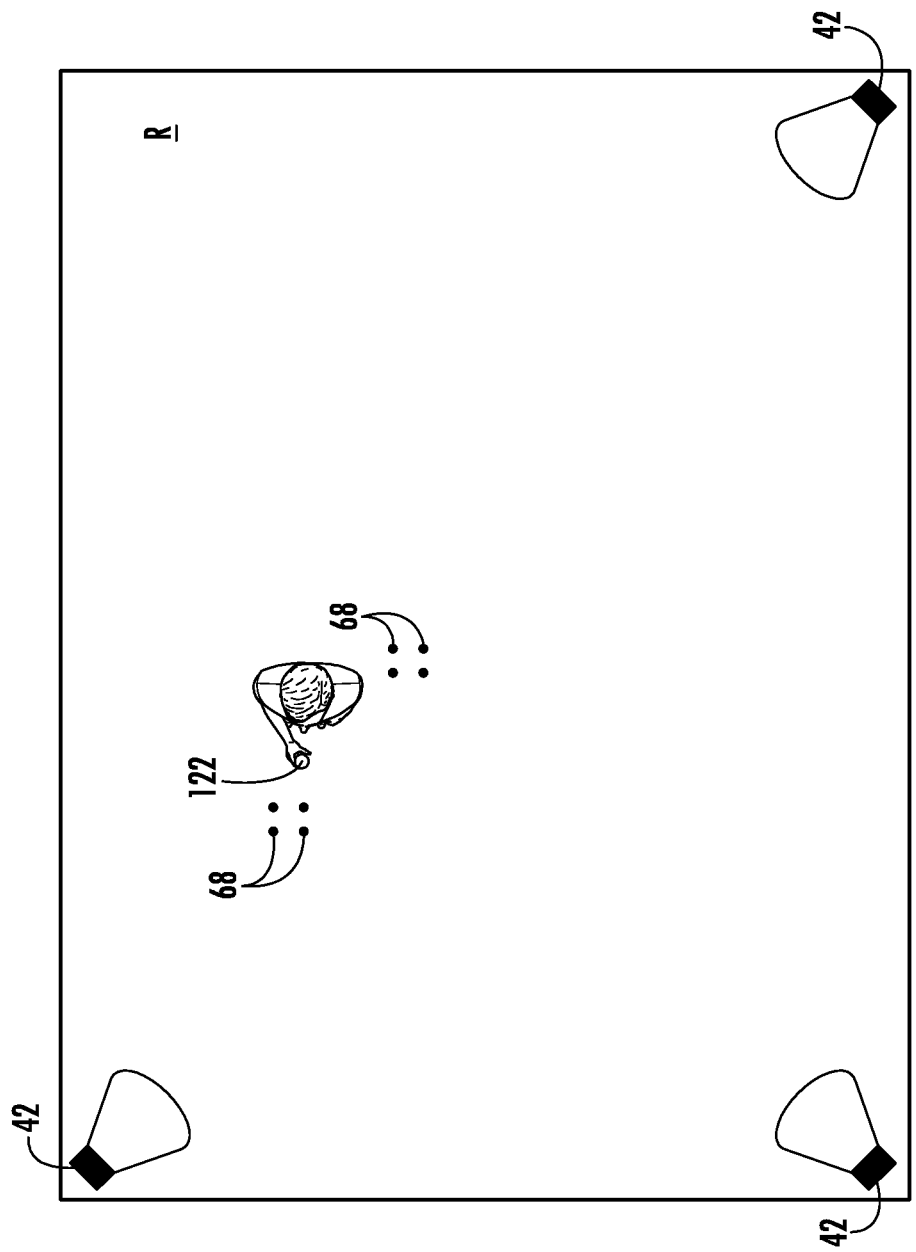

Turning to FIGS. 26A-26C, staff 122 calibrates its position 52 to lighthouses 42 in room R. Staff 122 then identifies points 68. After worker moves within room R, staff 122 projects additional points 68 in room R. Points 68 are known by staff 122 based on construction plan 56 and/or artificial frame of reference 100.

Figure 27B:
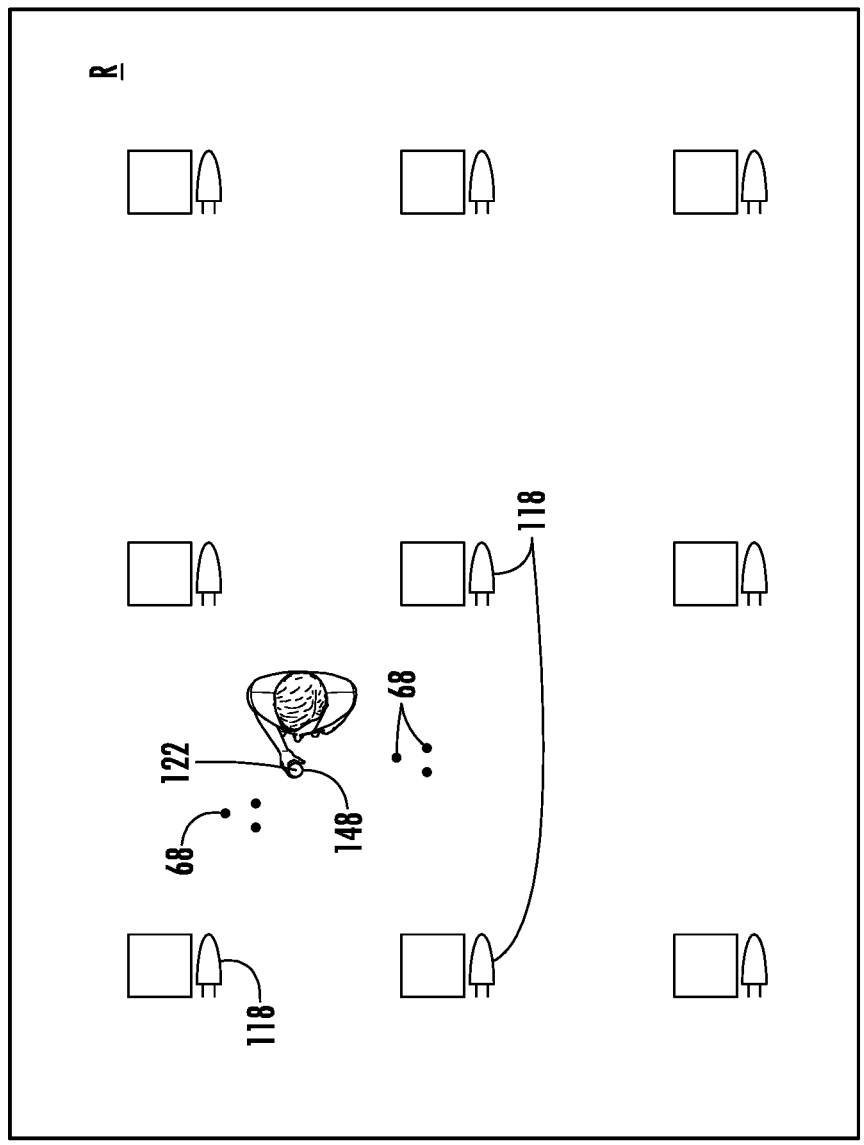
Figure 27C:
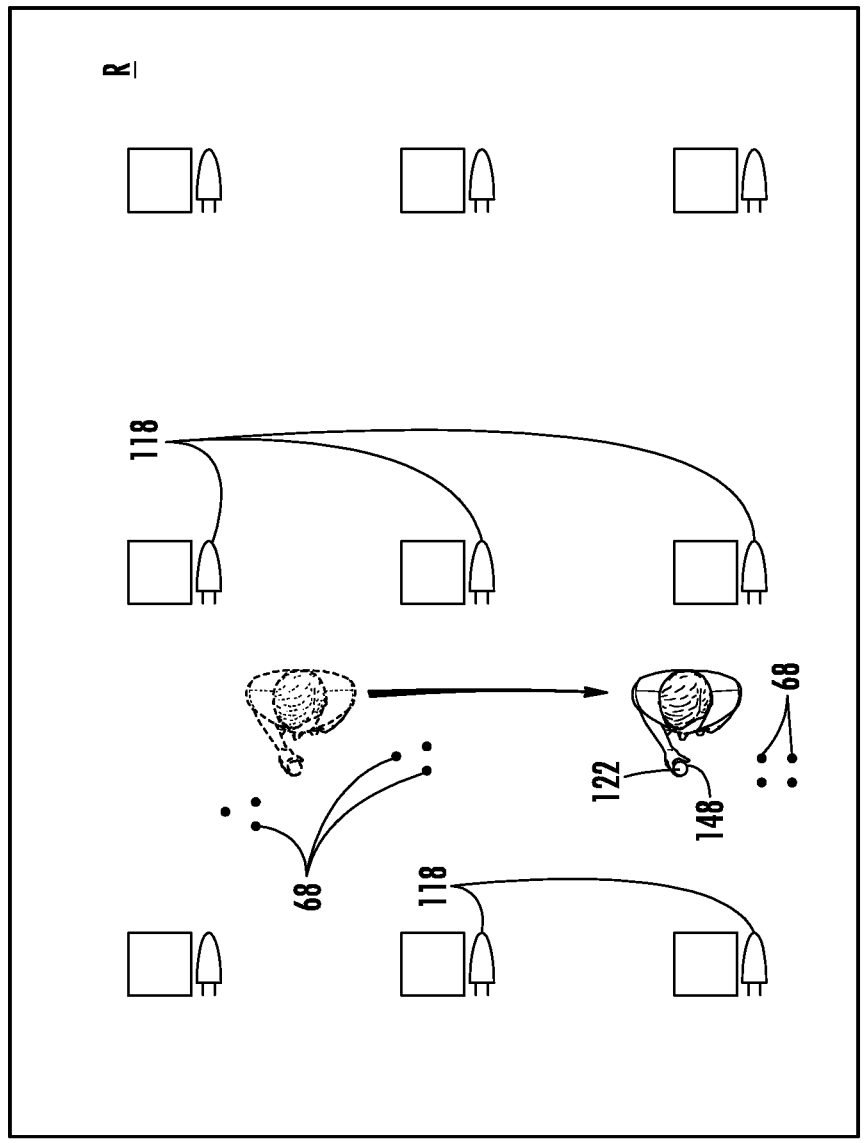

Turing to FIGS. 27A-27C, staff 122 with multi-direction camera system 148 calibrates its position 52 based on detecting calibration signals 150 from emitters 118, such as infrared emitters 118. Staff 122 with multi-direction camera system 148 then projects points 68 in room R. After worker moves within room R, staff 122 with multi-direction camera system 148 projects additional points 68 in room R. Points 68 are known by staff 122 with multi-direction camera system 148 based on construction plan 56 and/or artificial frame of reference 100.

Figure 28A:
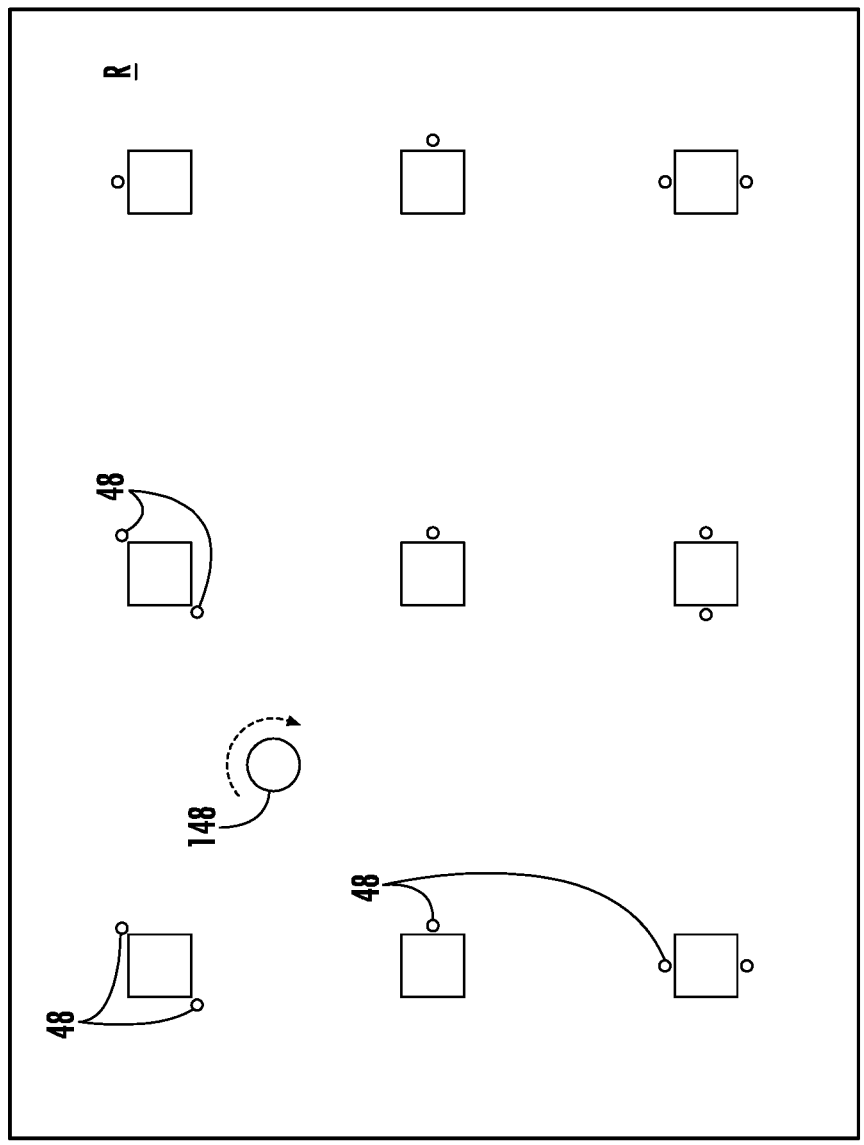
Figure 28B:
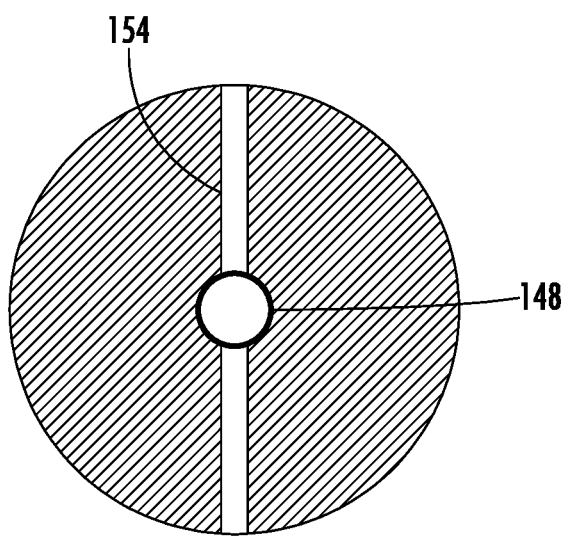
Figure 28D:
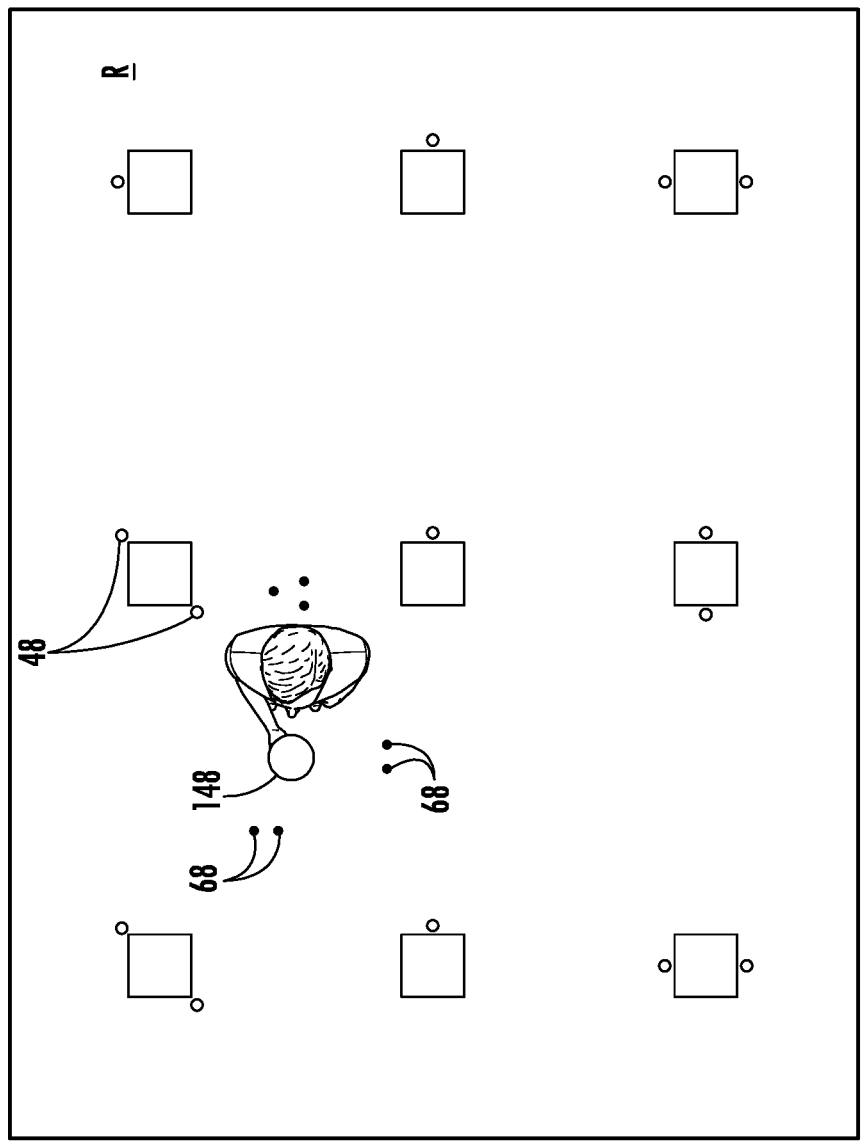
Figure 28E:
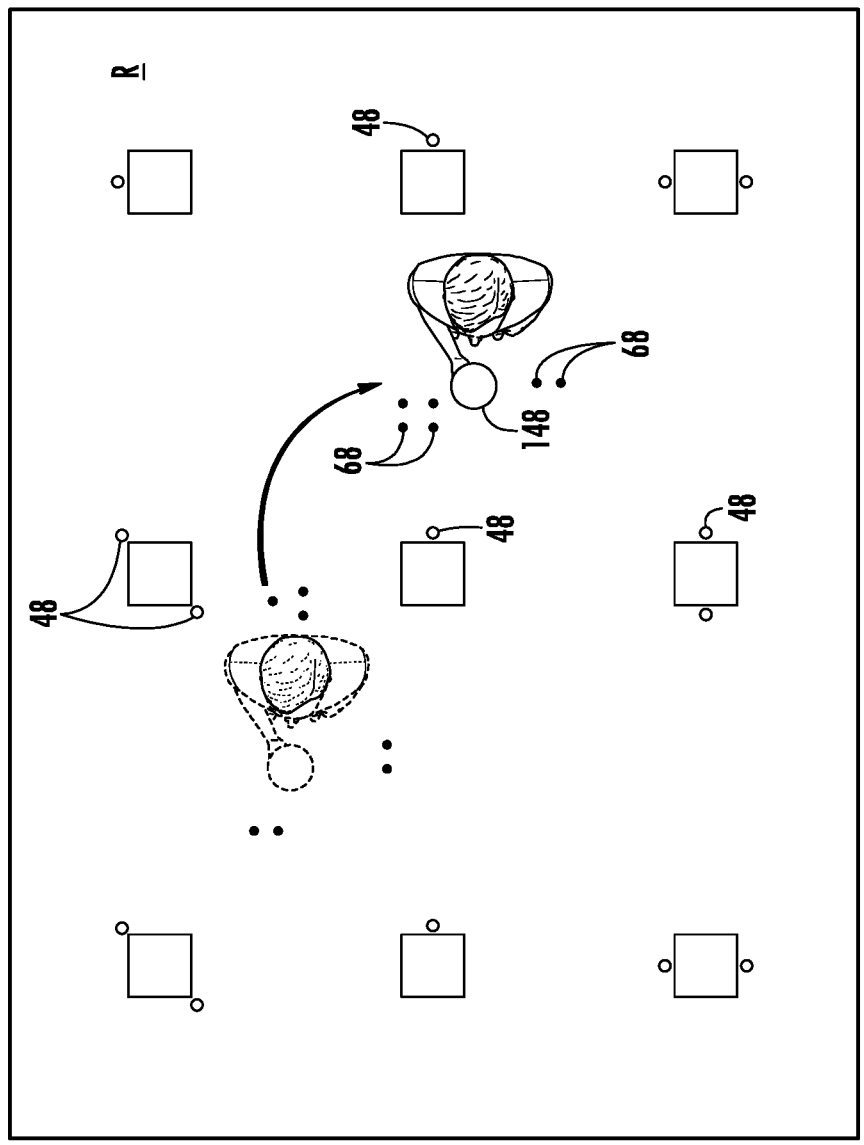

Turning to FIGS. 28A-28E, multi-direction camera system 148 projects a quickly rotating (e.g., 50 Hz, 60 Hz) light line projection 154 (best shown in FIG. 28B). As a result, multi-direction camera system 148 functions similar to lighthouse 22 in that its projection of light can be used by receivers 120 to calculate their relative position 50. In various embodiments light line projection 154 is rotated by multi-direction camera system 148 via digital rather than mechanical means, providing for a more stable rotation. Based on sensors 48 receiving light line projection 154, multi-direction camera system 148 calibrates its position 52. Multi-direction camera system 148 projects points 68 in room R. After worker moves within room R, multi-direction camera system 148 projects additional points 68 in room R. Points 68 are known by multi-direction camera system 148 based on construction plan 56 and/or artificial frame of reference 100.

Figure 29A:
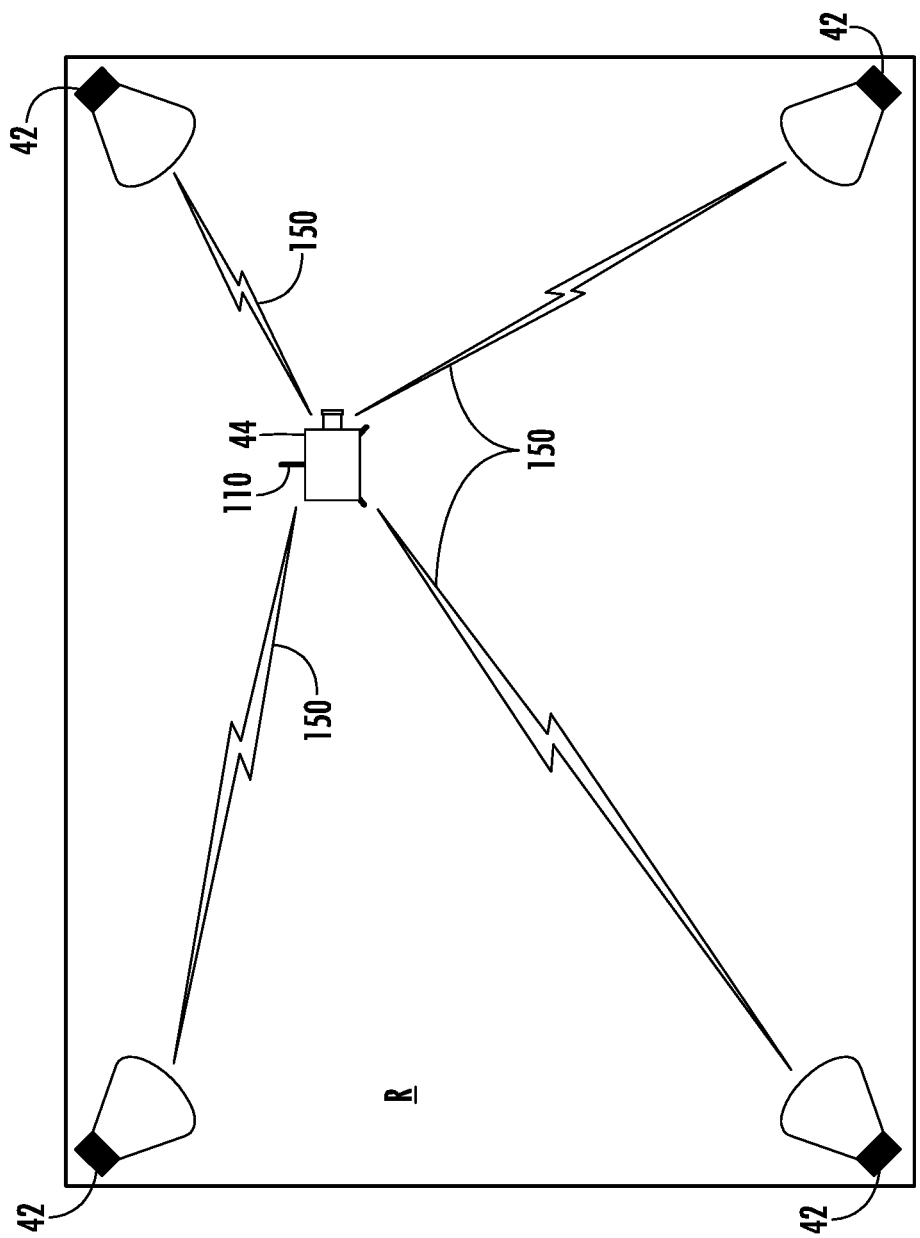
FIGS. 29A-29B are a series of top views of a room with a location-detecting projector with non-continuous refresh, according to an embodiment.
Figure 29B:
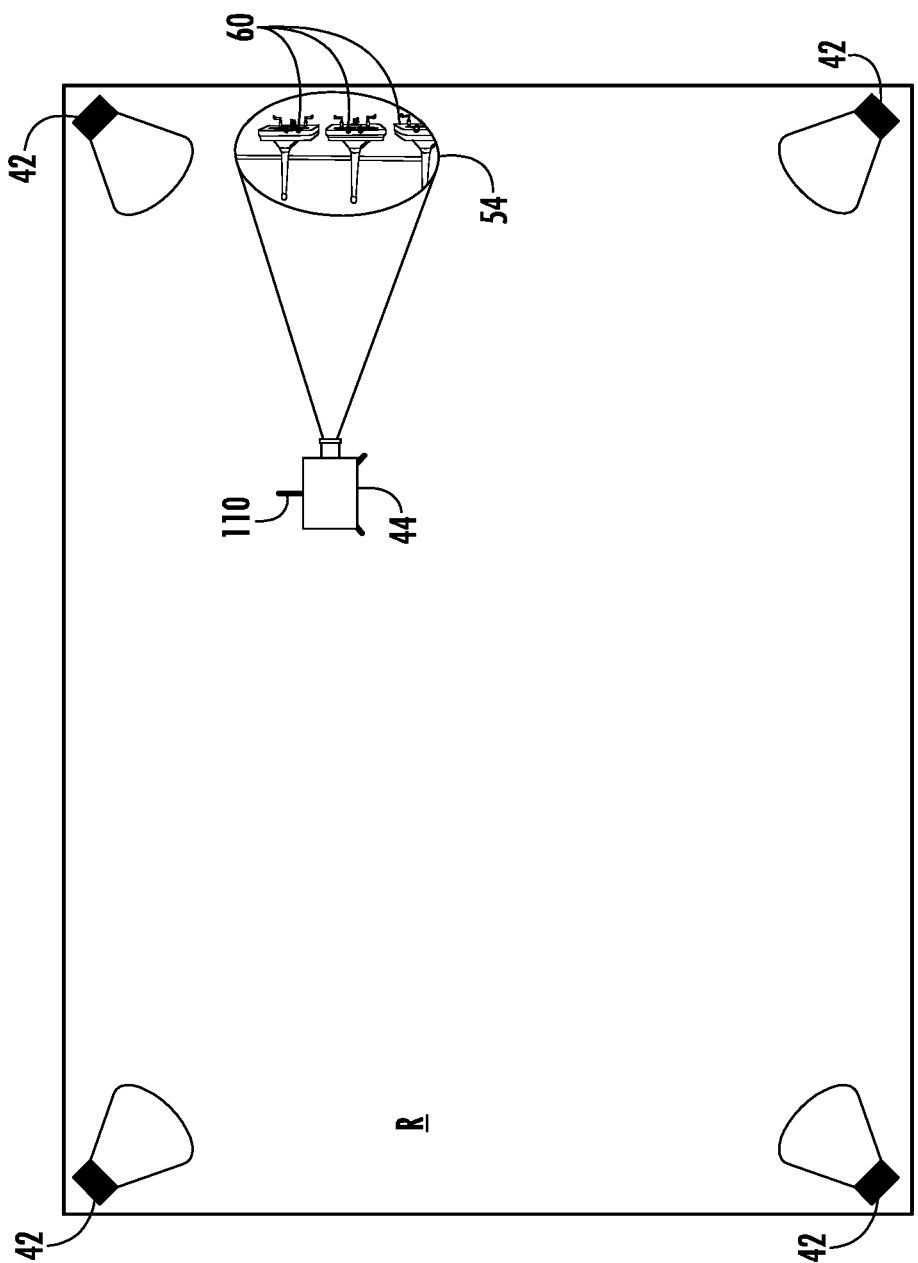

Turning to FIGS. 29A-29B, projector 44 on tripod 110 calibrates its position 52 based on receiving calibration signals 150 from lighthouses 42. Based on construction plan 56 and position 52, projector 44 displays image 54 that includes virtual objects 60. A worker refers to image 54 and marks points 68 on a surface, such as wall W or floor F (e.g., the worker may mark an X or a circle where a hole is to be drilled for sink object 60). After finishing work with image 54, the worker moves projector 44 and tripod 110 to a new location. Projector 44 recalibrates its position 52, and then projects image 54. In this embodiment, projector 44 does not continuously update its position 52, instead only calibrating position 52 when signaled to do so by a worker, such as the worker hitting a calibrate button on interface 92.

Figure 30A:
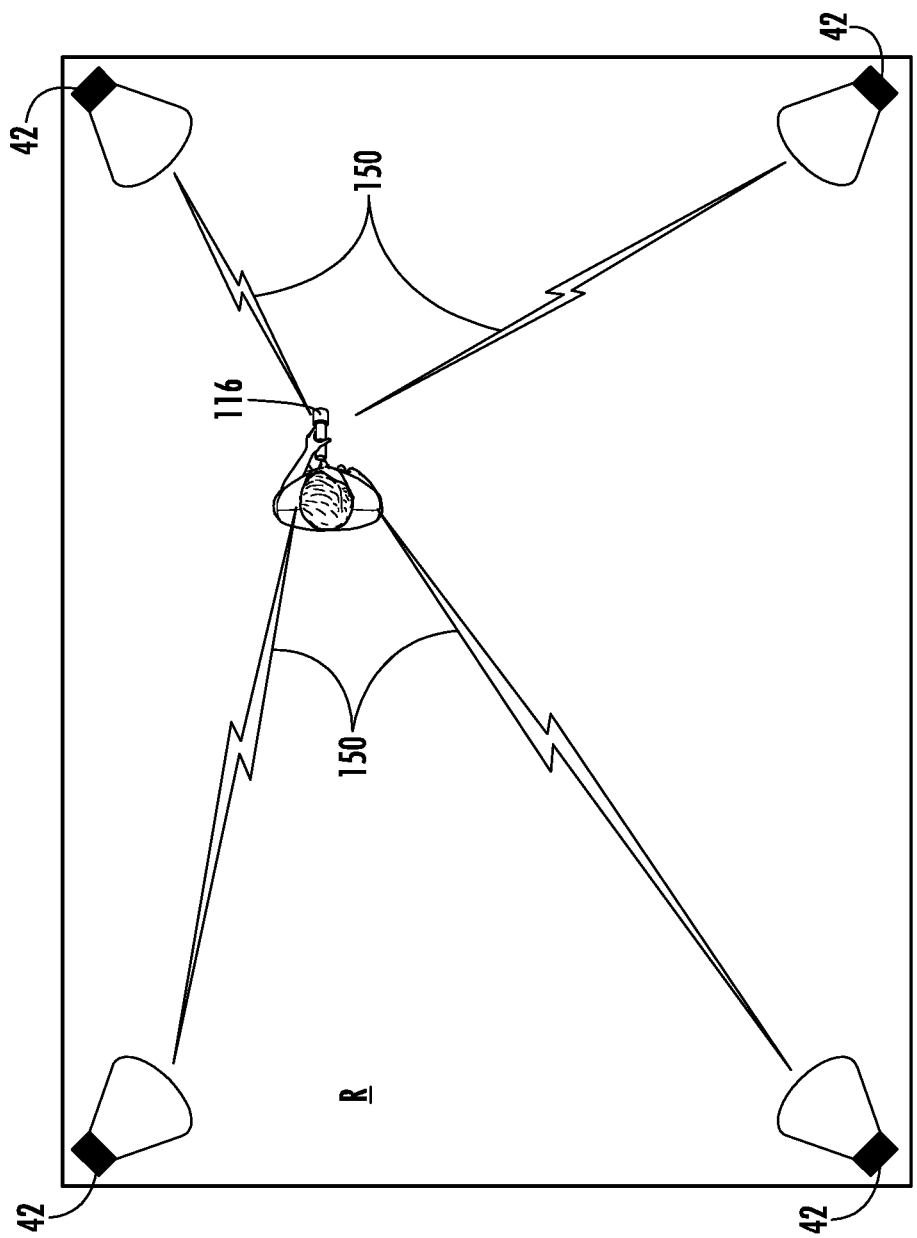
FIGS. 30A-30B are a series of top views of a room with a location-detecting flashlight projector with continuous refresh, according to an embodiment.
Figure 30B:
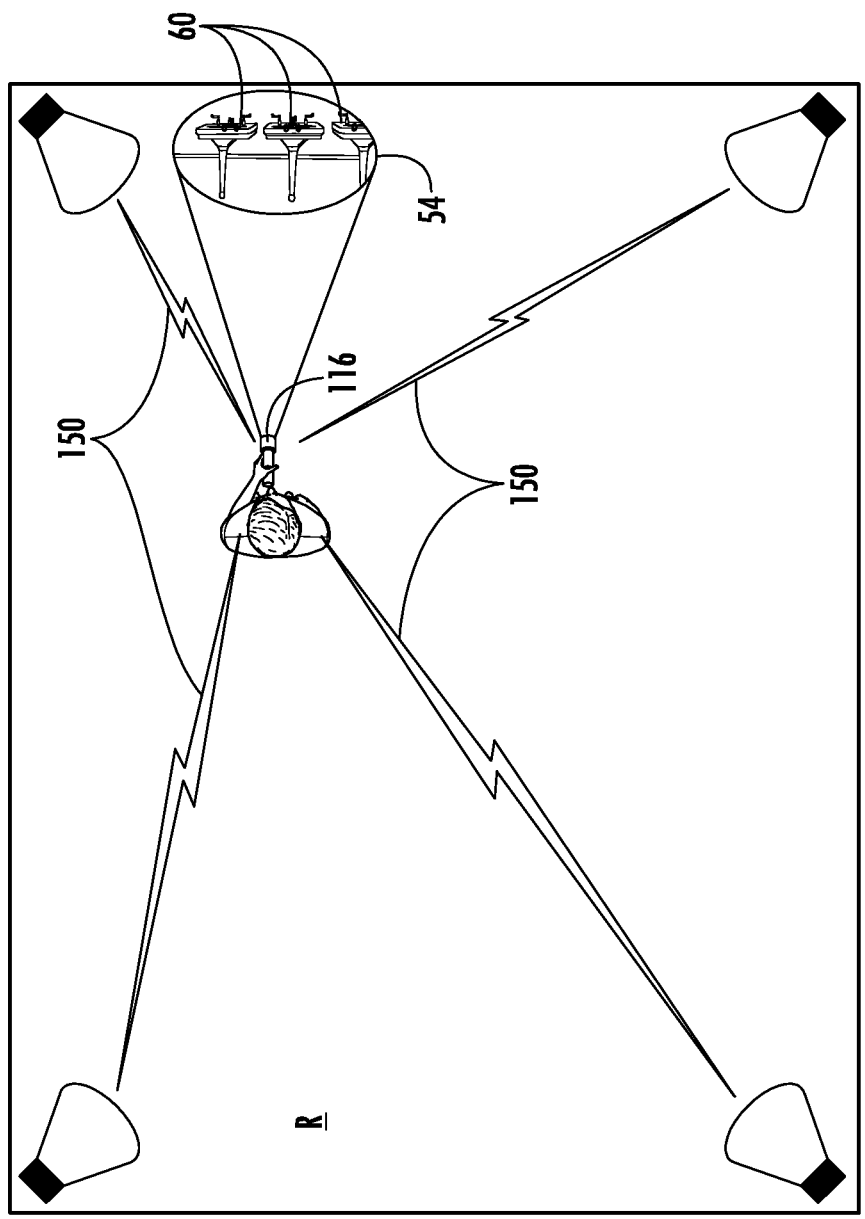

Turning to FIGS. 30A-30B, flashlight projector 116 calibrates its position 52 based on receiving calibration signals 150 from lighthouses 42. Based on construction plan 56 and position 52, flashlight projector 116 displays image 54 that includes virtual objects 60. A worker refers to image 54 and marks points 68 on a surface, such as wall W or floor F (e.g., the worker may mark an X or a circle where a hole is to be drilled for sink object 60). After finishing work with image 54, the worker moves flashlight projector 116 to a new location. As flashlight projector 116 is moved, it continuously updates its position 52 and correspondingly updates image 54 to reflect its new position 52.

Figure 31:
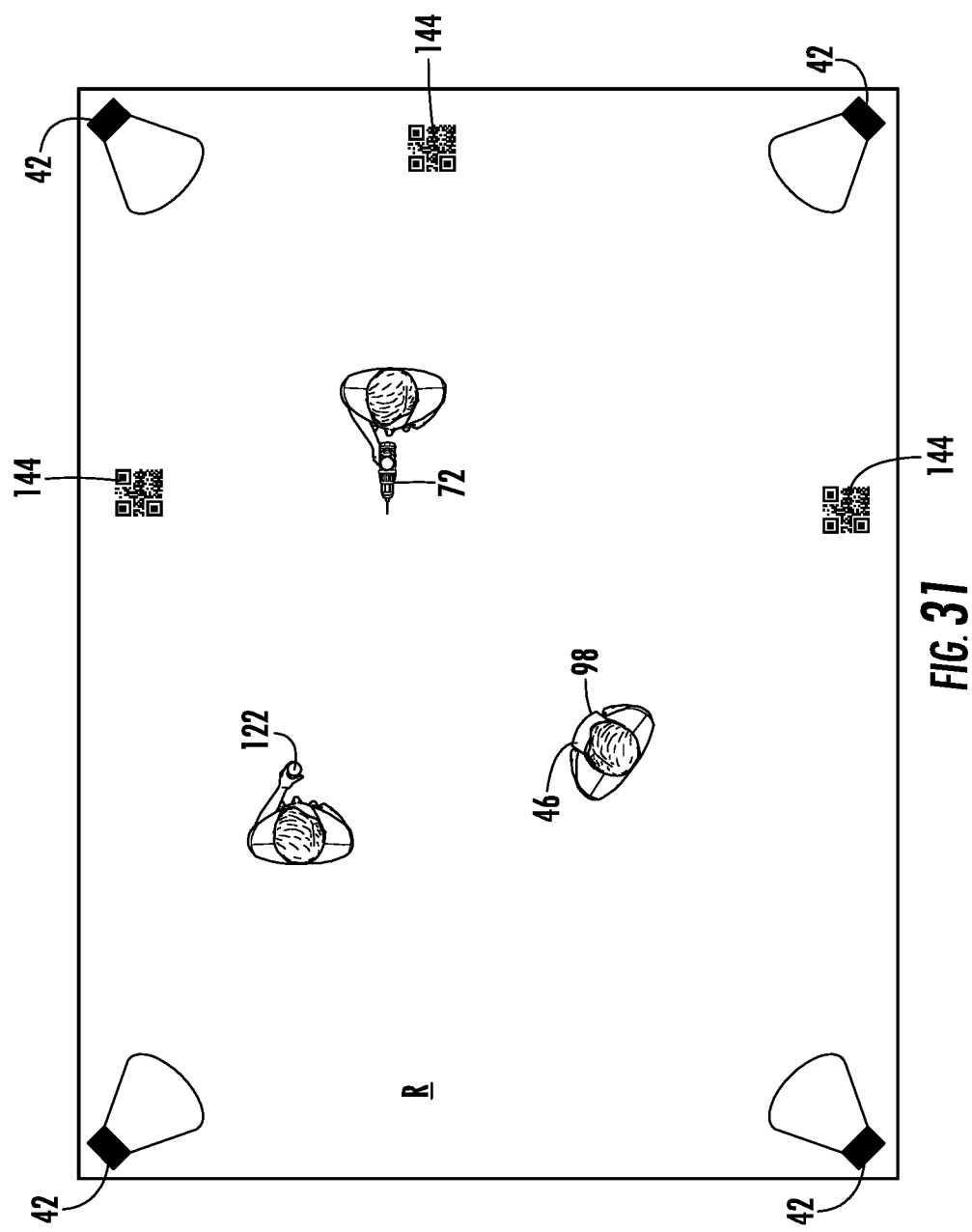
FIG. 31 is a top view of a room with multiple lighthouses, known locations, and personal sensors, according to an embodiment.
Figure 32A:
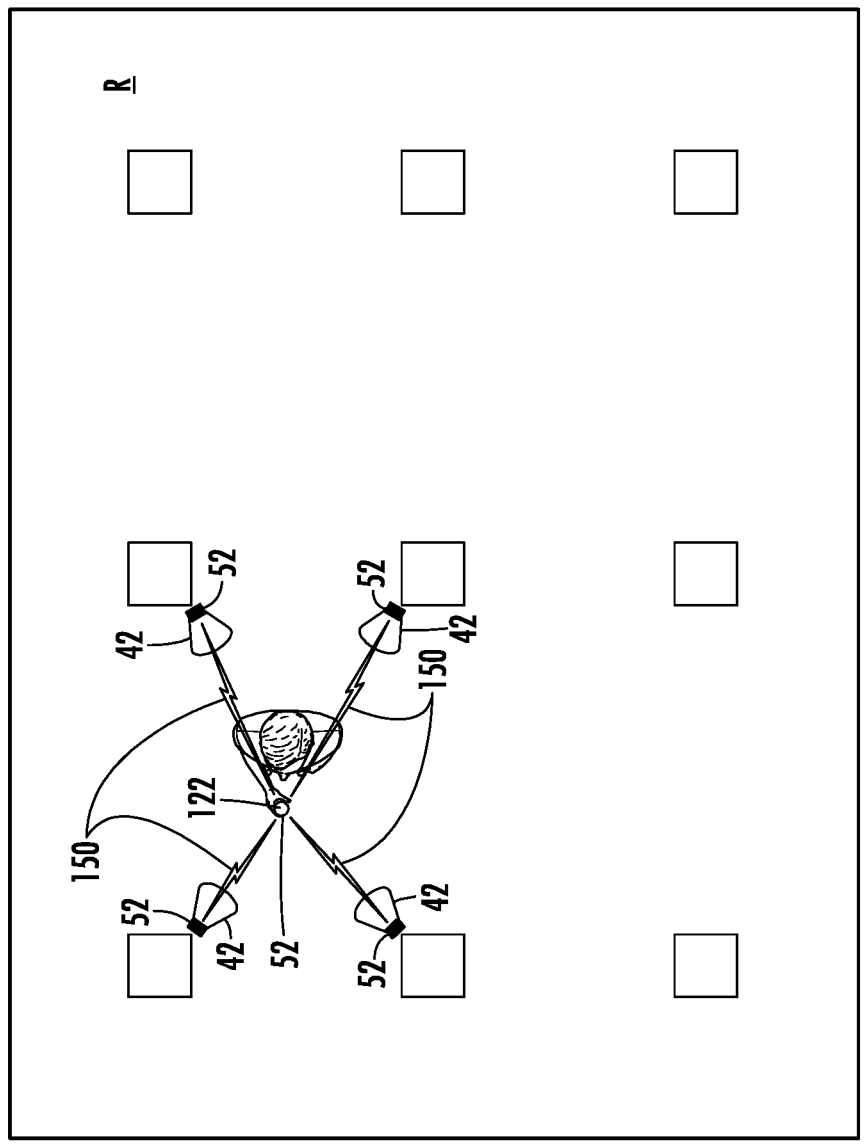
Figure 32C:
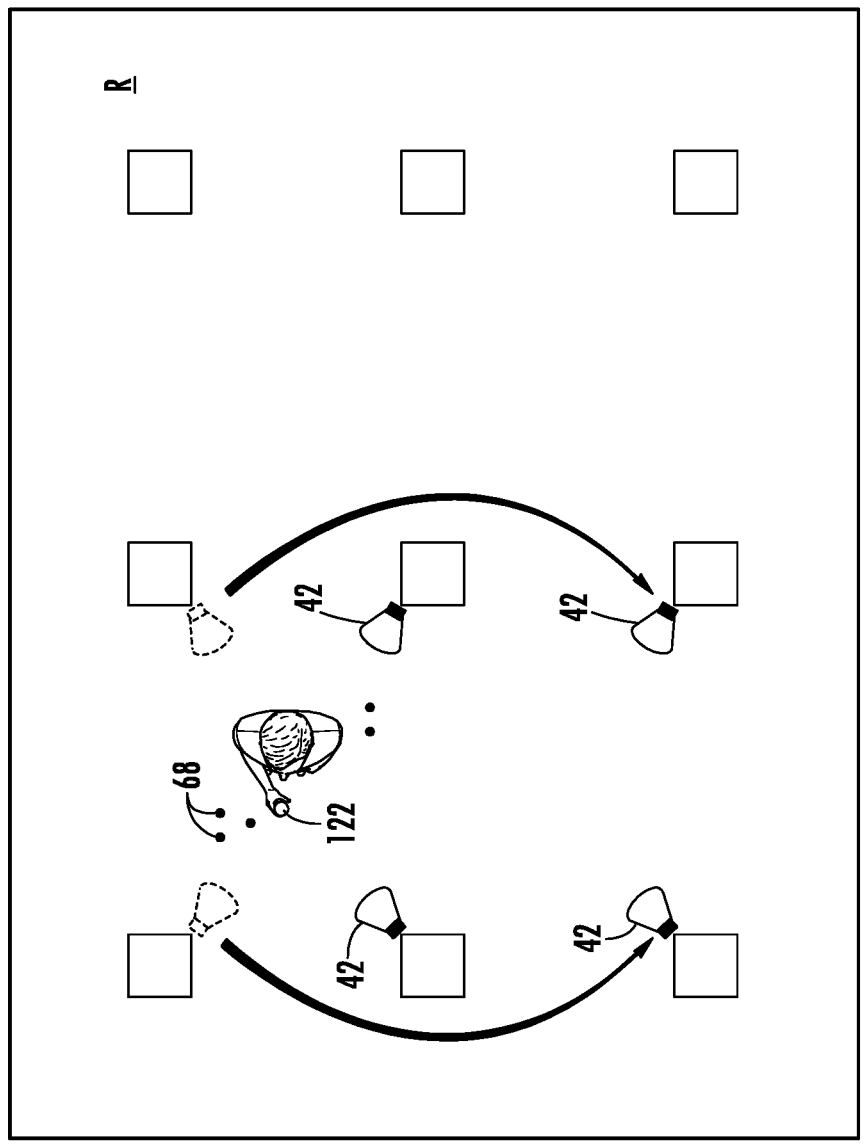
Figure 32D:
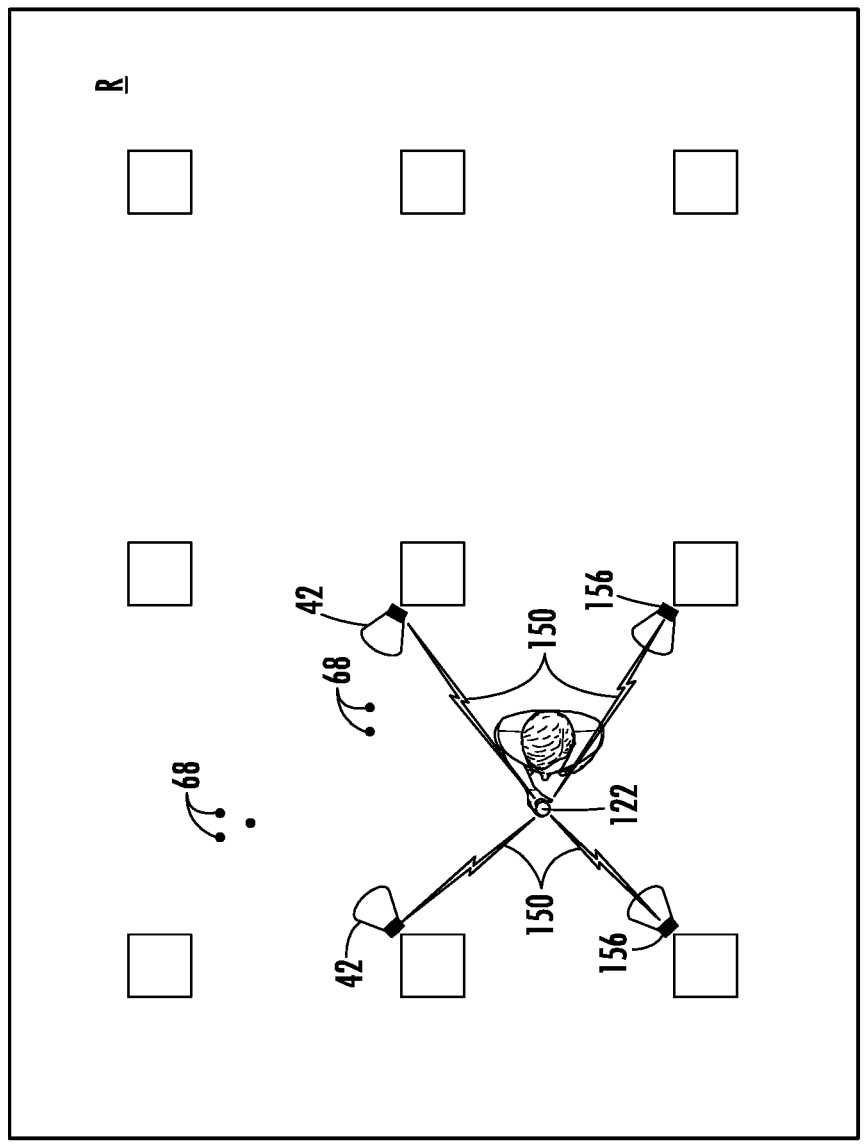
Figure 32E:
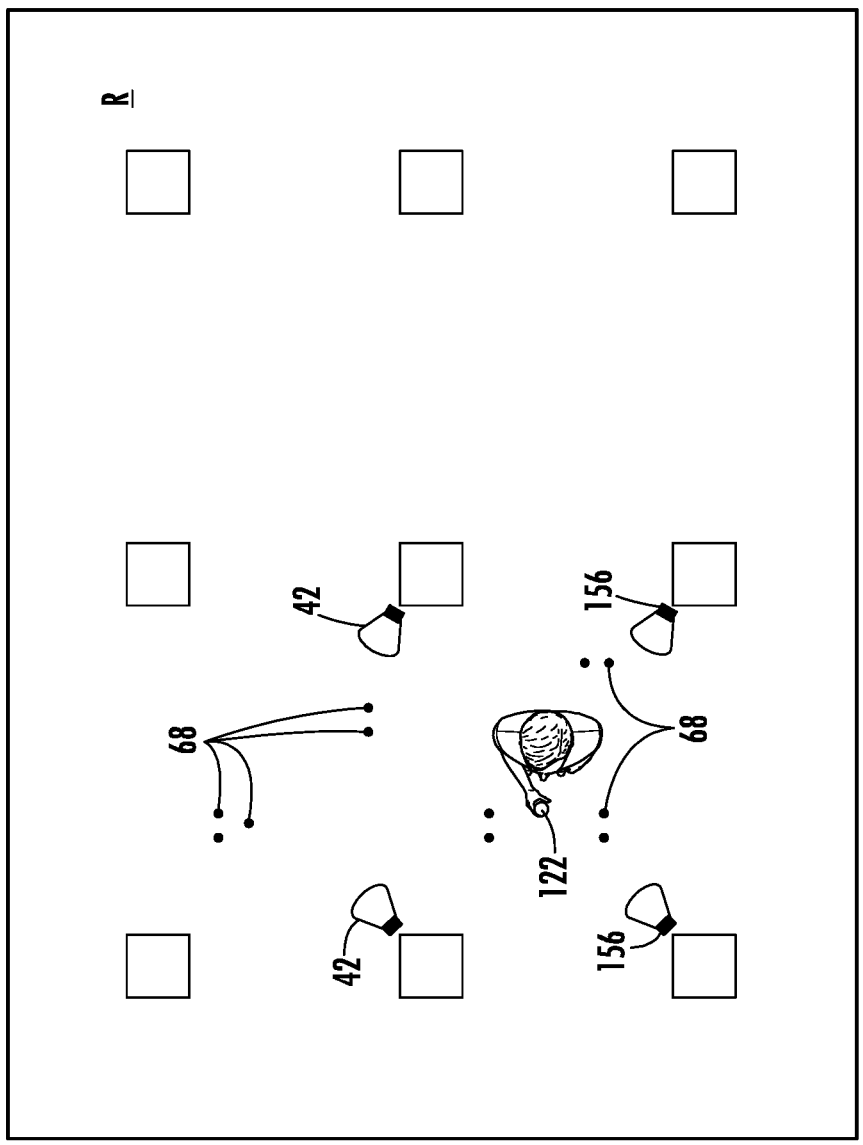
Figure 32F:
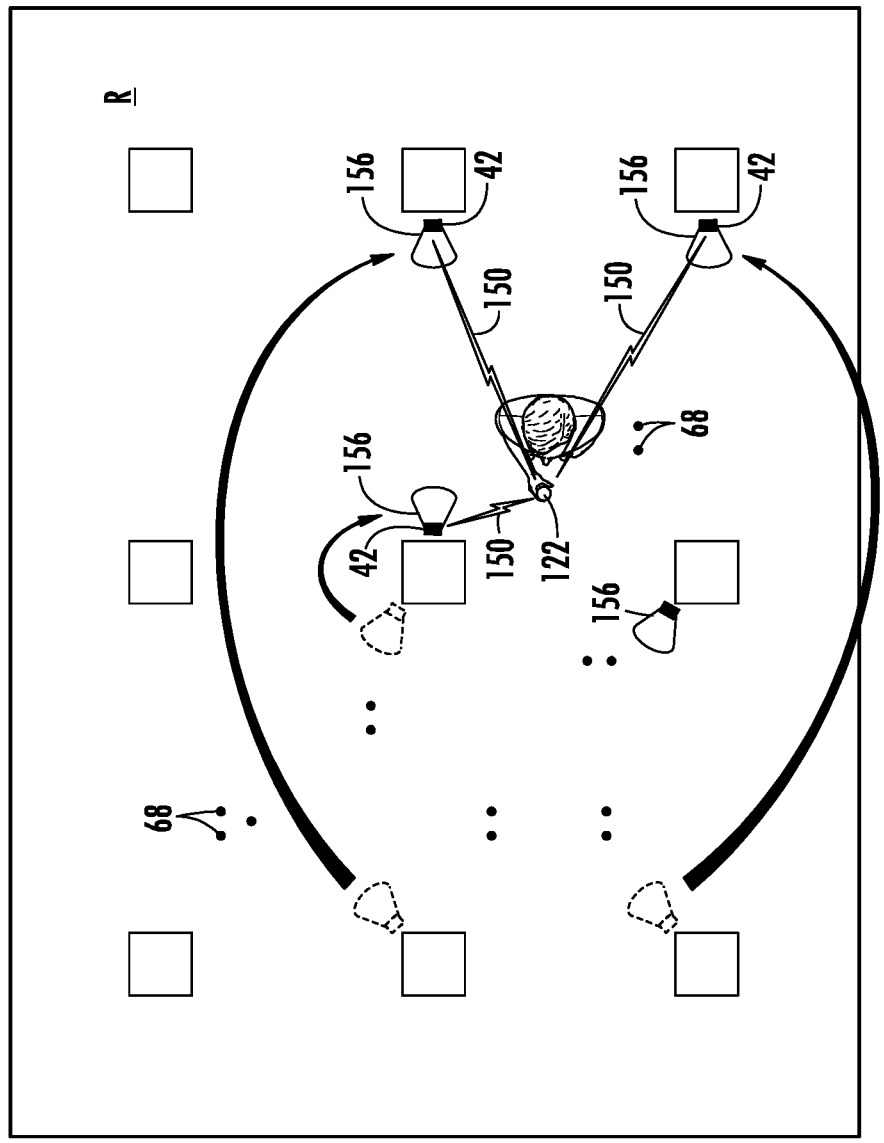

Turning to FIG. 31, room R includes several lighthouses 42 and known points 144. Spatially aware tools 72, such as AR headset 46 and staff 122, calculate their respective position 52 based on the lighthouses 42 and/or known points 144. In one embodiment, tool 72 and staff 122 calibrate their position 52 based on receiving calibration signals 150 from lighthouses 42, and AR headset 46 calibrates its position 52 based on recognizing known points 144 and their respective positions 52. Multiple spatially-aware devices 70 (e.g., tool 72, staff 122, AR headset 46) are used contemporaneously in room R.

Turning to FIGS. 32A-32F, lighthouses 42 are leapfrogged across room R. Initially, lighthouses 22 are placed at known positions 52 in construction plan 56. Staff 122 calibrates its position 52 to lighthouses 42 and indicates points 68 on floor F. Two lighthouses 42 are moved to new location 156 (FIG. 32C), and all lighthouses 42 are calibrated to staff 122. Staff 122 calculates its position 52 based on the two un-moved lighthouses 42, and based on that information calculates position 52 of lighthouses 42 at new locations 156 (FIG. 21D). Position 52 of lighthouses 42 at new locations 156 is communicated to lighthouses 42 for future calibrations. Staff 122 indicates points 68 on floor F. Then, three lighthouses 42 are moved to new location 156 (FIG. 32F), staff 122 calculates its position based on previously moved lighthouse 42, calculates position 52 of lighthouses 42 at new locations 156 and communicates their position 52 to lighthouses 42 at new locations 156.

In this series of images, four lighthouses 42 are leapfrogged through room R, with two or more lighthouses 42 relocated at each moving step. In other embodiments, room R may have any number of lighthouses 42, including only two lighthouses 42, and any subset of lighthouses 42 may be relocated in a given moving step, including moving a single lighthouse 42.

Figure 33A:
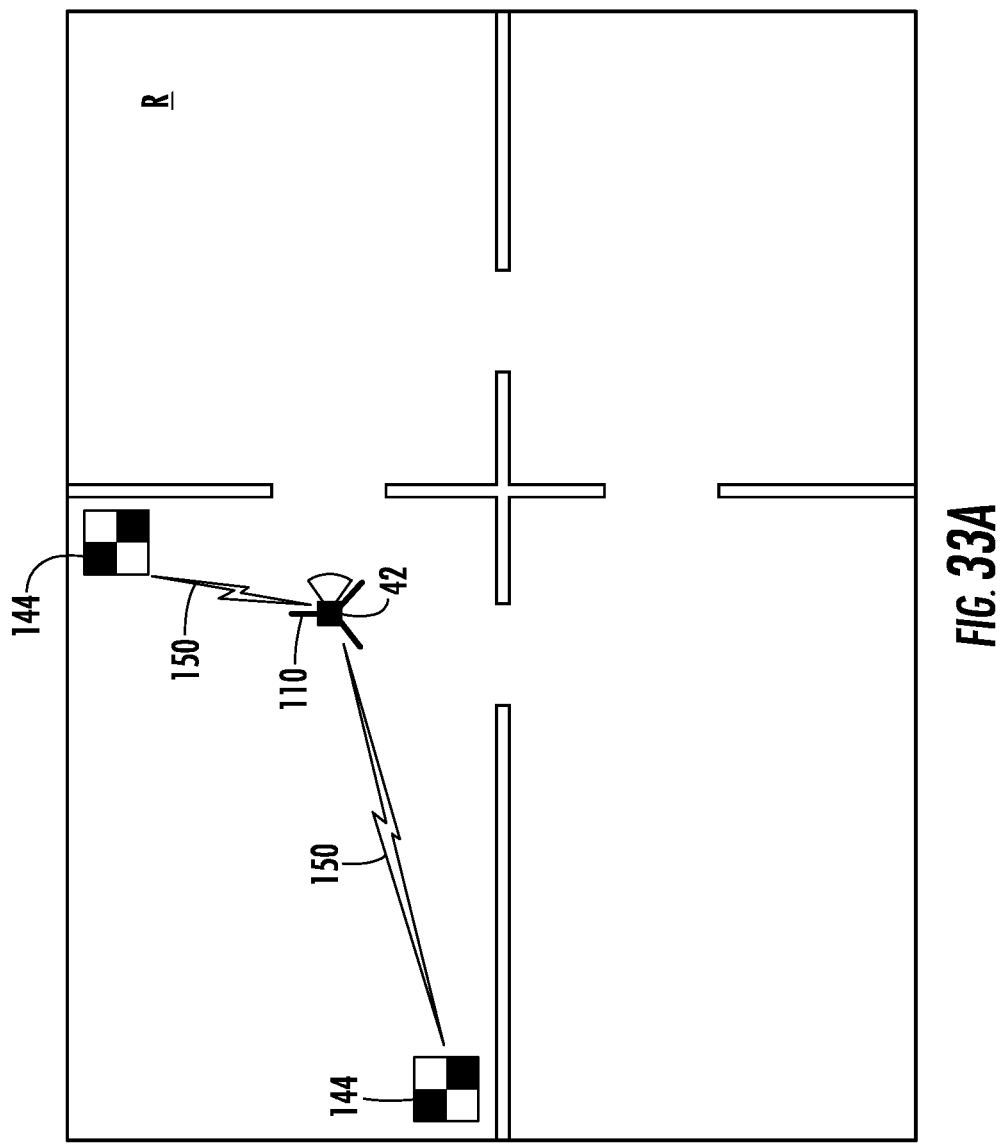
FIGS. 33A-33D are a series of top views of a room with lighthouses leapfrogging across a room, according to an embodiment.
Figure 33B:
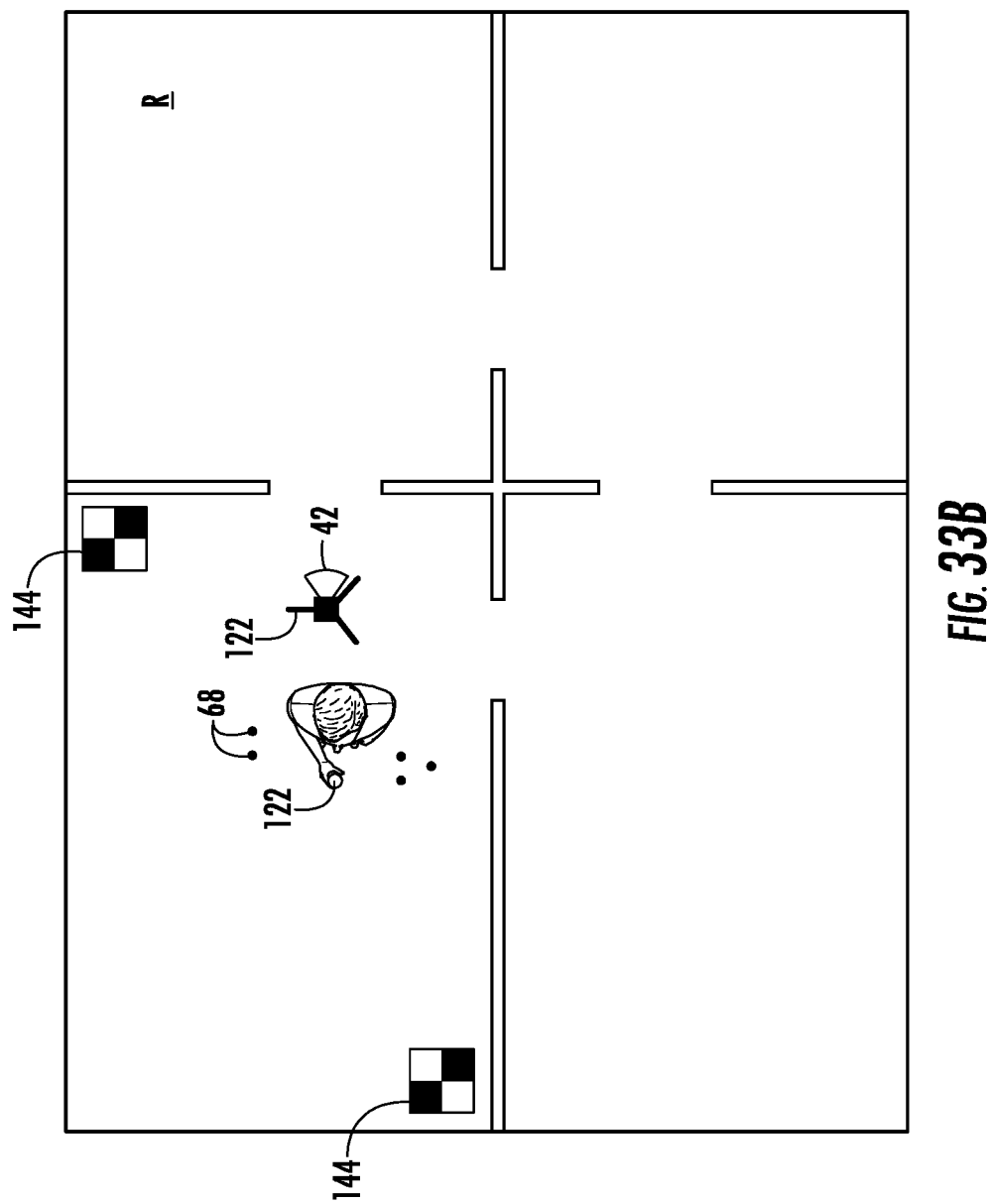
Figure 33C:
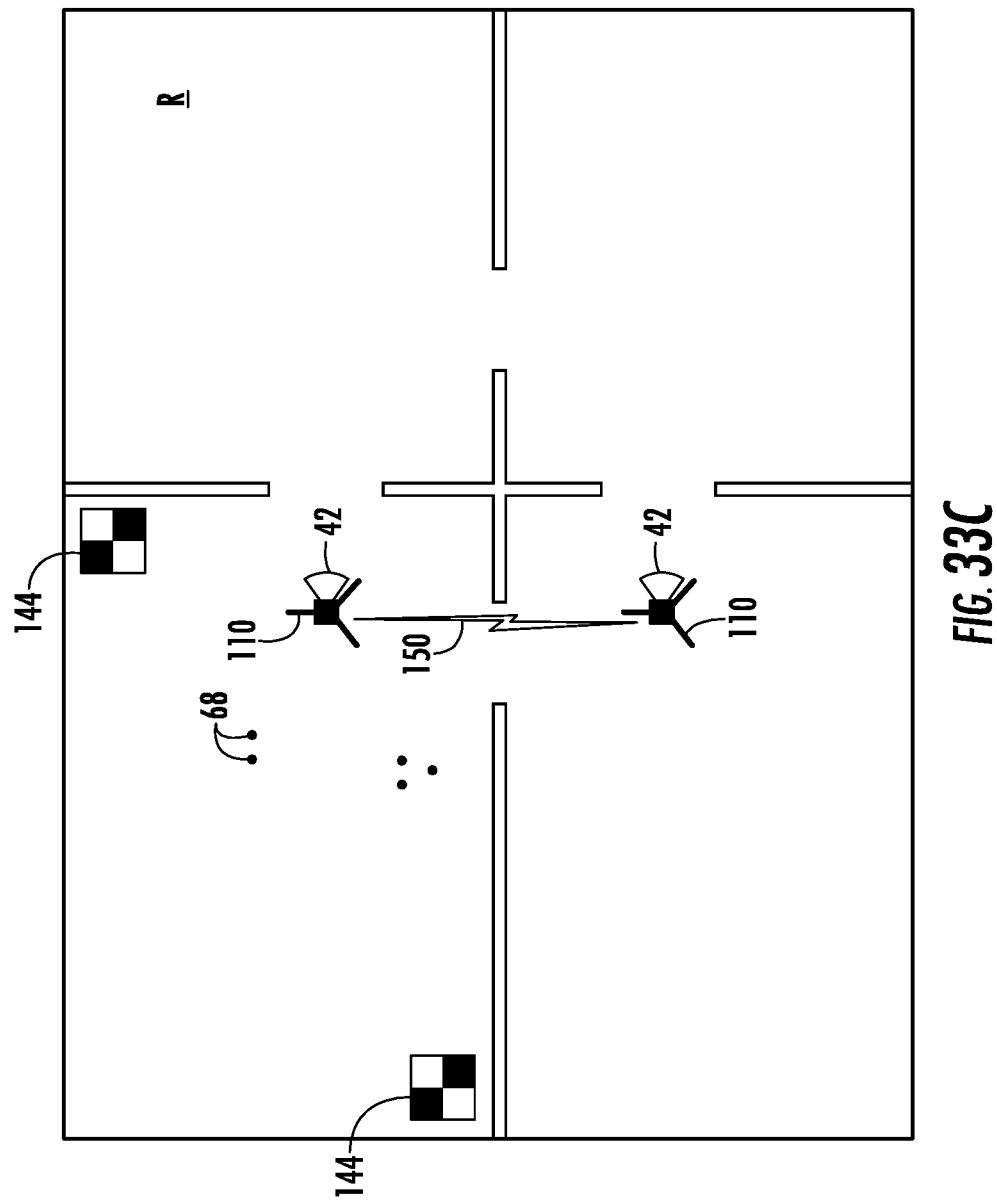

Turning to FIGS. 33A-33D, lighthouses 42 on tripods 110 are leapfrogged across room R. Initially, lighthouse 42 on tripod 110 calibrates its position 52 with respect to known points 144. Staff 122 calibrates its position 52 with respect to lighthouse 42 (FIG. 33B), and identifies points 68. Second lighthouse 42 and second tripod 110 are calibrated with respect to first lighthouse 42 on first tripod 110 (FIG. 33C). In short, second lighthouse 42 and second tripod 110 calibrates its position 52 indirectly with respect to known points 144 via first lighthouse 42 on first tripod 110.

Figure 33D:
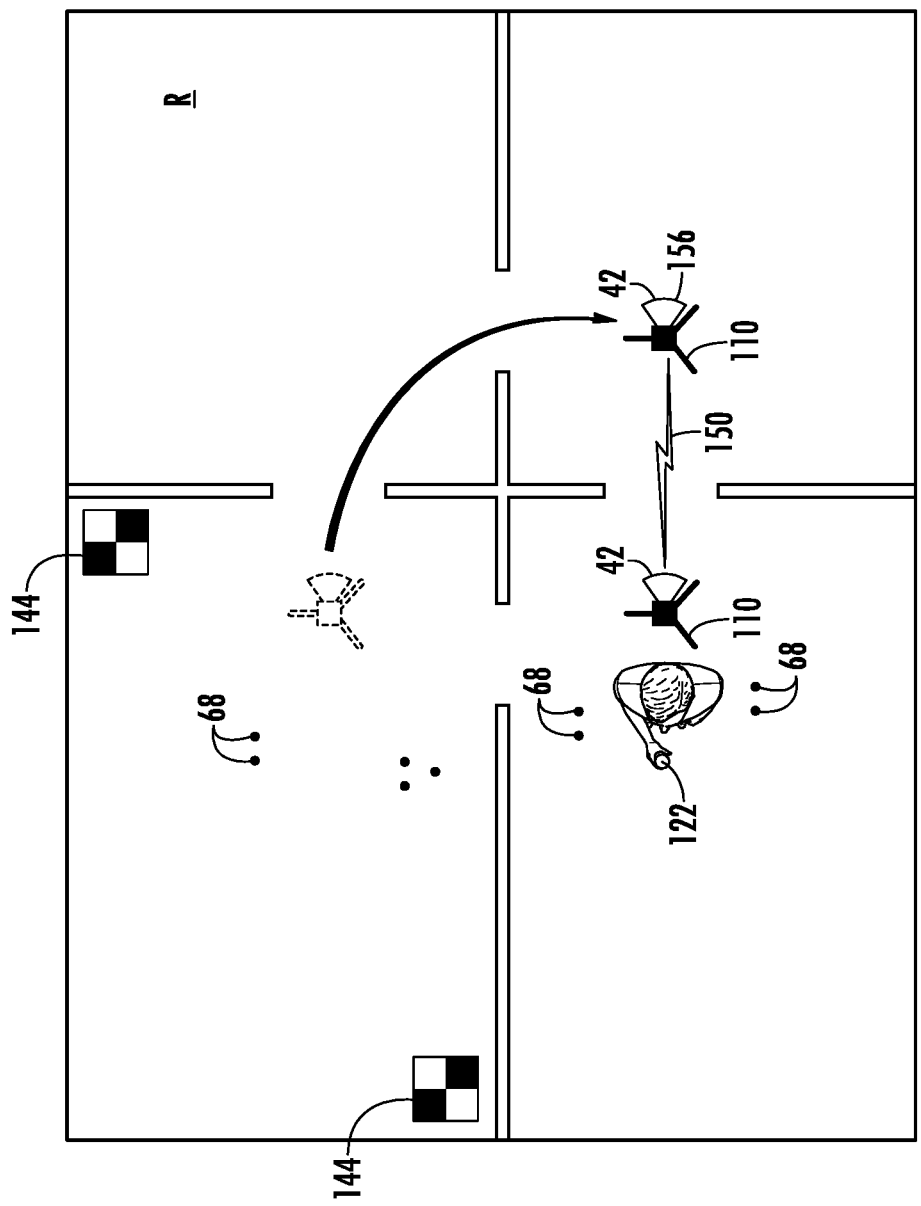

Then, first lighthouse 42 is moved to new location 156, and calibrates its new position 52 with respect to second lighthouse 42 (FIG. 33D). Lighthouses 42 may continue to leapfrog across room R, as desired. To reduce location errors being compounded through subsequent leapfrogging, lighthouses 22 may recalibrate position 52 with respect to known points 144 if/when known points 144 are available for reference.

Figure 34:
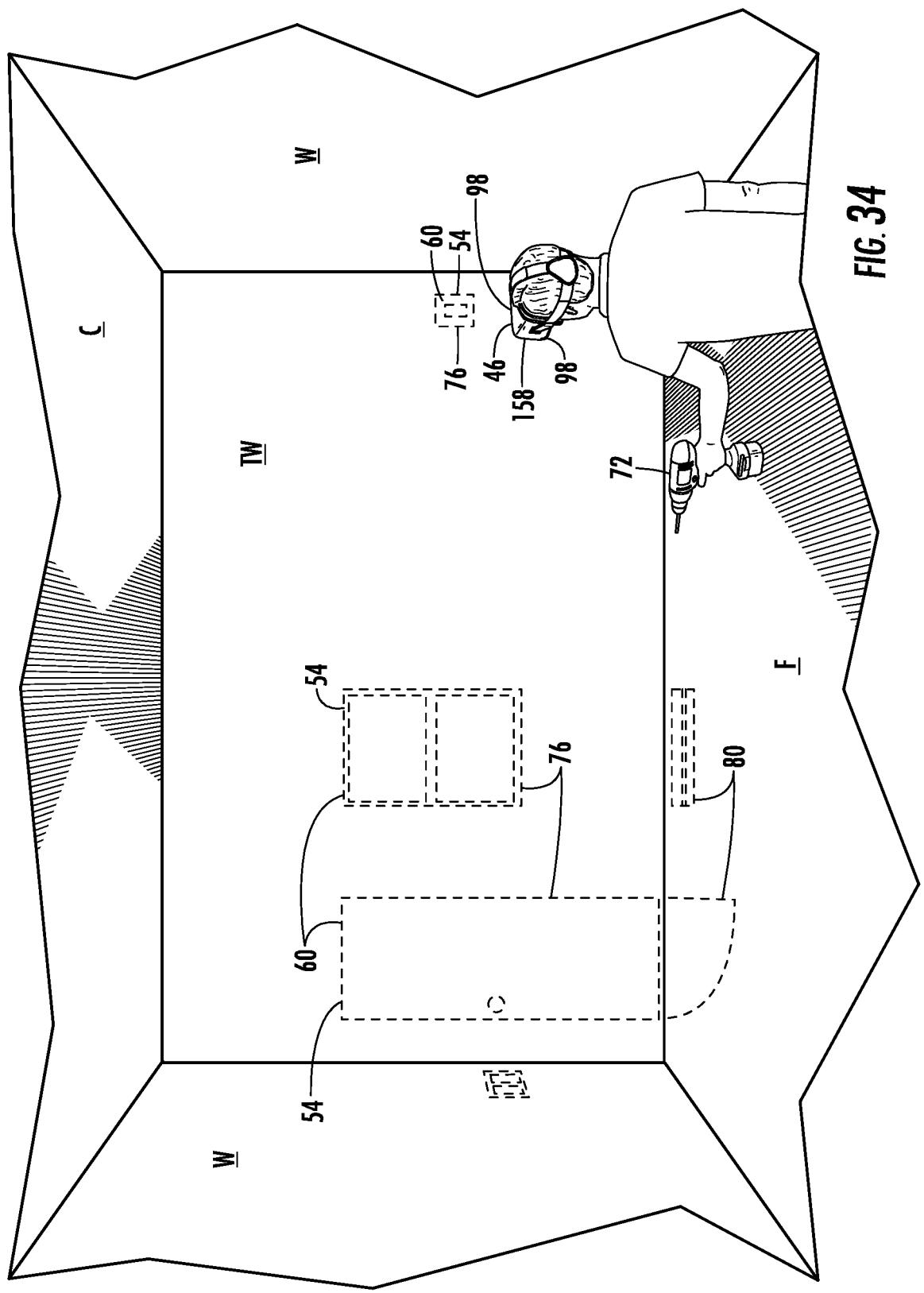
FIG. 34 is an augmented reality perspective view of a room with an AR headset including stereo cameras, according an embodiment.

Turning to FIG. 34, in one embodiment AR headset 46 includes stereo cameras 158 that are arranged apart from each other. Based on the marginal differences between the images received by each camera 98 in stereo cameras 158, position 52 is calculated. For example, corner between target wall TW, wall W, and ceiling C is at a certain location for each camera 98, and that location depends on the distance between the corner and each camera 98. The images captured by each camera 98 can therefore be analyzed to determine position 52 of AR headset 46 upon which stereo cameras 158 are situated.

Figure 35:
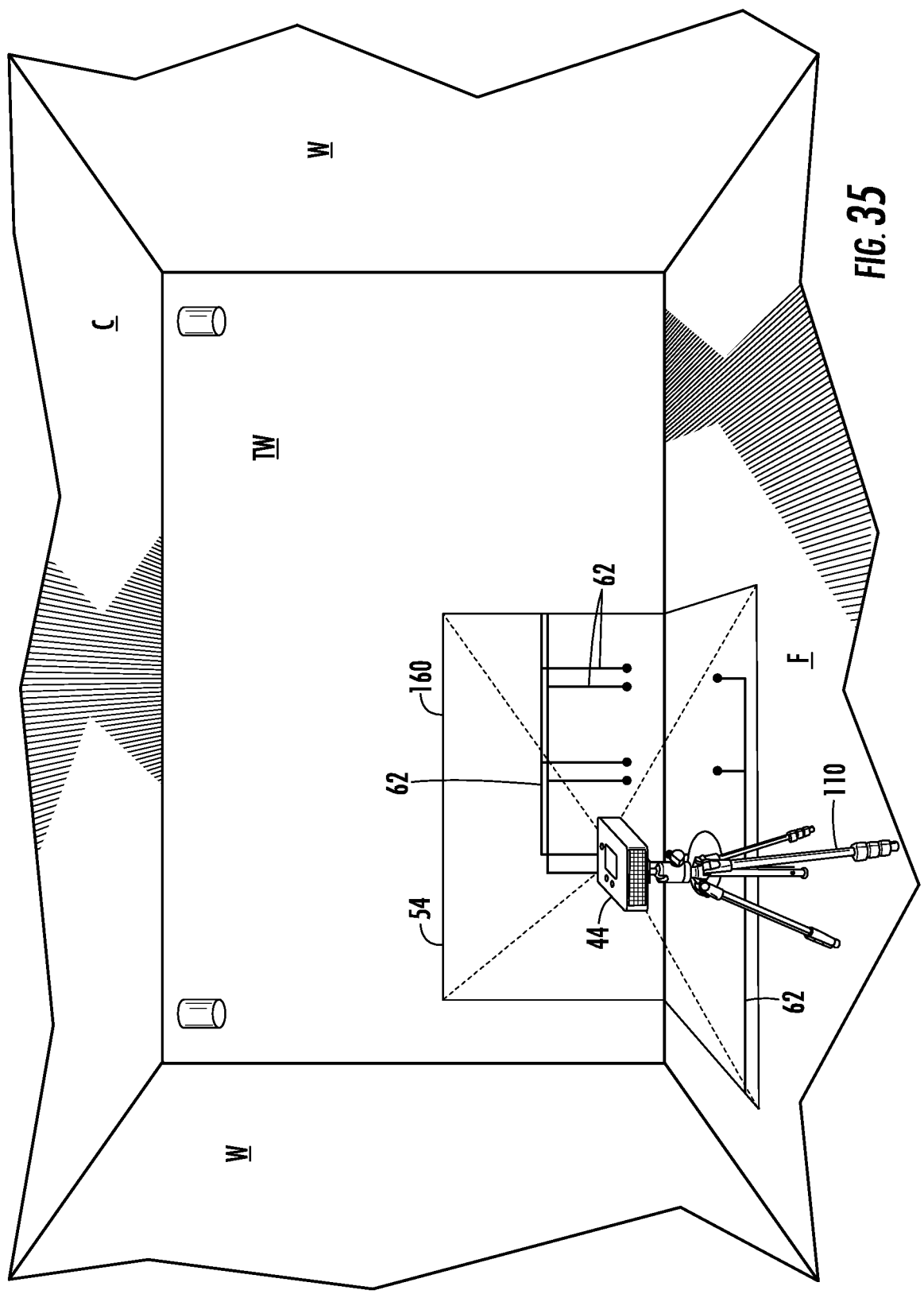
FIG. 35 is an augmented reality perspective view of objects as built in a room, according to an embodiment.

Turning to FIG. 35, physical objects 62 are not always installed in room R exactly where construction plan 56 indicates they should be installed. In one embodiment image 54 projected by projector 44 is an as-built model 160. As-built model 160 reflects where the underlying physical objects 62 were actually installed or created when room R and associated objects 62 were being built. As-built model 160 is generated while a building is being constructed, or it may be generated after the fact based on indicating to system 400 where objects 62 exist.

In various embodiments, this disclosure describes devices 70 calculating their position 52 locally based on when calibration signal 150 is received by receivers 120. In one embodiment, device 70 measures the timing of when calibration signal 150 is received and communicates that timing to a remote computer that performs the calculation. Subsequently, the results of the calculation, such as position 52, are communicated back to device 70. In one embodiment, the timing of detected calibration signal 150 is communicated to a remote computer that then calculates position 52, and then image 54 is streamed back to device 70 and/or commands are sent to device (e.g., disabling tool 72 if it is near a gas line).

It should be understood that the figures illustrate the exemplary embodiments in detail, and it should be understood that the present application is not limited to the details or methodology set forth in the description or illustrated in the figures. It should also be understood that the terminology is for description purposes only and should not be regarded as limiting.

Further modifications and alternative embodiments of various aspects of the invention will be apparent to those skilled in the art in view of this description. Accordingly, this description is to be construed as illustrative only. The construction and arrangements, shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present invention.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more component or element, and is not intended to be construed as meaning only one. As used herein, "rigidly coupled" refers to two components being coupled in a manner such that the components move together in a fixed positional relationship when acted upon by a force.

Various embodiments of the invention relate to any combination of any of the features, and any such combination of features may be claimed in this or future applications. Any of the features, elements or components of any of the exemplary embodiments discussed above may be utilized alone or in combination with any of the features, elements or components of any of the other embodiments discussed above.

What is claimed is:

1. A method of displaying information from a construction plan comprising:
    electronically tracking a location and an orientation of a headset being worn by a user;
    calculating a spatial relationship between a construction plan and the location and the orientation of the headset;
    generating augmentation data based on the spatial relationship between the construction plan and the location and the orientation of the headset; and
    displaying an augmented image in the headset, the augmented image comprising a first image that is representative of the augmentation data and a second image that is an actual view of the environment of the headset;
    wherein the representative image is selected from a group consisting of a generic image of a construction object within the construction plan and a schematic representation of the construction object.

2. The method of claim 1, wherein the first image comprises the representative image, and wherein the construction object is selected from a group consisting of a door and a window.

3. The method of claim 2, the method further comprising:
    receiving a command to toggle between displaying the generic image of the construction object and displaying the schematic representation of the construction object.

4. The method of claim 1, wherein the first image comprises a representative image of a construction object within the construction plan, and wherein the construction object is selected from a group consisting of an appliance and an electrical outlet.

5. The method of claim 1, wherein the first image comprises a representative image of a construction object within the construction plan, and wherein the construction object is selected from a group consisting of a wall, a lighting, a conduit, a datacom component, and a hole in a floor where the hole is configured to receive a pipe.

6. A method of displaying information from a construction plan comprising:
    electronically tracking a location and an orientation of a headset being worn by a user;
    calculating a spatial relationship between a construction plan and the location and the orientation of the headset;
    generating augmentation data based on the spatial relationship between the construction plan and the location and the orientation of the headset; and
    displaying an augmented image in the headset, the augmented image comprising a first image that is representative of the augmentation data and a second image that is an actual view of the environment of the headset;
    wherein the first image comprises a representative image of a construction object within the construction plan, and wherein the construction object is selected from a group consisting of a wall, a lighting, a conduit, a datacom component, and a hole in a floor where the hole is configured to receive a pipe, and
    wherein the representative image is selected from a group consisting of a generic image of the construction object and a schematic representation of the construction object.

7. The method of claim 6, the method further comprising:
    receiving a command to toggle between displaying the generic image of the construction object and displaying the schematic representation of the construction object.

8. A method of displaying information from a construction plan comprising:
    electronically tracking a location of a drill being carried by a first user;
    calculating a spatial relationship between a construction plan and the location of the drill;
    generating augmentation data based on the spatial relationship between the construction plan and the location of the drill;
    displaying an augmented image to a second user located remotely relative to the first user, the augmented image comprising a first image representative of objects near the first user based on the augmentation data, and a second image representative of the first user; and
    transmitting a signal to disable rotating a drill bit of the drill based on the spatial relationship between the construction plan and the location of the drill bit.

9. The method of claim 8, wherein the augmented image comprises a representative image of a construction object within the construction plan, and wherein the construction object is selected from a group consisting of a door, a window, an appliance, and an electrical outlet.

10. The method of claim 8, wherein the augmented image comprises a representative image of a construction object within the construction plan, and wherein the construction object is selected from a group consisting of a wall, a lighting, a conduit, a datacom component, and a hole in a floor where the hole is configured to receive a pipe.

* * * * *